United States Patent [19]
Shimizu et al.

[11] Patent Number: 5,928,374
[45] Date of Patent: Jul. 27, 1999

[54] SCANNING DEVICE AND METHOD FOR HIERARCHICALLY FORMING A SCAN PATH FOR A NETWORK

[75] Inventors: Toshiyuki Shimizu; Toshihiro Asai, both of Kawasaki, Japan

[73] Assignee: Fujitsu Limited, Kawasaki, Japan

[21] Appl. No.: 08/837,914

[22] Filed: Apr. 11, 1997

[30] Foreign Application Priority Data

Oct. 30, 1996 [JP] Japan .................................. 8-288540

[51] Int. Cl.⁶ .................................................. G06F 11/00
[52] U.S. Cl. ............................................................ 714/724
[58] Field of Search ........................... 371/22.31, 22.32, 371/22.33, 22.34; 395/183.06; 365/189.02, 189.12, 201

[56] References Cited

U.S. PATENT DOCUMENTS 5,581,541  12/1996  Whetsel ..................................... 371/22
5,751,736   5/1998  Deroux-Dauphin et al. ............. 371/22

FOREIGN PATENT DOCUMENTS 5-264656  10/1993  Japan .

*Primary Examiner*—Vincent P. Canney
*Attorney, Agent, or Firm*—Staas & Halsey

[57] ABSTRACT

In a large system such as a parallel computer system, a scan device forms a scan path by hierarchically connecting input and output signal lines of integrated circuits, thereby enabling creating of a short scan path which contain only the necessary integrated circuits. This allows a scan test such as JTAG-SCAN to be effectively made.

23 Claims, 69 Drawing Sheets

| OUTPUT SIGNAL | ISFT=1 | ISFT=0 | REMARKS |
|---|---|---|---|
| TCK | ITCK | ITCK | |
| TRST | ITRST | ITRST | |
| TMS | 1 | ITMS | |
| TDO(i) | 1 | UTDI(i)/ITDI | UTDI/ITDI DEPENDS ON A SER VALUE |
| ITDO | SER | UTDI(i) | |
| TAP STATE OF SCANB | CHANGES | NOT CHANGE | |

F I G. 4

| | | |
|---|---|---|
| Reset | 0 5V TTL | RESET INPUT |
| Stop | 0 5V TTL | CLOCK STOPS |
| Sel0 | 0 5V TTL | SELECT CLOCK 0 |
| Sel1 | 0 5V TTL | SELECT CLOCK 1 |
| Sel2 | 0 5V TTL | SELECT CLOCK 2 |
| Single0 | 0 5V TTL | SINGLE STEP CLOCK 0 (ONE CLOCK AT THE TIME OF RISING) OCCURRS. |

F I G. 1 1

| | | | |
|---|---|---|---|
| 120MHz | 0 | | |
| 60MHz | 0 | 3.3V | |
| Reset | 0 | 3.3V | RESET INPUT |
| USFT | 0 | 3.3V | SER SHIFT FLAG SIGNAL |
| UTMS | 0 | 5V TTL | TMS SIGNAL FROM SCAN ENGINE |
| UTCK | 0 | 5V TTL | TCK SIGNAL FROM SCAN ENGINE |
| UTDI | I | 5V TTL | TDI SIGNAL TO SCAN ENGINE |
| UTDO | 0 | 5V TTL | TDO SIGNAL FROM SCAN ENGINE |
| UTRST | 0 | 5V TTL | TRST SIGNAL FROM SCAN ENGINE |

F I G. 1 2

| Address | Name | R/W | Descriptions |
|---|---|---|---|
| 0x0000 | CLKR [31:0] | R/W | CLOCK CONTROL |
| 0x0004 | CMDR [31:0] | R/W | COMMAND REGISTER |
| 0x0008 | CER [31:0] | R/W | CABINET CHAIN |
| 0x000c | SDR [31:0] | R/W | SCAN DATA |
| 0x0010 | IRR [31:0] | R/W | IR COMMAND |
| 0x0014 | TGETR [31:0] | R/W | TARGET DESIGNATION |
| 0x0018 | LOOPR [31:0] | R/W | LOOP REGISTER |
| 0x001c | MISCR [31:0] | RO | INTERNAL STATE REGISTER |
| 0x0020 | DISPR [31:0] | R/W | DISPLAY CONTROL REGISTER |

FIG. 16

CLKR:0000 (word access)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| Don't care |||||||||||||||||

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| CDIV |||| res ||| SSEN | ARES | SRES | STOP | SGL | CSEL |||

CDIV    NUMBER OF DIVIDINGS OF TAP CLOCK (TCK) FREQUENCY
        0:2 DIVIDING, 1:4 DIVIDING, 2:8 DIVIDING, 3:16 DIVIDING, 4:32 DIVIDING
        5:64 DIVIDING, 6:128 DIVIDING, 7:256 DIVIDING, 8:512 DIVIDING, 9:1024 DIVIDING,
        10:2048 DIVIDING, 11:5096 DIVIDING
SSEN    VALID/INVALID CONTROL FOR CLOCK STOP DEPENDING ON STATUS, 0 AT PON(POWER-ON), INVALID AT 0
ARES    ASYNCHRONOUS RESET : 0 AT POWER-ON, RESET RELEASED BY 1
SRES    SYNCHRONOUS RESET : 0 AT POWER-ON, RESET RELEASED BY 1
STOP    CLOCK STOP : 0 AT POWER-ON, CLOCK STOPS BY 1
SGL     CLOCK GENERATED AT SINGLE CYCLE OF 0→1
CSEL    SELECTION OF SYSTEM CLOCK:
        7   40MHz   3   64MHz
        6   58MHz   2   66MHz
        5   56MHz   1   50MHz
        4   65MHz   0   60MHz

F I G. 1 7

CMDR : 0004 (word access)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| Cmp | Err | Paus | Bsy | \multicolumn{8}{c|}{Don't care} | \multicolumn{3}{c|}{Version} |

| 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|----|----|
| TMS | TRST | TCK | TDD | TDI | \multicolumn{5}{c|}{Don't care} | INTE | SFT | \multicolumn{3}{c|}{CMD} |

Cmp   1 : COMPLETION DISPLAY, START & RESET BY WRITING 1
Err   1 : ERROR, RELEASED BY WRITING 1
Paus   1 : PAUSE STATE: RELEASED BY WRITING SDR
Bsy   1 : OPERATION STATE
Version   : SCAN ENGINE VERSION
TMS   : WRITTEN IN MANUAL MODE, OUTPUT MONITORED
TRST   : WRITTEN IN MANUAL MODE, OUTPUT MONITORED
TCK   : WRITTEN IN MANUAL MODE, OUTPUT MONITORED
TDO   : WRITTEN IN MANUAL MODE, OUTPUT MONITORED
TDI   : READ IN MANUAL MODE
INTE   1 : INTERRUPT ENABLE (INTERRUPT WHEN ERROR OCCURRS)
     0 : NO INTERRUPT AT ERROR-OCCURRING, 0 AT RESET
SFT   : SCAN-IN TO SCAN MASK OF SCANB
CMD   : SCAN ENGINE CONTROL COMMAND, 0 AT RESET

F I G. 1 8

| Name | Code | info |
|---|---|---|
| NOP | 0000 | NO OPERATION |
| SETIR | 0001 | SET IR. SET VALUES OF IRT, IRO. |
| SETDR | 0101 | SET DR. SET CONTENTS OF SDR. |
| BRDDR | 1101 | SET DR. SET CONTENTS OF SDR TO ALL SR. |
| SNSDR | 0111 | SENSE DR. STORE RESULTS IN SDR. |
| MANU | 1000 | MANUAL MODE. |

F I G. 1 9

CER : 0008 (word access)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| | | | | | | | MASK[31:16] | | | | | | | | |

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| | | | | | | | MASK[15:0] | | | | | | | | |

MASK   CONNECT CABINET CHAIN

FIG. 20

IRR : 0010 (word access)

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| | | | IRT | | | | | | | | res | | | | |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| | | | IRO | | | | | | | | res | | | | |

IRT  TARGET IR ( IR FOR SPECIFIED CHIP )
IRO  OTHER IR ( IR FOR OTHER CHIPS )

F I G. 22

TGETR: 0014 (word access)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| res | | | | | | | WCHN | | | | | | | | |

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| res | | | | | | | TCHN | | | | | | | | |

WCHN  THE NUMBER OF CHIPS EXISTING IN A LOOP: 0 CORRESPONDS TO 1024.
TCHN  THE LOCATION OF TARGET CHIP: 0 CORRESPONDS TO THE LEADING CHIP.
       WHEN TCHN IS DECREMENTED TO 0, IRT IS SCANNED IN.

FIG. 23

LOOPR: 0018 (word access)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| res | | | SLOOP | | | | | LOOP [23:16] | | | | | | | |

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| LOOP [15:0] | | | | | | | | | | | | | | | |

SLOOP    DESIGNATION OF SEPARATION
         SHIFT OPERATION PAUSING IN THIS UNIT WHEN SLOOP != 0
         RESTARTING WHEN SDR READ/WRITTEN

LOOP     LOOP LENGTH

F I G. 24

MISCR: 001c (word access)

| 31 | 30 29 28 27 26 25 24 | 23 22 21 20 19 18 17 16 |
|---|---|---|
| res | CSLOOP | res |

| 15 14 13 12 11 10 9 8 | 7 6 5 4 3 2 1 0 |
|---|---|
| res | TAPST |

CSLOOP   TEMPORARY LOOP REGISTER, SLOOP COPIED AND DECREMENTED
TAPST    STATUS OF TAP CONTROLLER

F I G. 2 5

DISPR: 0020 (word access)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| | | | | | | res | | | | | | | | | |

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| RUN | ENB | | | | | res | | | | | | | PAGE | | |

RUN   LED DISPLAY DATA COPIED
ENB   LED-DISPLAYING PERFORMED
PAGE  SOURCE PAGE OF LED-DISPLAYING DATA SPECIFIED

F I G. 2 6

SER: WRITE/READ BY SCANNING (word access)

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| | | | | Version | | | | | | | | | MASK [19:16] | | |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| | | | | | | | MASK [15:0] | | | | | | | | |

Version     VERSION OF SCANB
MASK        CONNECTING BP SLOT NET CHAINS
             WHEN REGISTER SFT OF SCANE IS 1, THIS REGISTER SHIFTS.

F I G. 2 8

| COMMAND | INPUT/OUTPUT | SETTING DATA FOR RTC (SHIFTING DIRECTION ⇨) | | | | REMARKS |
|---|---|---|---|---|---|---|
| | | 3 | 2 | 1 | 0 | |
| NOP | — | | | | | NO OPERATION |
| MANU | — | IRO | IRO | IRT | IRO | VALIDATE BITS CONTROL SUCH AS TMS, TCK OF CMDR |
| SETIR | IRT IRO | BY / SR3 | BY / SR2 | BY / SR1 | BY / SR0 | WHEN TCHN=1, WCHN=4 |
| SNSDR | SDR | SR3 | SR2 | SR1 | SR0 | WHEN TCHN=2, AND WCHC=4, SR ONLY IS READ OUT. |
| SDRxWCHN | | SR3 | SR2 | SR1 | SR0 | WHEN TCHN=4, AND WCHC=4, SR0-SR3 ARE READ OUT FOR EACH PAUSE. |
| SETDR | SDR | BY / SR3 | BY / SR2 | BY / SR1 | BY / SR0 | WHEN TCHN=2, AND WCHC=4, SR ONLY IS SET. |
| SDRxWCHN | | SR3 | SR2 | SR1 | SR0 | WHEN TCHN=4, AND WCHC=4, SDR IS SET FOR EACH PAUSE |
| BRDDR | SDR | SR | SR | SR | SR | WHEN TCHN=4, AND WCHC=4 ARE SET, AND SDR IS SET TO ALL SRs |

FIG. 30

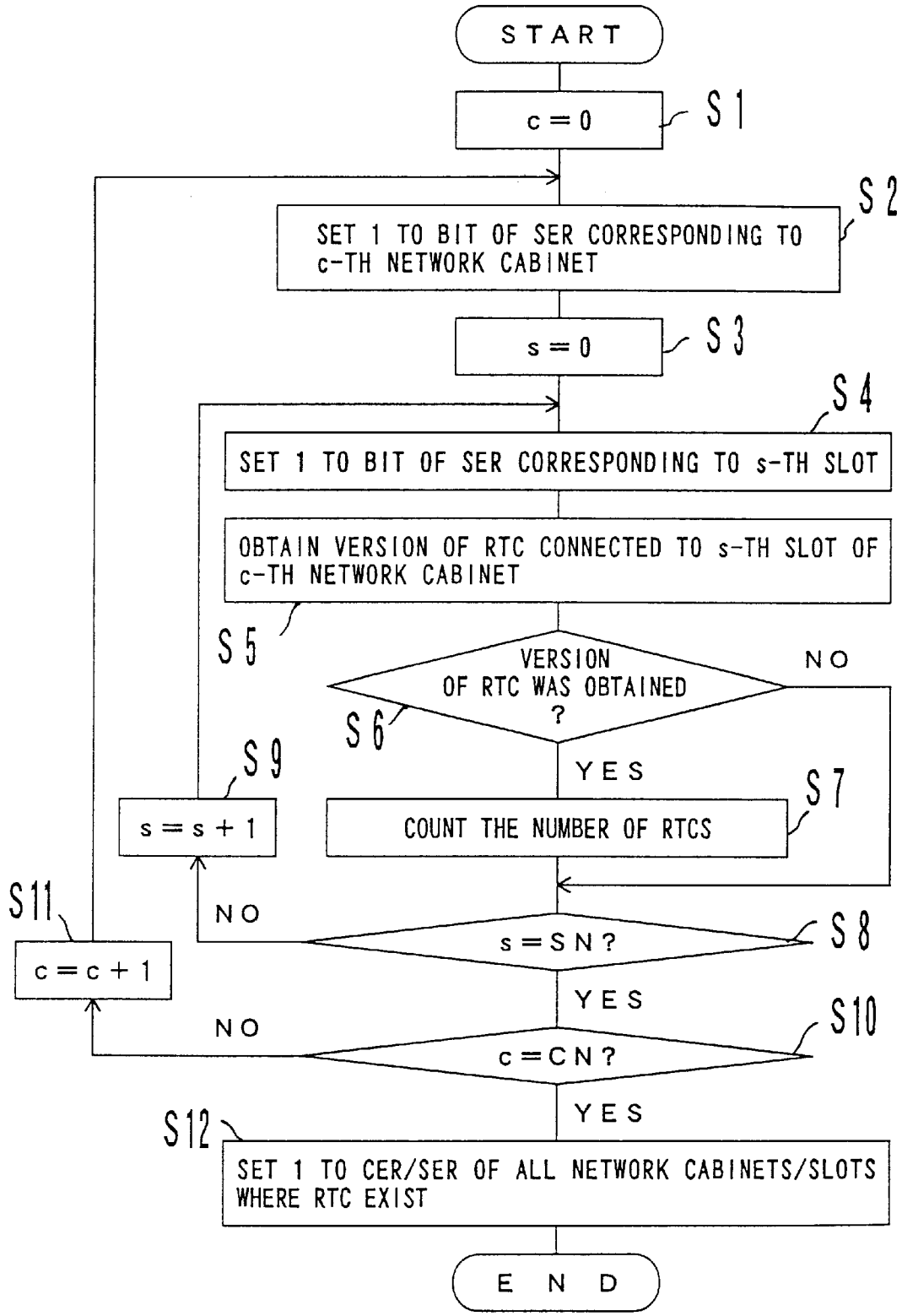
F I G. 3 1

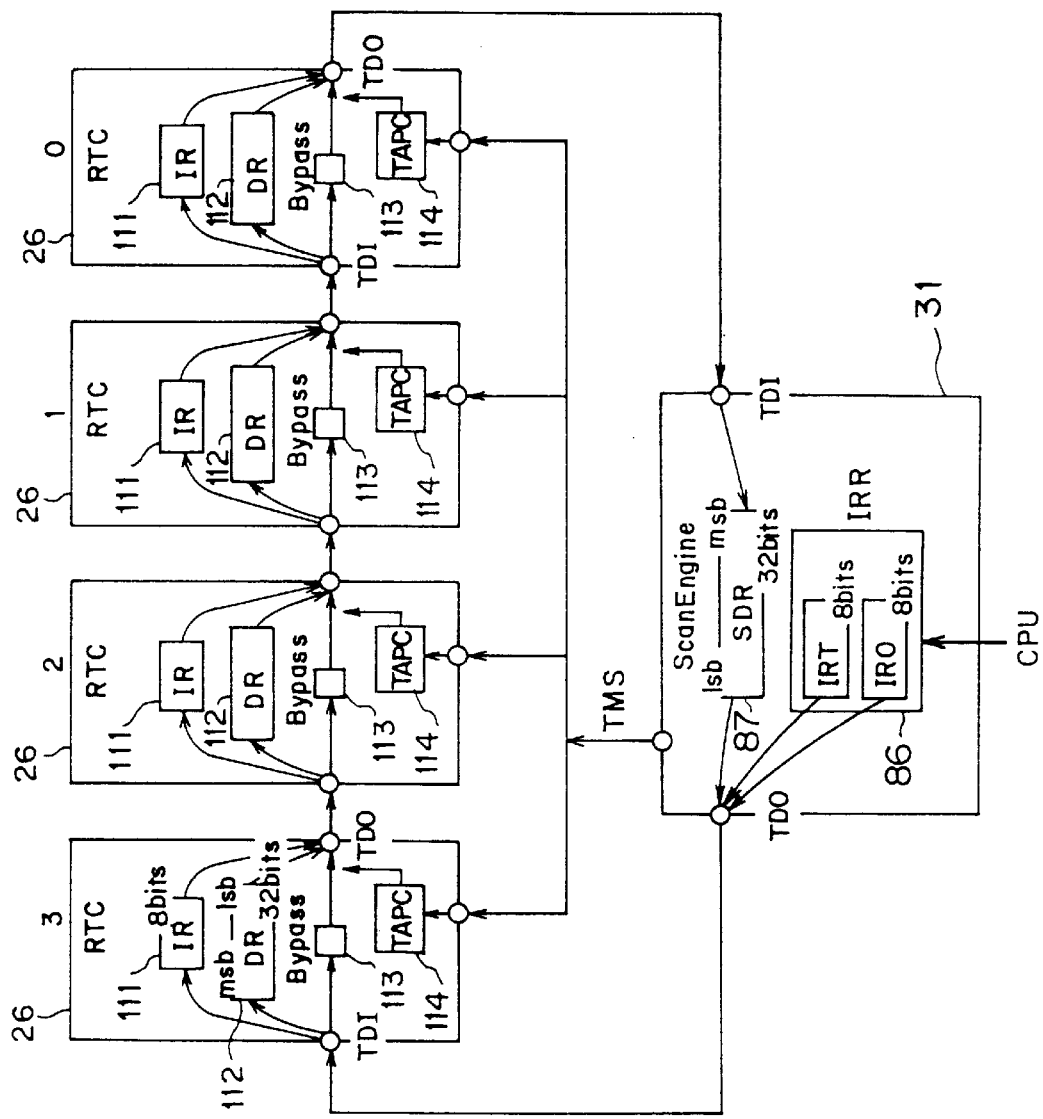
F I G. 35

| SCAN SUBCOMMAND | PARAMETER | OPERATION | REMARKS |
| --- | --- | --- | --- |
| set_ir | irt iro wchn tchn loop | SET IR | |
| set_dr | data wchn tchn loop | SET DR | |
| set_brddr | data wchn tchn loop | SET DR (broadcast) | |
| sense_dr | wchn tchn loop | READ DR | |
| set_cm | CMask | SET CABINET MASK | |
| set_sm | SMask CMask | SET SLOT MASK | WRITE REGISTER SCAN SER OF SCANB |
| get_rtc_version | wchn tchn loop | READ RTC VERSION | |
| get_rtc_status | wchn tchn loop | READ RTC STATUS | |
| get_rtc_number | NONE | OBTAIN THE NUMBER OF RTCS | |
| set_tnet_id | Is wchn tchn | SET ID OF T-net | |
| check_tnet_connection | NONE | CHECK CONNECTION STATE OF T-net | |
| shift_dr | data wchn tchn loop | SCAN DATA IN/OUT | |

F I G. 3 6

```
List 1 set_ir
 1  /*                     */
 2  /* set_ir              */
 3  /*                     */
 4  SE_set_ir(char *irt, char *iro, char *wchn, char *tchn, char *loop);
 5  {
 6      int *val_addr, val_data;
 7
 8      while (!(SE_IO(SE_CMDR) & SE_CMDR_CMP)){
 9          /* wait until previous command end */
10          /* current implementation, all commands should be completed, so error */
11      }
12
13      SE_IO(SE_IRR) = (toi(irt)<<SE_IRR_IRT_SFT) | toi(iro);  /* set irt & iro */
14      /* x = toi(s) は sscanf(s,"0x%x",&x), sscanf(s,"%d",&x) */
15      /* MASK BITS OTHER THAN SIGNIFICANT BITS */
16
17      SE_IO(SE_TGETR) = (toi(wchn)<<SE_TGETR_WCHN_SFT) | toi(tchn);  /* set wchn & tchn */
18      SE_IO(SE_LOOPR) = toi(loop);  /* set loop */
19
20      SE_IO(SE_CMDR) = SE_CMDR_CMD_SETIR;  /* set ir command */
21      SE_IO(SE_CMDR) = SE_CMDR_CMD_START| SE_CMDR_CMD_SETIR;  /* set ir command (double acction) */
22      /* SE_CMDR_CMP == SE_CMDR_START */
23
24      while (!((val_data = SE_IO(SE_CMDR)) & SE_CMDR_CMP)) {
25          /* wait until SETIR command end */
26      }
27
28      val_data &= SE_CMDR_ERR;
29
30      p = malloc(strlen("ok")+1);
31      if (val_data) sprintf(p, "ng");
32      else sprintf(p, "ok");
33      return p;
34  }
```

FIG. 37

```
List 2 set_dr
1  /*                         */
2  /*    set_dr               */
3  /*                         */
4  SE_set_dr(char *dr, char *wchn, char *tchn, char *loop);
5  {
6      int *val_addr, val_data;
7
8      while (!(SE_IO(SE_CMDR) & SE_CMDR_CMP)){
9          /* wait until previous command end */
10         /* current implementation, all commands should be completed, so error */
11     }
12
13     SE_IO(SE_SDR) = toi(dr); /* set dr */
14
15     SE_IO{SE_TGETR} = (toi{wchn}<<SE_TGETR_WCHN_SFT) | toi(tchn); /* set wchn & tchn */
16     SE_IO{SE_LOOPR} = toi(loop); /* set loop */
17
18     SE_IO{SE_CMDR} = SE_CMDR_CMD_SETDR; /* set dr command */
19     SE_IO{SE_CMDR} = SE_CMDR_START| SE_CMDR_CMD_SETDR; /* set ir command (double acction) */
20     /* SE_CMDR_CMP == SE_CMDR_START */
21
22     while (!((val_data = SE_IO(SE_CMDR)) & SE_CMDR_CMP)) {
23         /* wait until SETDR command end */
24     }
25
26     val_data &= SE_CMDR_ERR;
27
28     p = malloc(strlen("ok")+1);
29     if (val_data) sprintf(p, "ng");
30     else sprintf(p, "ok");
31     return p;
32 }
```

FIG. 38

List 3 set_brddr

```
1   /*                        */
2   /*     set_brddr          */
3   /*                        */
4   SE_set_brddr(char *dr, char *wchn, char *tchn, char *loop);
5   {
6       int *val_addr, val_data;
7
8       while (!(SE_IO(SE_CMDR) & SE_CMDR_CMP)){
9           /* wait until previous command end */
10          /* current implementation, all commands should be completed, so error */
11      }
12
13      SE_IO(SE_SDR) = toi(dr); /* set dr */
14
15      SE_IO(SE_TGETR) = (toi(wchn)<<SE_TGETR_WCHN_SFT) | toi(tchn); /* set wchn & tchn */
16      SE_IO(SE_LOOPR) = toi(loop); /* set loop */
17
18      SE_IO(SE_CMDR) = SE_CMDR_CMD_BRDDR; /* set brddr command */
19      SE_IO(SE_CMDR) = SE_CMDR_START| SE_CMDR_CMD_BRDDR; /* set ir command (double acction) */
20      /* SE_CMDR_CMP == SE_CMDR_START */
21
22      while (!((val_data = SE_IO(SE_CMDR)) & SE_CMDR_CMP)) {
23          /* wait until SETDR command end */
24      }
25
26      val_data &= SE_CMDR_ERR;
27
28      p = malloc(strlen("ok")+1);
29      if (val_data) sprintf(p, "ng");
30      else sprintf(p, "ok");
31      return p;
32  }
```

FIG. 39

List 4 sense_dr

```
1  /*                    */
2  /*   sense_dr         */
3  /*                    */
4
5  #define INIT_DATA 0x5a5a5a5a
6
7  SE_sense_dr(char *wchn, char *tchn, char *loop);
8  {
9    int *val_addr, val_data, vwchn, vtchn, gatherf;
10
11   while (!(SE_IO(SE_CMDR) & SE_CMDR_CMP)) {
12     /* wait until previous command end */
13     /* current implementation, all commands should be completed, so error */
14   }
15
16   SE_IO(SE_SDR) = INIT_DATA; /* for error check */
17
18   SE_IO(SE_TGETR) = ((vwchn=toi(wchn))<<SE_TGETR_WCHN_SFT) | (vtchn=toi(tchn)); /* set wchn & t
19   SE_IO(SE_LOOPR) = toi(loop); /* set loop */
20
21   if (vwchn == vtchn) { /* gather mode */
22     gatherf = TRUE;
23   }
24   else { /* target to one RTC */
25     gatherf = FALSE;
26   }
27
28   SE_IO(SE_CMDR) = SE_CMDR_CMD_SNSDR; /* set dr command */
29   SE_IO(SE_CMDR) = SE_CMDR_START| SE_CMDR_CMD_SNSDR; /* set ir command (double acction) */
30   /* SE_CMDR_CMP == SE_CMDR_START */
31
```

FIG. 40

```
32    if (gatherf = 1) {
33        p = malloc(strlen("ok ")+1+8*vwchn);  /* return data storage */
34        q = p+3;
35
36        while (1) {
37            while (!(SE_IO(SE_CMDR) & (SE_CMDR_CMP|SE_CMDR_PAUSE)));  /* wait 32 bits are shifted */
38            if (SE_IO(SE_CMDR) & SE_CMDR_CMP) break;
39            val_data = SE_IO(SE_SDR);  /* get val */
40            SE_IO(SE_SDR) = val_data;  /* resume shift */
41            sprintf(q, "%08x", val_data);
42            q += 8;
43        }
44        val_data = SE_IO(SE_SDR);  /* get val (should be INIT_DATA)*/
45        if ((val_data != INIT_DATA) || (SE_IO(SE_CMDR) & SE_CMDR_ERR)) {
46            *p = 'n'; *(p+1) = 'g';
47        }
48    }
49    else {
50        while (SE_IO(SE_CMDR) & SE_CMDR_CMP);  /* wait */
51        val_data = SE_IO(SE_SDR);  /* get val (should be INIT_DATA)*/
52        p = malloc(strlen("ok ")+1+10);
53        if (val_data) sprintf(p, "ng 0x%08x", val_data);
54        else sprintf(p, "ok 0x%08x", val_data);
55    }
56
57    return p;
58 }
```

FIG. 41

```
List 5  set_cm
 1  /*            */
 2  /*   set_cm   */
 3  /*            */
 4  SE_set_cm(char *cm);
 5  {
 6      int *val_addr, val_data, val_cm_old, val_cm;
 7
 8      SE_IO(SE_CER) = toi(cm);      /* set cabinet mask */
 9
10      p = malloc(strlen("ok")+1);
11      sprintf(p, "ok");
12      return p;
13  }
```

F I G. 42

```
List 6 set_sm

1  /*                    */
2  /* set_sm             */
3  /*                    */
4  SE_set_sm(char *sm, char *cm);
5  {
6    int *val_addr, val_data, val_cm_old, val_cm;
7
8    while (!(SE_IO(SE_CMDR) & SE_CMDR_CMP)){
9      /* wait until previous command end */
10     /* current implementation, all commands should be completed, so error */
11   }
12
13   val_cm_old = SE_IO(SE_CER);  /* save previous cm */
14   SE_IO(SE_CER) = toi(cm);     /* set cabinet mask */
15
16   SE_IO(SE_SDR) = toi(sm);     /* set slot mask */
17
18   SE_IO(SE_CMDR) = SE_CMDR_CMD_SFT;  /* scan slot mask command */
19   SE_IO(SE_CMDR) = SE_CMDR_START| SE_CMDR_CMD_SFT| SE_CMDR_CMP; /* start (double acction) */
20
21   while (!((val_data = SE_IO(SE_CMDR)) & SE_CMDR_CMP)) {
22     /* wait until SETIR command end */
23   }
24
25   SE_IO(SE_CER)= val_cm_old; /* recover */
26
27   val_data &= SE_CMDR_ERR;
28
29   p = malloc(strlen("ok")+1);
30   if (val_data) sprintf(p, "ng");
31   else sprintf(p, "ok");
32   return p;
33 }
```

FIG. 43

List 7 get_rtc_version

```
1   /*                              */
2   /* get_rtc_version              */
3   /*                              */
4
5   #define IR_IDCODE 0x05 /* ID register read */
6   #define IR_BYPASS 0xff /* Bypass mode */
7
8   SE_get_rtc_version(char *wchn, char *tchn, char *loop);
9   /* if tchn == wchn, gather mode */
10  /* cm and sm should be set by previous commands */
11  {
12      int *val_addr, val_data, val_cm_old, val_cm, vtchn, vwchn;
13
14      vtchn = toi(tchn);
15      vwchn = toi(wchn);
16
17      if (vtchn == vwchn) { /* gather */
18          SE_set_ir(toa(IR_IDCODE), toa(IR_IDCODE), wchn, tchn, loop); /* ok check needed */
19          return SE_sense_dr(wchn, tchn, loop);
20          /* toa SIGNIFIES CONVERSION TO AN ASCII STRING */
21      }
22      else {
23          SE_set_ir(toa(IR_IDCODE), toa(IR_BYPASS), wchn, tchn, loop);
24          return SE_sense_dr(wchn, tchn, loop);
25      }
26  }
```

FIG. 44

List 8 get_rtc_status

```
1   /*                          */
2   /* get_rtc_status           */
3   /*                          */
4
5   #define IR_SNS_STATUS 0x18
6
7   SE_get_rtc_status(char *wchn, char *tchn, char *loop);
8   /* if tchn == wchn, gather mode */
9   /* cm and sm should be set by previous commands */
10  {
11      int *val_addr, val_data, val_cm_old, val_cm, vtchn, vwchn;
12
13      vtchn = toi(tchn);
14      vwchn = toi(wchn);
15
16      if (vtchn == vwchn) { /* gather */
17          SE_set_ir(toa(IR_SNS_STATUS), toa(IR_SNS_STATUS), wchn, tchn, loop);
18          return SE_sense_dr(wchn, tchn, loop);
19          /* toa SIGNIFIES CONVERSION TO AN ASCII STRING */
20      }
21      else {
22          SE_set_ir(toa(IR_SNS_STATUS), toa(IR_BYPASS), wchn, tchn, loop);
23          return SE_sense_dr(wchn, tchn, loop);
24      }
25  }
```

FIG. 45

```
List 9 get_rtc_number
1   /*                           */
2   /*   get_rtc_number          */
3   /*                           */
4   #define SE_MAXC 12
5   #define SE_MAXS 20
6
7   static rtc_map[SE_MAXC][SE_MAXS];
8   static rtc_count=0;
9
10  SE_get_rtc_number()
11  {
12      int *val_addr, val_data, val_cm_old, val_cm, vtchn, vwchn;
13      int i, j, k, cm, sm;
14      char *p;
15
16      for (i = 0, cm = 1 ; i < SE_MAXC; i++, cm <<= 1) { /* cabinet mask sweep */
17          slot_f = 0;
18          for (j = 0, sm = 1; j < SE_MAXS; j++, sm <<= 1) {
19              SE_set_sm(toa(sm), toa(cm));  /* error check needed */
20              p = SE_get_rtc_version();
21              if (*p == 'o') {  /* rtc is exist */
22                  rtc_map[i][j] = 1; /* mark as exist */
23                  rtc_count++;
24                  slot_f = 1; /* this cabinet has slot */
25                  s_mask |= sm; /* this slot has rtc */
26              }
27          }
28          SE_set_sm(toa(s_mask), toa(cm));  /* connect all rtc in cabinet */
29          if (slot_f) c_mask |= cm;
30      }
31      SE_IO(CER) = c_mask;  /* connet all rtc in system */
32
33      p = malloc(strlen("ok ")+1+8);
34      sprintf(p, "ok %8d", rtc_count);
35      return p;
36  }
37
```

FIG. 46

List 10 check_tnet_connection

```
1   /*                         */
2   /*  check_tnet_connection  */
3   /*                         */
4
5   #define IR_EXTEST 0x00
6   #define RTC_BSF_COUNT  260 /* RTC BSF LENGTH */
7
8   SE_check_tnet_connection()
9   {
10      int loop, wchn;
11      char *datap;
12
13      wchn = rtc_count; /* rtc chip count */
14      loop = RTC_BSF_COUNT * wchn;
15      SE_set_ir(toa(IR_SAMPLE_PRELOAD), toa(wchn), toa(loop));
16      datap= malloc(size=((loop+3)/4)); /* bit to nibble */
17
18      set_all1(datap,size); /* SET ALL BITS AS TO DATA OUTPUT OF T-net TO "1" */
19      SE_shift_dr(datap, toa(wchn), toa(loop));
20      SE_set_ir(toa(IR_EXTEST), toa(wchn), toa(loop));
21      dataq = SE_shift_dr(datap, toa(wchn), toa(loop));
22      st = cmp_data(dataq, datap); /* CONFIRM "1" HAS BEEN PROPAGATED */
23
24      set_all0(datap,size); /* SET ALL BITS AS TO DATA OUTPUT OF T-net TO "0" */
25      SE_shift_dr(datap, toa(wchn), toa(loop));
26      dataq = SE_shift_dr(datap, toa(wchn), toa(loop));
27      st |= cmp_data(dataq, datap); /* CONFIRM "0" HAS BEEN PROPAGATED */
28
29      set_seq(datap,size); /* A NUMBER IS SEQUENTIALLY ASSIGNED TO OUTPUT PORTS OF T-net */
30      SE_shift_dr(datap, toa(wchn), toa(loop));
31      dataq = SE_shift_dr(datap, toa(wchn), toa(loop));
32      st |= check_connect(dataq, datap); /* CONFIRM PORT NUMBER HAS BEEN PROPAGATED */
33
34      p = malloc(strlen("ok")+1);
36      if (st) {
37          sprintf(p, "ng");
38      }
38      else sprintf(p, "ok");
39      return p;
40  }
```

FIG. 47

```
List 11 set_tnet_id
1   /*                          */
2   /*   set_tnet_id            */
3   /*                          */
4
5   #define IR_SET_ID 0x28
6
7   #define RTC_TNETID_WIDTH 32   /* T-net id bit width */
8
9   SE_set_tnet_id()
10  {
11      int *val_addr, val_data, val_cm_old, val_cm, vtchn, vwchn;
12      char *datap;
13
14      wchn = rtc_count;  /* rtc chip count */
15      loop = RTC_TNETID_WIDTH * wchn;
16
17      SE_set_ir(toa(IR_SET_ID), toa(IR_SET_ID), toa(wchn), toa(wchn), toa(loop));
18      datap= malloc(size=((loop+7)/8));  /* bit to byte */
19
20      set_tnetid(datap,size);  /* SET T-net ID */
21
22      return SE_sift_dr(datap, toa(wchn), toa(tchn), toa(wchn), toa(loop));
23  }
```

FIG. 48

```
List 12 shift_dr
 1  /*                     */
 2  /*  shift_dr           */
 3  /*                     */
 4  SE_shift_dr(char *data, char *wchn, char *tchn, char *loop)
 5  {
 6    int *val_addr, val_data, val_cm_old, val_cm, vtchn, vwchn, vloop, adjust;
 7    char *datap, *dataq, p;
 8
 9    vtchn = toi(tchn);
10    vwchn = toi(wchn);
11    vloop = toi(loop);
12    adjust = loop % 32;  /* bit adjustment */
13
14    len = strlen(data);
15    datap = malloc(len+1+3);  /* for result 3:for 'ok ' */
16    p = datap + 3;
17    tmpdtp = malloc(len+1);      /* tmp data for shift */
18    shift_right(data, tmpdtp, (32-adjust)%4);  /* adjust nibble */
19    /* assume all data is alinged to MSB(left), so shift_right is need to shfit */
20
21    dataq = tmpdtp + len - 8;   /* tail of data (32bits) */
22
23    while (!(SE_IO(SE_CMDR) & SE_CMDR_CMP)){
24      /* wait until previous command end */
25      /* current implementation, all commands should be completed, so error */
26    }
27
28    SE_IO(SE_TGETR) = (toi(wchn)<<SE_TGETR_WCHN_SFT) | toi(tchn);  /* set wchn & tchn */
29    SE_IO(SE_LOOPR) = toi(loop);  /* set loop */
30    SE_IO(SE_SDR)   = INIT_DATA;  /* set sdr to be shifted */
31
32    SE_IO(SE_CMDR) = SE_CMDR_CMD_SETDR;  /* set dr command */
33    SE_IO(SE_CMDR) = SE_CMDR_START| SE_CMDR_CMD_SENSDR;  /* set ir command (double acction) */
34
```

FIG. 49

```c
35  while (1) {
36    while (!((SE_IO(SE_CMDR) & (SE_CMDR_CMP|SE_CMDR_PAUSE))); /* wait 32 bits are shifted */
37    if (SE_IO(SE_CMDR) & SE_CMDR_CMP)) break;
38    val_data = SE_IO(SE_SDR); /* get val */
39    SE_IO(SE_SDR) = htoi8(dataq); /* set sdr to be shift, resume shift (32bits) */
40    /* toi8 convert from 8 byte hex ascii to integer (32bits) */
41
42    sprintf(p, "%08x", val_data); /* save scan out data */
43    p += 8;
44    dataq -= 8;
45    if (dataq < tmpdtp) break;
46  }
47  if (dataq < tmpdtp) {
48    while(!(SE_IO(SE_CMDR) & SE_CMDR_PAUSE)); /* wait 32 bits are shifted */
49    val_data = SE_IO(SE_SDR); /* get val */
50    SE_IO(SE_SDR) = htoi(tmpdtp, adjust, val_data); /* set sdr to be shifted and resume shift */
51    /* htoi converts from adjust bit hex ascii to integer (32bits) and mask rest bits to val_da
52
53    sprintf(p, "%x", val_data); /* save scan out data */
54    /* NOTE THAT THE CONVERSION IS EFFECTIVE WITHIN "res" BYTES AND IN UPPER BITS ONLY */
55    /* NO CORRECT OPERATION WITH sprintf */
56  }
57
58  val_data = SE_IO(SE_SDR); /* get val (should be INIT_DATA) */
59
60  if ((val_data != INIT_DATA) || (SE_IO(SE_CMDR) & SE_CMDR_ERR)) {
61    *datap = 'n'; *(datap+1) = 'g';
62  } else {
63    *datap = 'o'; *(datap+1) = 'k';
64  }
65  return datap;
66 }
```

F I G. 50

```
struct _rtc_bsf{
   unsigned wi:25;
   unsigned wo:25;
   unsigned ni:25;
   unsigned no:25;
   unsigned ei:25;
   unsigned eo:25;
   unsigned si:25;
   unsigned so:25;
};
struct _tnet_bsf{
   struct _rtc_bsf rtc[RTC_COUNT];
} tnet_bsf;
```

F I G. 53

F I G. 55

| RTC121 | | | | | RTC122 | | | |
|---|---|---|---|---|---|---|---|---|
| W | N | E | S | | W | N | E | S |
| data1 = "xx00" | xx01 | xx02 | xx03 | | xx04 | xx05 | xx06 | xx07" OUTPUT PORT |
| data2 = "02– | 07– | 00– | 05– | | 06– | 03– | 04– | 01–" INPUT PORT |

```
struct _tnet_id_table {
    char *str;
} tnet_id_table [MAX_TNET_SIZE];  /* EXIST BY THE NUMBER OF
                                     VARIATION OF tnet SIZE */
```

FIG. 56

```
set_tnetid(data, size)
{
    strncpy(data,tnet_id_table[rtcnhash(rtc_count)].str, size);
    /* rtcnhash(4)-> 0, rtchash(8)-> 1,,,, */
}
```

FIG. 57

```
tapc tapc(
        Mresetz,
        Penable,
        Pirupdate,
        Mirclock,
        Pirshift,
        Mdrupdate,
        Mdrclock,
        Pdrshift,
        Pselect,
        ITCK,
        (itms & isft), //<- TMS INPUT
        itrst
);
```

FIG. 58

```
wire out_e = isft; // output enable
bufferm buftms(utms, itms, out_e);    // with mask
module bufferm(
        out,
        in,
        enb) ;
parameter width = 20;
output [width-1;0] out; // buffered outputs
input in;              // input
input enb;             // enable wire [width-1;0] out = {width {(in&enb)} } ;  <--- MASK BY"0"OR"1"

endmodule
```

FIG. 59

```
module swmat(
        so,
        o,
        i,
        si,
        emsk
);
parameter width = 4;
output so;                      // scan out (SOUT)
output [width-1:0] o;           // outputs (UTDOi)
input [width-1:0] i;            // inputs(UTDIi)
input si;                       // scan in(SIN)
input [width-1:0] emsk;         // enable mask bits(SEi)

wire [width-1:0] o;
wire [width-1:0] o0;

/* WHEN emsk IS 1 , UTDI IS SELECTED ,
   WHEN emsk IS 0 , THE OTHER INPUT
   (DIRECT INPUT NOT THROUGH LOOP) IS SELECTED */
assign o0 [0] = si;
assign o0 [1] = emsk [0] ? i [0] : o0 [0] ;
assign o0 [2] = emsk [1] ? i [1] : o0 [1] ;
assign o0 [3] = emsk [2] ? i [2] : o0 [2] ;
assign so     = emsk [3] ? i [3] : o0 [3] ;

assign o [0] = emsk [0] ? o0 [0] : 1' b1;
assign o [1] = emsk [1] ? o0 [1] : 1' b1;
assign o [2] = emsk [2] ? o0 [2] : 1' b1;

assign o [3] = emsk [3] ? o0 [3] : 1' b1;

endmodule
```

FIG. 60

```
module gswmat(
        so,
        out,
        in,
        si,
        emsk
);
parameter width = 20;
output so;                      // scan out
output [width-1:0] out;         // outputs
input [width-1:0] in;           // inputs
input si;                       // scan in
input [width-1:0] emsk;         // enable mask bits wire ci0 = si;
swmat sw0(co0, out[3:0],   in[3:0],   ci0, emsk[3:0]);

wire ci1 = (|emsk[3:0]) ? co0 : ci0;
swmat sw1(co1, out[7:4],   in[7:4],   ci1, emsk[7:4]);

wire ci2 = (|emsk[7:4]) ? co1 : ci1;
swmat sw2(co2, out[11:8],  in[11:8],  ci2, emsk[11:8]);

wire ci3 = (|emsk[11:8]) ? co2 : ci2;
swmat sw3(co3, out[15:12], in[15:12], ci3, emsk[15:12]);

wire ci4 = (|emsk[15:12]) ? co3 : ci3;
swmat sw4(co4, out[19:16], in[19:16], ci4, emsk[19:16]);

wire so = (|emsk[19:16]) ? co4 : ci4;

endmodule
```

FIG. 62

| COMMAND | THE NUMBER OF BITS | REMARKS |
|---|---|---|
| set ir | $n_{ir} = 8 \times n_r$ | REQUIRED FOR EACH COMMAND |
| set dr | $n_{dr} = 32 \times n_r$ | GENERAL COMMAND |
| shift dr | $n_{sft} = 300 \times n_r$ | USE IN check tnet connection |

F I G. 6 5

| COMMAND | NUMBER OF BITS | NUMBER OF APPEARANCES | REMARKS |
|---|---|---|---|
| REG | 0 | 3 | NEGLECTABLE |
| RTCREG | $n_{ir}+n_{dr}=40 \times n_r$ | 7 | |
| RTCBSF | $(n_{ir}+n_{sft}) \times 2 \times 3 \sim 2000 \times n_r$ | 1 | |
| TOTAL | | $2300 \times n_r$ | |

F I G. 6 6

SCANNING DEVICE AND METHOD FOR HIERARCHICALLY FORMING A SCAN PATH FOR A NETWORK

BACKGROUND OF THE INVENTION

1. Field of the Invention

The present invention relates to a testing method for a large-scale network composed of a plurality of semiconductor devices, in particular, to a scanning device for performing network testing for a scan path formed by interconnecting semiconductor devices to be tested.

2. Description of the Related Art

In recent years, the use of the parallel computer system for high-speed computer processing having a plurality of interconnected CPUs (Central Processing Units) has been increasing. In a parallel computer system, which is provided with a network to connect between a plurality of CPUs, an amount of the wiring materials used for organizing a network increases with an increasing number of CPUs used. Alternatively, an amount of wiring is increased to achieve high performance by raising a transfer rate over a network between CPUs.

Consequently, complicated wiring is installed in a network in a parallel computer system, and this brings difficulties in testing the connection state thereof. From practical and economical viewpoints, an increase in an amount of hardware for testing should be as small as possible, and a shorter testing time is desired.

As a standard testing method for a parallel computer system of this type, which is intended for facilitating reducing an amount of testing hardware, there is an established standard, IEEE Std 1149.1 (the Institute of Electrical and Electronics Engineers Standard Test Access Port and Boundary-Scan Architecture). The testing method in accordance with this standard is generally called a "JTAG-SCAN (Joint Test Action Group-Scan) method.

The JTAG-SCAN method is characterized in that register information in an LSI (Large Scale Integration) circuit is fetched using a general purpose port called TAP (Test Access Port), thereby allowing an entire state of the LSI to be observed/controlled. This method enables this function to be used even for a printed circuit board with LSIs mounted thereon, and thus is suitable for testing a system including a plurality of semiconductor devices such as an LSI.

Normally, TAP includes the five signal lines of TCK (Test Clock), TMS (Test Mode Select), TDI (Test Data Input), TDO (Test Data Output), and TRST (Test Reset).

TCK represents a port for testing a clock signal, and TMS represents a port for a signal which changes a state of a TAP controller. The TAP controller thus referred to is a finite state machine (finite automaton) for controlling a sequence of a circuit operation in JTAG testing.

Additionally, TDI represents an input port for instructions or data for testing, TDO represents an output port to output test data, and TRST represents a port for initializing the TAP controller. Among them, TRST is an optional port, and so is not necessarily used.

However, conventional JTAG testing of a large-scale system involves the following problems.

A parallel computer network shown in FIG. 1A is assumed to be a virtual testing system to be tested. An LSI called RTC (Routine Controller) 1 is arranged on each node in the network shown in FIG. 1. Each RTC 1 is connected to its own CPU, not shown, for controlling the communication between those CPUs. In other words, a solid line between RTCs 1 shows wiring in a network between CPUs.

Further, each RTC 1 is provided with a JTAG I/F (JTAG Interface) composed of a signal line that corresponds to the TAP described above. It should be noted that the JTAG I/F is described as JTAG only in FIG. 1A, and signal lines corresponding only to TDI and TDO of each RTC 1 are shown therein.

In the parallel computer network shown in FIG. 1A, RTCs 1 are arranged in a two-dimensional plane, although they are actually arranged in a torus-like configuration in many cases. However, for simplicity, an outline of JTAG testing will be explained hereinafter using the schematic configuration shown in FIG. 1A.

In general JTAG testing, as shown in FIG. 1B, a scan loop (a scan path) is created by connecting input and output ports, TDIs and TDOs, in a chain-like configuration. Thus, an entire system is simultaneously tested under the control of a scan engine (SCANE) 2.

However, the JTAG testing shown in FIG. 1B has a problem that there is no flexibility in the system configuration. The scan loop is determined so as to include all RTCs 1 in the design of a circuit. For this reason, a node with no RTC 1 provided requires a change of wiring, and the number of RTCs 1 cannot be reduced without difficulties. Additionally, enhancement of the system by the addition of an RTC 1 also requires a change in wiring. Consequently, any change of the system configuration requires significant cost.

Further, with JTAG testing as described above, all RTCs 1 are included in a scan loop. This causes the problem that a long time is required for the scan testing. For example, a parallel computer system of the type AP3000 is provided with up to a maximum of 1,024 CPUs, and has the same number of RTCs 1 corresponding thereto. When register information for a part of this large-scale system is desired to be read out, reading the information through all RTCs 1 is a waste of time.

As described above, with JTAG testing, a general low-cost and high-speed testing method for a large-scale system has yet be established.

SUMMARY OF THE INVENTION

The object of the present invention is to provide a scanning device and a method for performing a scanning test such as JTAG-SCAN for a large computer system such as a parallel computer system effectively and at low-cost.

The scanning device according to the present invention is provided with a scan path forming unit and a shifting unit, and creates a scan path for a network organized by interconnecting a plurality of integrated circuit (IC).

The scan path forming unit connects scan chains corresponding to each input and output signal line of the plurality of ICs described above, in a hierarchical structure, thereby forming a scan path containing at least one IC among the plurality of ICs described above. Further, the shifting unit shifts information contained in at least one IC described above using the scan path described above.

The IC corresponds to an LSI such as, for example, an RTC. The scan path forming unit divides a scan chain forming a part of the scan path into partial chains comprising, for example, two layers (or levels), a first layer and a second layer, and independently connects/disconnects partial chains of the respective layers. The shifting unit shifts in data from the input side of the scan path formed by connecting partial chains, and shifts out data from the output side thereof, thereby performing a scan operation.

In addition, the scan path forming unit, for example, includes a plurality of IC switching units, and a control unit. The control unit is connected to signal lines of the plurality of IC switching units described above, and controls switching operations of the IC switching units by scanning switch data, that instructs on a switching operation, into at least one of the plurality of IC switching units.

Each IC switching unit is connected to signal lines of two or more ICs. When it receives the switch data inputted thereto, it switches signal lines of the corresponding ICs according to the switch data.

Scan chains are divided into the first layer and the second layer by the IC switching units, which connect/disconnect partial chains in the first layer according to the switch data supplied by the control unit. The control unit can change ICs included in the scan path by changing the switch data.

BRIEF DESCRIPTION OF THE DRAWINGS

These and other objects, features and advantages of the present invention will become more apparent in light of the following detailed description of a best mode embodiment thereof, as illustrated in the accompanying drawings.

FIG. 4 shows a signal generating logic of a scan buffer;

FIG. 11 shows an interface signal in a clock section;

FIG. 12 shows signals of a front connector;

FIG. 16 shows a register address map;

FIG. 17 shows as above the data structure of a clock control register;

FIG. 18 shows as above a command/status register;

FIG. 19 shows as above command codes of a scan engine;

FIG. 20 shows as above a cabinet chain enable register;

FIG. 22 shows as above an IR register;

FIG. 23 shows the data structure of a TARGET register;

FIG. 24 shows as above a LOOP register;

FIG. 25 shows as above a MISC register;

FIG. 26 shows as above a display control register;

FIG. 28 shows as above a slot chain enable register;

FIG. 30 illustrates an operation based on commands of the scan engine;

FIG. 31 is a flowchart of a network size detecting operation;

FIG. 35 exemplifies a configuration of a JTAG scan loop;

FIG. 36 shows a command interface;

FIG. 37 shows a program of set_ir;

FIG. 38 shows a program of set_dr;

FIG. 39 shows a program of set_brddr;

FIG. 40 shows a program of sense_dr (No. 1);

FIG. 41 shows a program of sense_dr (No. 2);

FIG. 42 shows a program of set_cm;

FIG. 43 shows a program of set_sm;

FIG. 44 shows a program of get_rtc_version;

FIG. 45 shows a program of get_rtc_status;

FIG. 46 shows a program of get_rtc_number;

FIG. 47 shows a program of check_tnet_connection;

FIG. 48 shows a program of set_tnet_id;

FIG. 49 shows a program of shift_dr (No. 1);

FIG. 50 shows a program of shift_dr (No. 2);

FIG. 53 shows a definition of a port;

FIG. 55 shows data in input/output ports;

FIG. 56 shows a database array;

FIG. 57 shows a definition of set_tnetid;

FIG. 58 shows a definition of a signal TMS;

FIG. 59 shows a mask control using a TMS signal;

FIG. 60 shows an operation definition of a switching matrix;

FIG. 62 shows an operation definition of a plurality of switching matrixes;

FIG. 65 shows a scan subcommand, and the necessary number of bits;

FIG. 66 shows an initialization command and the necessary number of bits; and

DESCRIPTION OF PREFERRED EMBODIMENT

An embodiment of the present invention will be described in detail hereinafter with reference to the drawings hereto attached.

Figure 2A:
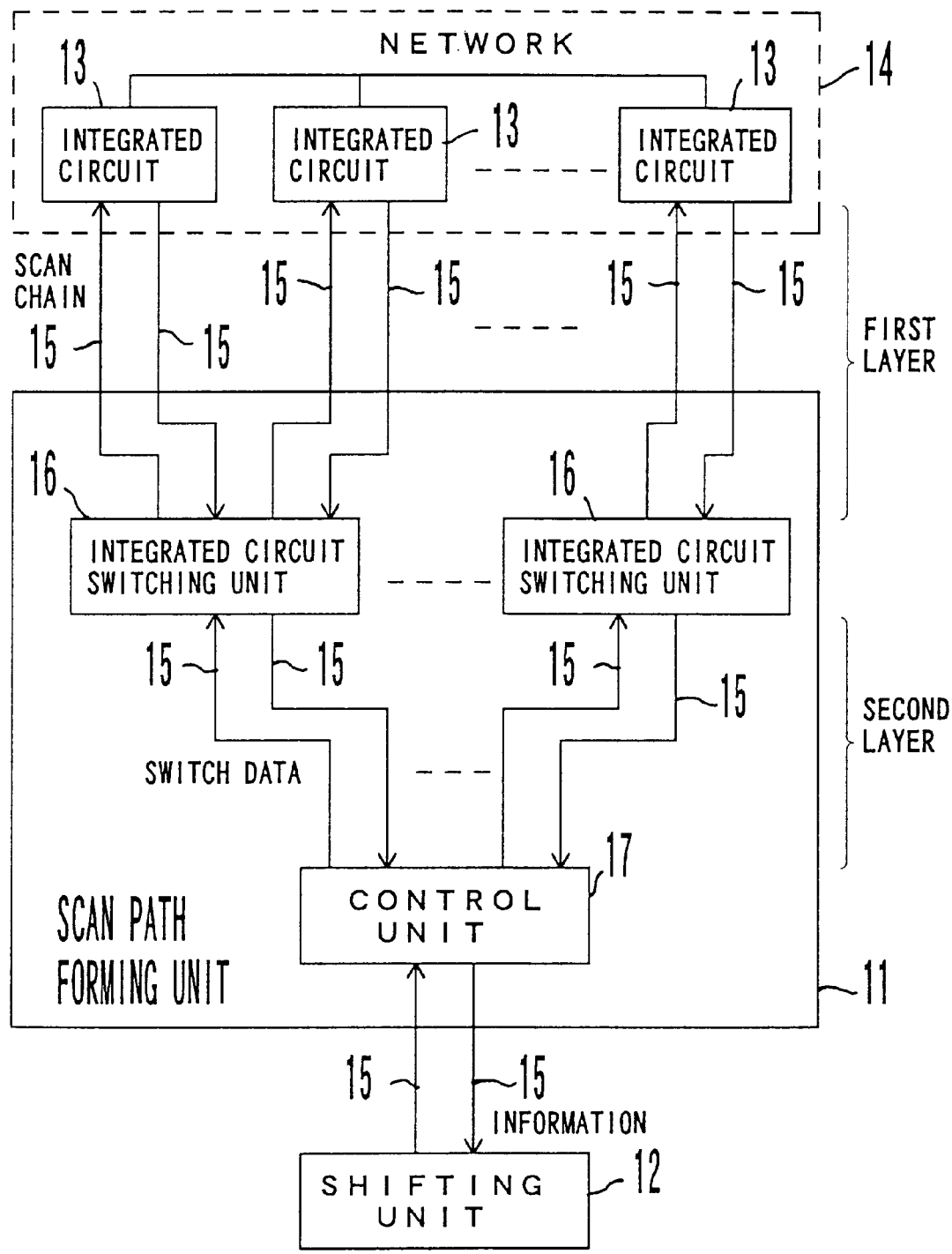
FIG. 2A is a principle block diagram of a scanning device according to the present invention.

FIG. 2A is a principle block diagram of a scanning device according to the present invention.

The scanning device shown in FIG. 2A is composed of a scan path forming unit 11, and a shifting unit 12, and creates a scan path of a network 14 organized by interconnecting a plurality of ICs 13.

The scan path forming unit 11 connects scan chains 15 that correspond to respective input/output signal lines of the plurality of ICs 13 described above, in a hierarchical structure to thereby create a scan path described above including at least one of the plurality of the ICs 13 described above.

The shifting unit 12 shifts information contained in the one or more ICs through the scan path.

The IC 13 corresponds to, for example, an LSI such as RTC 1. The scan path forming unit 11 divides a scan chain 15 forming a part of the scan path into partial chains (partial paths) in two layers, for example, a first layer and a second layer, and independently connects/disconnects partial chains of the respective layers. The shifting unit 12 shifts in data from an input side of the scan path composed of connected partial chains, and shifts out data from an output side thereof.

Providing the scan path forming unit 11 enables flexible connecting of the scan chains 15, thereby allowing a variety of scan paths to be formed. This enables forming of a short scan path which includes an IC 13 necessary for testing only, and thus performing a scan test more efficiently.

The scan path forming unit 11 further includes a plurality of IC switching units 16, and a control unit 17. The control unit 17, which is connected to signal lines 15 of the plurality of IC switching units 16 described above, scans switch data to instruct on a switching operation into at least one of the plurality of IC switching units 16 to thereby control switching the IC switching units 16.

Each IC switching unit 16 is connected to signal lines 15 of two or more ICs 13, and the IC switching unit 16 switches signal lines 15 of the corresponding IC 13 in accordance with the above described inputted switch data.

The scan chain 15 is divided into the first layer and the second layer described above by the IC switching unit 16. The IC switching unit 16 connects/disconnects partial chains in the first layer in accordance with switch data supplied from the control unit 17. The control unit 17 can select IC 13 to be included in the scan path by changing the switch data.

By thus configuring the scan path forming unit 11, any IC 13 can be connected/disconnected to the shifting unit 12 without directly connecting the scan chains 15 of all the ICs 13. For example, even in a system containing 1,000 or more ICs 13, providing an adequate number of IC switching units 16 enables any IC 13 to be selectively included in a scan path.

Further, use of the scanning device shown in FIG. 2A enables flexible changing of the system. For example, in order to eliminate an IC 13, switch data to disconnect the signal line 15 of the IC 13 only has to be created, thus eliminating the work of wiring change.

Furthermore, when the system is enhanced by additional ICs 13, signal lines 15 of the IC 13 only have to be connected to an unused part of an IC switching unit 16. Further, even when one IC switching unit 16 is added, the cost for the hardware accompanied by the addition is far less expensive than that required for reconfiguring the entire system.

The scan path forming unit 11 includes, for example, a scan engine 31 and a scan buffer 32 shown in FIG. 3, to be described later, and the shifting unit 12 corresponds to the scan engine 31. Additionally, for example, the IC switching unit 16 corresponds to the scan buffer 32 in Fig. 3, and the control means 17 corresponds to the scan engine 31 and a CPU section 52 shown in FIG. 10.

Figure 2B:
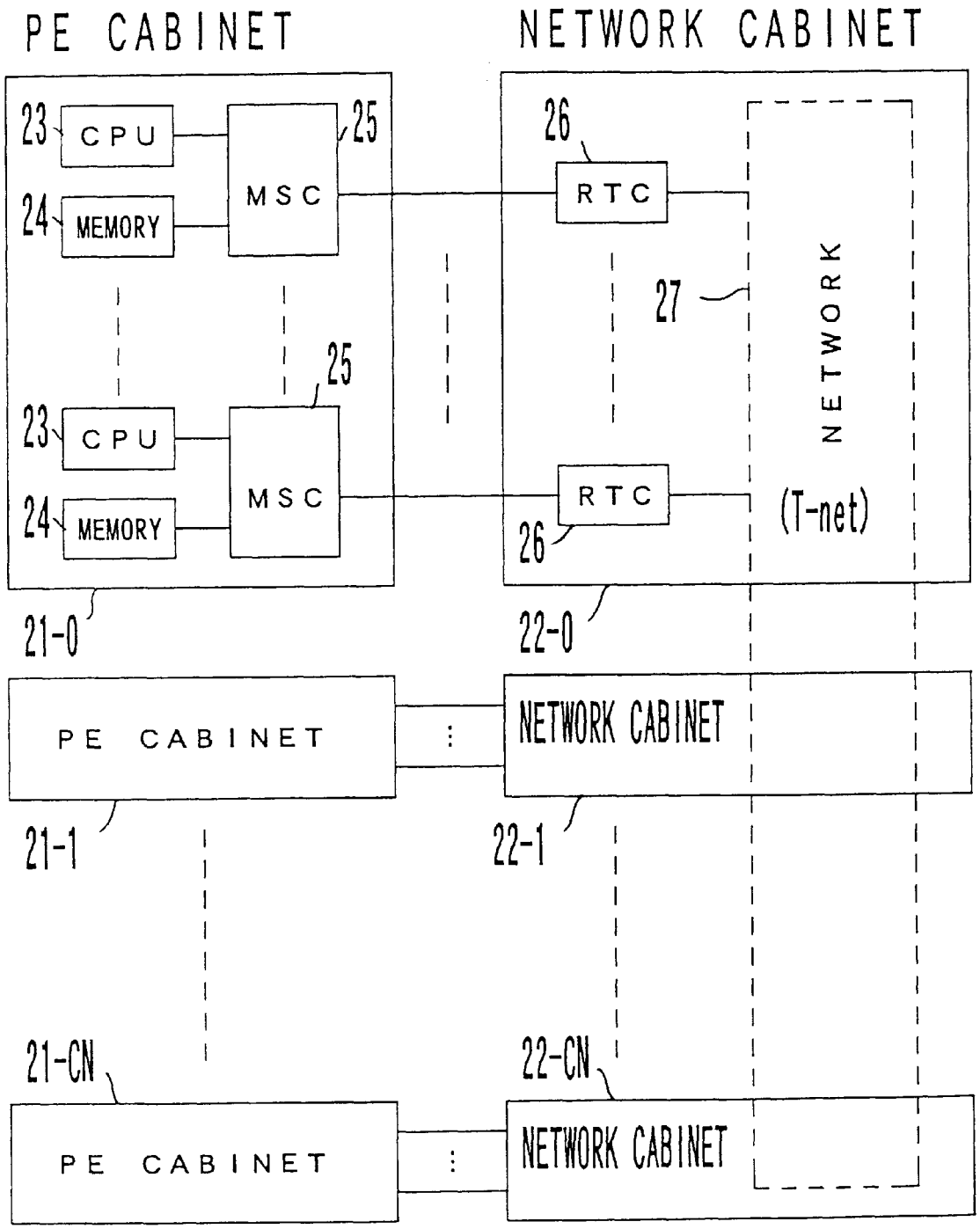
FIG. 2B shows a block diagram of a configuration of a parallel computer system.

FIG. 2B exemplifies a configuration of a parallel computer. The parallel computer shown in FIG. 2B comprises CN units of PE (Processing Element) cabinets 21-0, 21-1, . . . , 21-CN, and the corresponding CN network cabinets 22-0, 22-1, . . . , 22-CN.

Each PE cabinet 21-i (i=0, . . . ,CN) includes a plurality of CPUs 23, memories 24, and message controllers (MSCS) 25, and each network cabinet 22-i includes a plurality of RTCs 26.

A CPU 23 and a storage unit 24 are each connected to an MSC 25 which is connected to the corresponding RTC 26. Additionally, each RTC 26 is connected to other RTCs 26 in other network cabinets 22-i via network 27 (T-net). Each CPU 23 performs parallel operations, while communicating with other CPUs 23 through respective MSCs 25, RTCs 26, and the network 27.

Figure 1A:
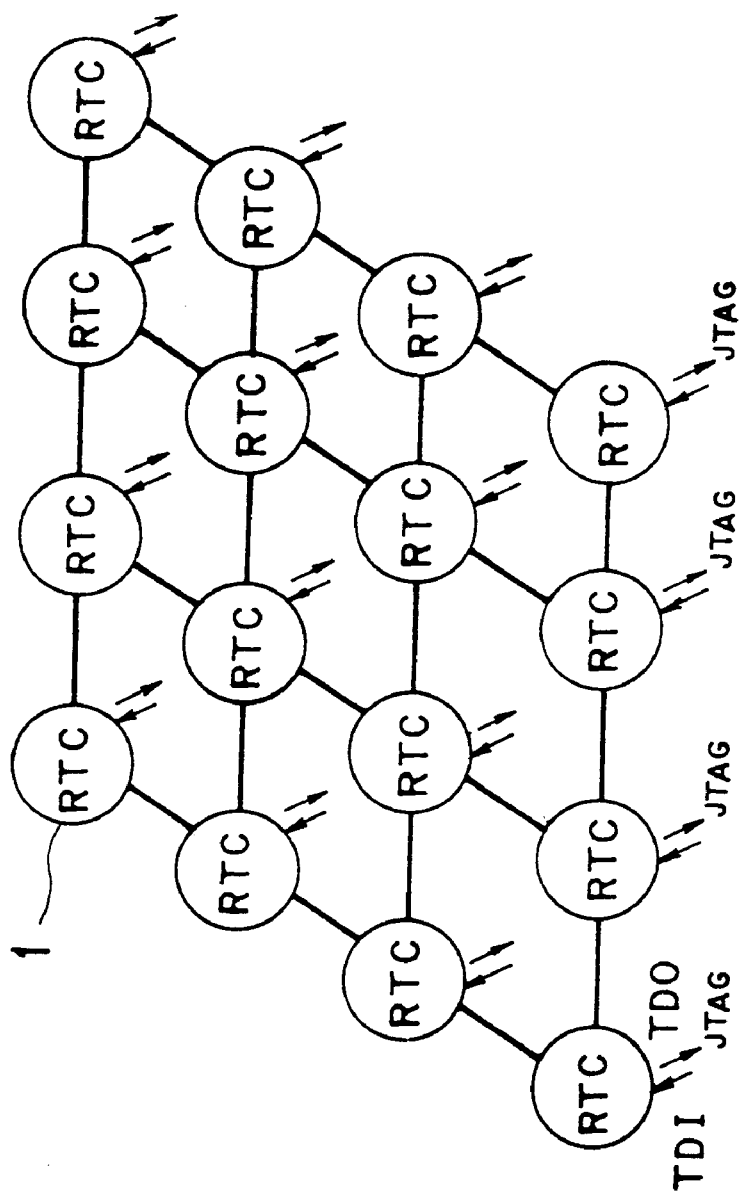
FIG. 1A shows a block diagram of a system to be tested.
Figure 1B:
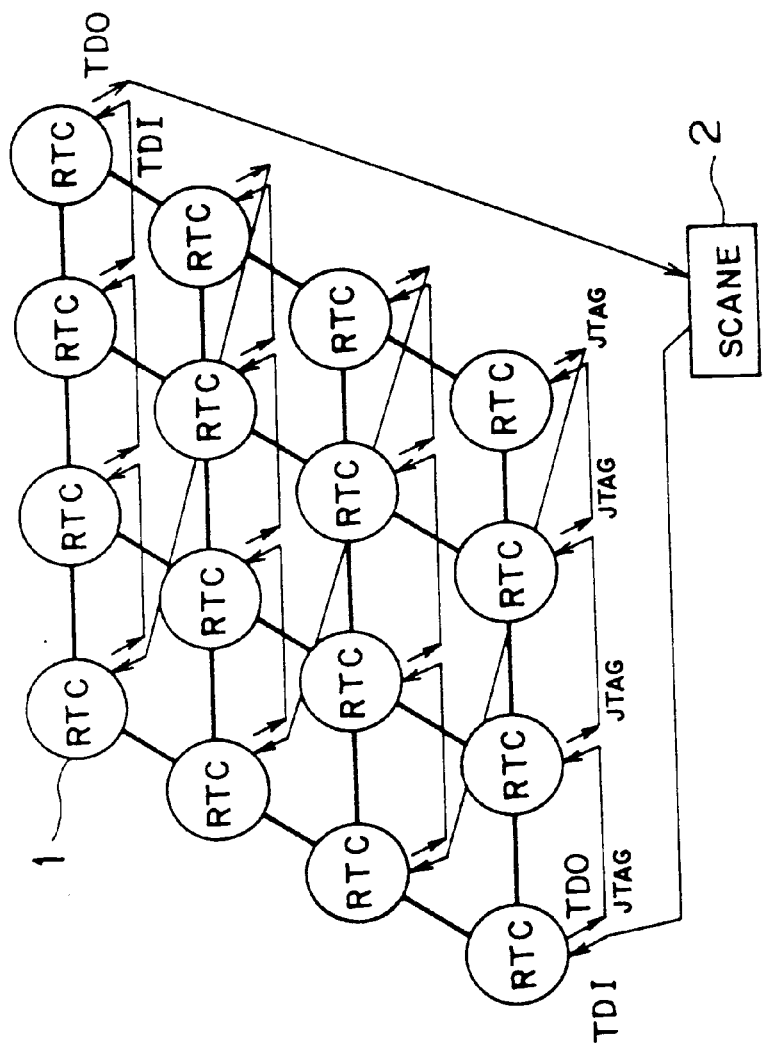
FIG. 1B shows a block diagram of conventional JTAG testing.
Figure 3:
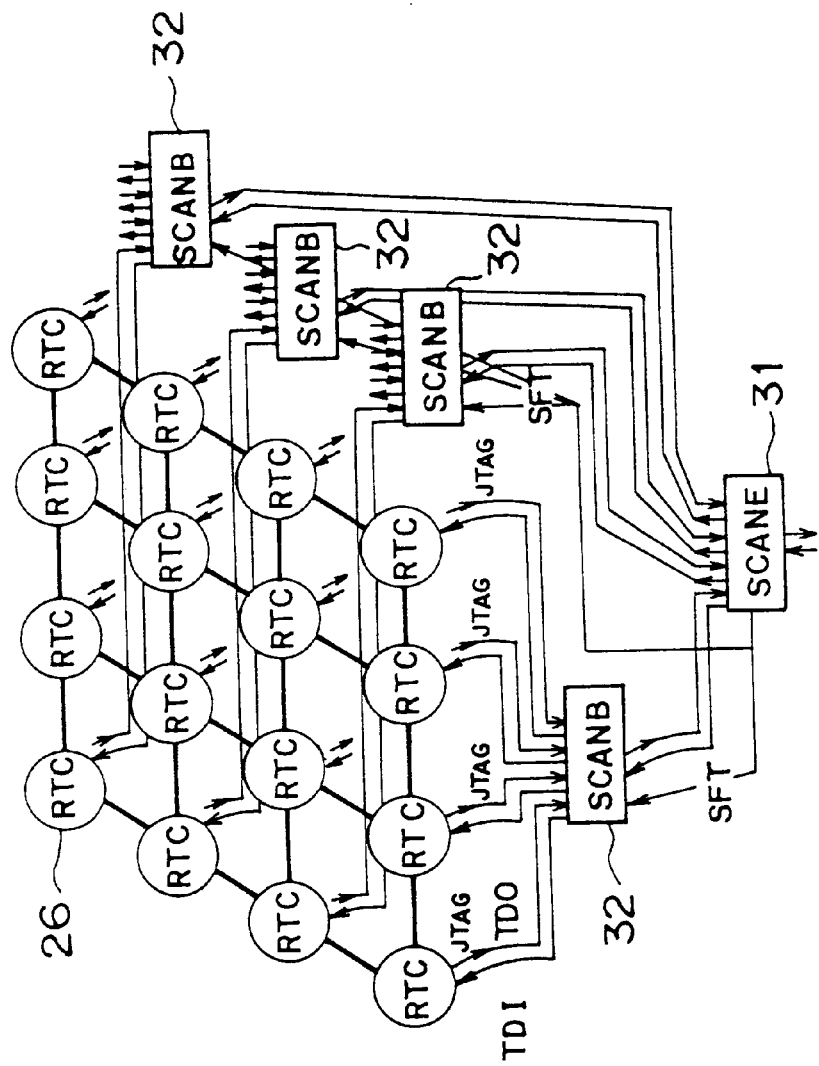
FIG. 3 shows a block diagram of a JTAG test according to the present invention.

FIG. 3 shows a JTAG testing system according to the present invention in which an RTC 26 shown in FIG. 2B is connected as shown in FIG. 1B. In the system shown in FIG. 3, a plurality of scan buffers (SCANBs) 32 are incorporated between RTCs 26 and the scan engine (SCANEs) 31 to flexibly connect signal lines TDI and TDO of the JTAG I/F.

The SCANE 31 has a switching matrix for changing the configuration of the wiring connections of signal lines TDI and TDO coming from each SCANB 32. Additionally, each SCANB 32 also has a similar switching matrix which is connected to the SCANE 31 using a signal line called SFT in addition to the normal JTAG I/F connections (TCK, TMS, TDI, TDO, TRST). When the signal SFT to be input to a SCANB 32 has a particular value, the connections of signal lines TDI, and TDO from each RTC 26 are changed.

As described above, the introduction of the SCANB 32 for performing configuration of the wiring constituting a scan path, creates a hierarchical scan path composed of a upper path between the SCANE 31 and the SCANB 32, and a lower path between the SCANB 32 and the RTC 26.

The SCANE 31 can freely connect or disconnect the upper path, and connect a partial scan path comparing some of the SCANBs 32 only. In addition, each SCANB 32 can freely connect or disconnect the corresponding paths in the lower layer, and can connect a partial scan path comprising some of the RTCs 26 only.

Consequently, by adequately controlling a switching matrix comprising the SCANE 31 and the SCANB 32, a scan loop including some of the RTCs 26 connected to some of the SCANBs 32 can be formed. Accordingly, even for a large-scale system, a short scan loop for a limited number of devices to be tested can be created, thereby enabling detailed testing to be done in a localised part of a system and in a short period of time.

Additionally, a node on which a RTC 26 is not mounted has only to be controlled so as not to connect the signal lines, and thus the work requiring the reinstallation of wiring is unnecessary. Furthermore, even when the number of RTC 26 is increased, only a corresponding number of the SCANBs 32 has to be added, thus enabling the system configuration to be enhanced at a low cost.

In the configuration shown in FIG. 3, since signal lines according to the JTAG I/F are drawn out from all RTCs 26, it appears that a number of signal lines are concentrated to the SCANB 32. However, wiring from an RTC 26 can be distributed by preparing an adequate number of the SCANBs 32. In addition, the amount of wiring between a SCANB 32 and a SCANE 31 is proportional to the number of the SCANBs 32, so that the actual amount of wiring does not become so large.

Thus, forming a hierarchical scan path using the SCAN32 enables a scan test to be made effectively and at a lower cost even for a large parallel computer system network.

Next, an outline of the operations of the SCANE 31 and the SCANB 32 will be described with reference to FIGS. 4 through 8.

FIG. 4 shows a signal generating logic of the SCANB 32. In FIG. 4, a signal having a character "I" at the beginning of its name represents a signal transmitted/received between the SCANE 31 and the SCANB 32, and a signal having a character "U" at the beginning of its name represents a signal transmitted from the RTC 26 to the SCANB 32. Additionally, the end character (i) of a signal name represents a signal transmitted/received between the RTC board and the SCANB 32 mounted in i-th slot of each network cabinet 22-i (i=0, ..., CN). One RTC board has one or more RTCs incorporated thereto.

When a value of the signal ISFT from a SCANE 31 is "1", a state transition of the TAP controller provided within SCANB 32 is made by the SCANE 31, a connection of scan chains is changed, and a scan loop is set. Additionally, when a signal ISFT=0, the state of TAP controller provided within the SCANB 32 does not change, and RTCs 26 on the formed scan loop are tested.

Figure 5:
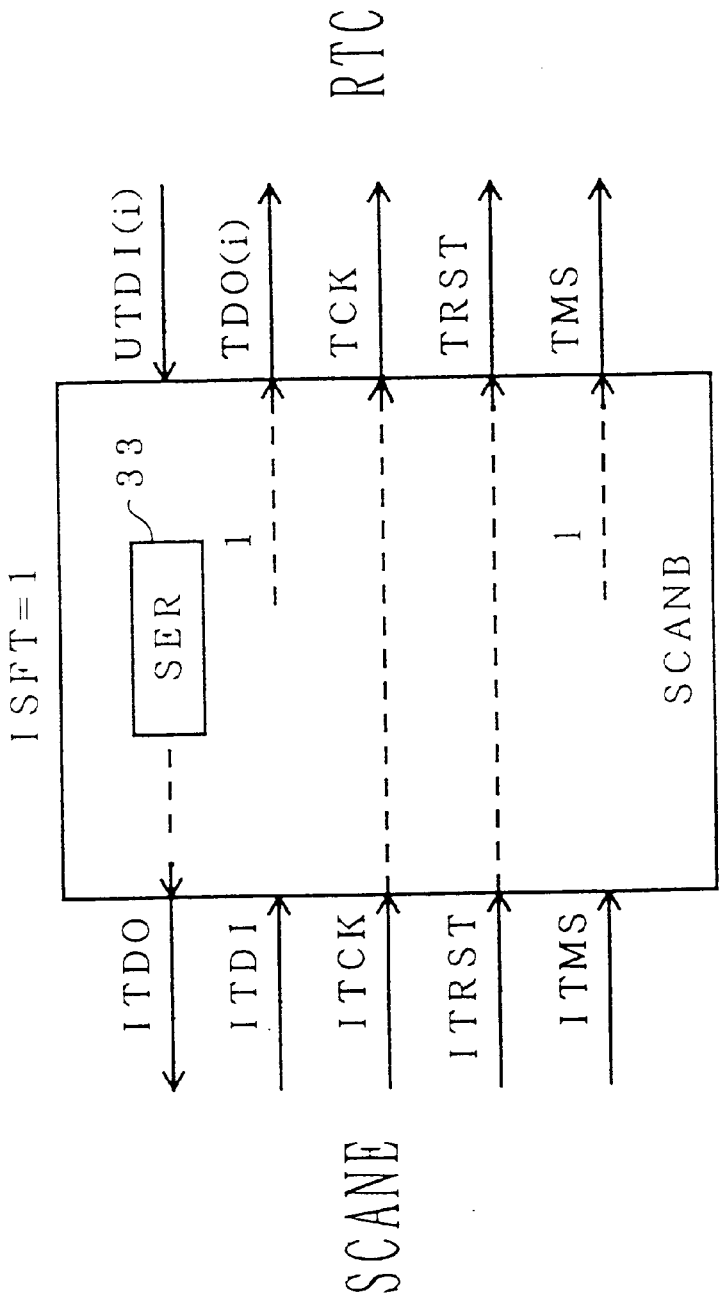
FIG. 5 shows a block diagram of a first signal generation.
Figure 6:
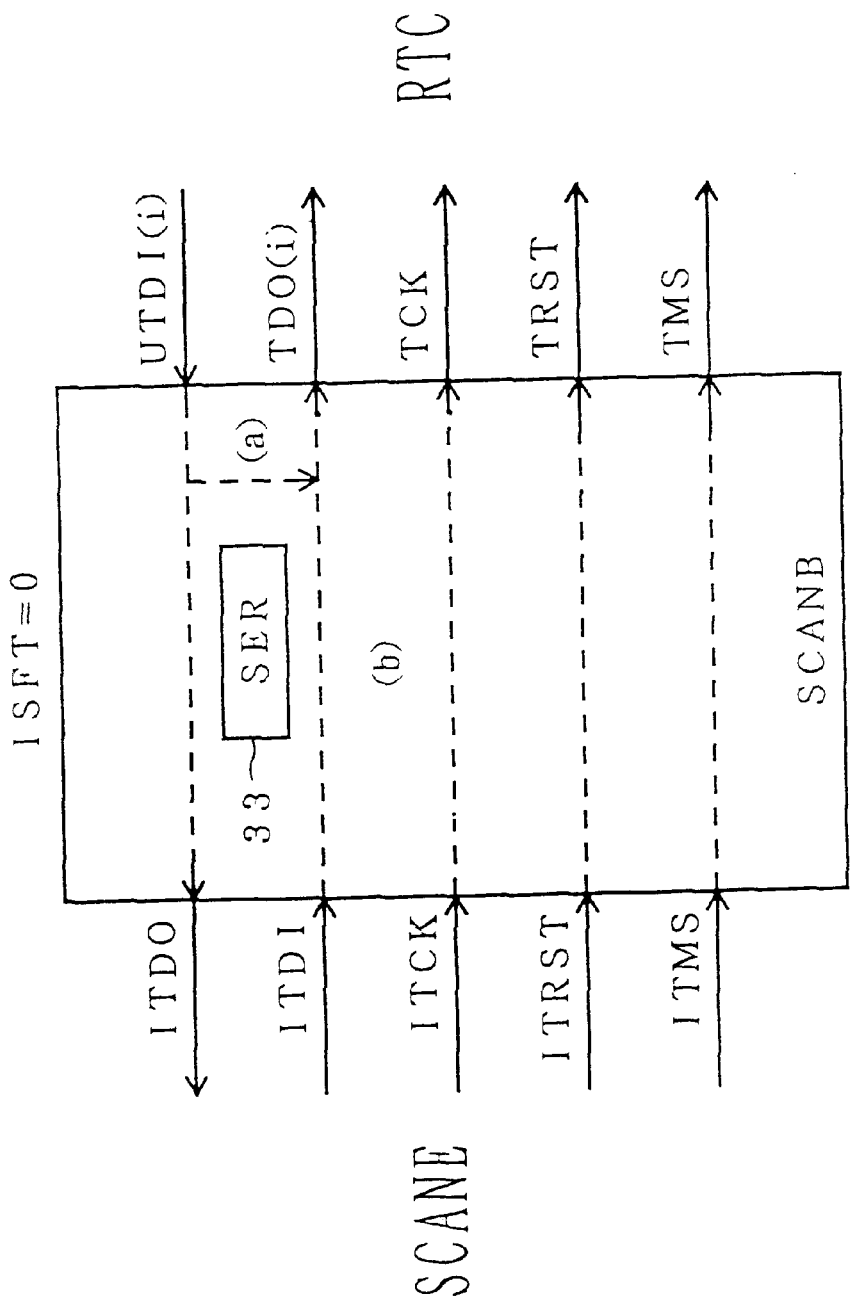
FIG. 6 shows a block diagram of a second signal generation.

When ISFT=1, a signal is generated as shown in FIG. 5, while when the signal ISFT=0, a signal is generated as shown in FIG. 6.

In FIGS. 5, and 6, a slot chain enable register (SER) 33 is a register for storing control data for a switching matrix within the SCANB 32. Rewriting the value of SER 33 installs a scan chain (slot chain) which corresponds to each slot, and thus SER 33 can be considered to be a part of the TAP controller.

First, when the signal ISFT=1, control data supplied from the SCANE 31 is scanned in SER 33 to thereby set the SER 33. At this point, as shown in FIG. 5, a signal line TDO(i) and TMS always output a value of "1" to the RTC 26.

In addition, signals ITCK, and ITRST from the SCANE 31 are amplified in buffers and are outputted to the RTC 26 through signal lines TCK and TRST, respectively. The contents of the SER 33 are outputted to the SCANE 31 from a signal line ITDO as they are.

Next, when the signal ISFT=0, as shown in FIG. 6, signals ITCK, ITRST, and ITMS from the SCANE 31 are amplified in buffers, and each is outputted to the RTC 26 from signal lines TCK, TRST, and TMS respectively. Further, a signal line ITDO outputs a signal UTDI(i) from the RTC 26 to the SCANE 31.

A signal line TDO (i) selects a signal ITDI from the SCANE 31, or a signal UTDI (i) from the RTC 26, in accordance with the data value stored in the SER 33, and outputs it to the RTC 26. When control data of the corresponding SER 33 is "1", UTDI (i) is outputted as shown by the dashed line (a), while when the control data is "0", ITDI is outputted as shown by the dashed line (b).

An operation of the SCANB 32 will be explained for each signal received from the SCANE 31 as follows.

First, signals ITCK, ITRST received from the SCANE 31 are entered to the RTC 26 after being amplified in a buffer. When the signal ISFT is "1", a state transition of the TAP controller within the SCANB 32 is made, and a value of the signal TMS to RTC 26 is kept at "1". When the signal ISFT is "0", a state transition of the TAP controller within the SCANB 32 is not made, and the signals from the SCANE 31 are set to be signals to the RTC 26 after being amplified in a buffer.

While, when the signal ISFT=1, and the TAP controller of the SCANB 32 is in a data shift state, the signal ITDI received from the SCANB 32 is entered to SER 33. Then the SCANB 32 shifts data of the SER 33, and outputs it to the SCANB31 after defining it as a signal ITDO. At this time, a value of signal TDO(i) is kept at "1". Otherwise, the SCANB 32 connects a scan chain in an RTC board in accordance with the control data of the SER 33, to thereby form a scan loop.

Next, a method of forming a scan loop using the SCANE 31 and the SCANB 32 will be described.

Figure 7:
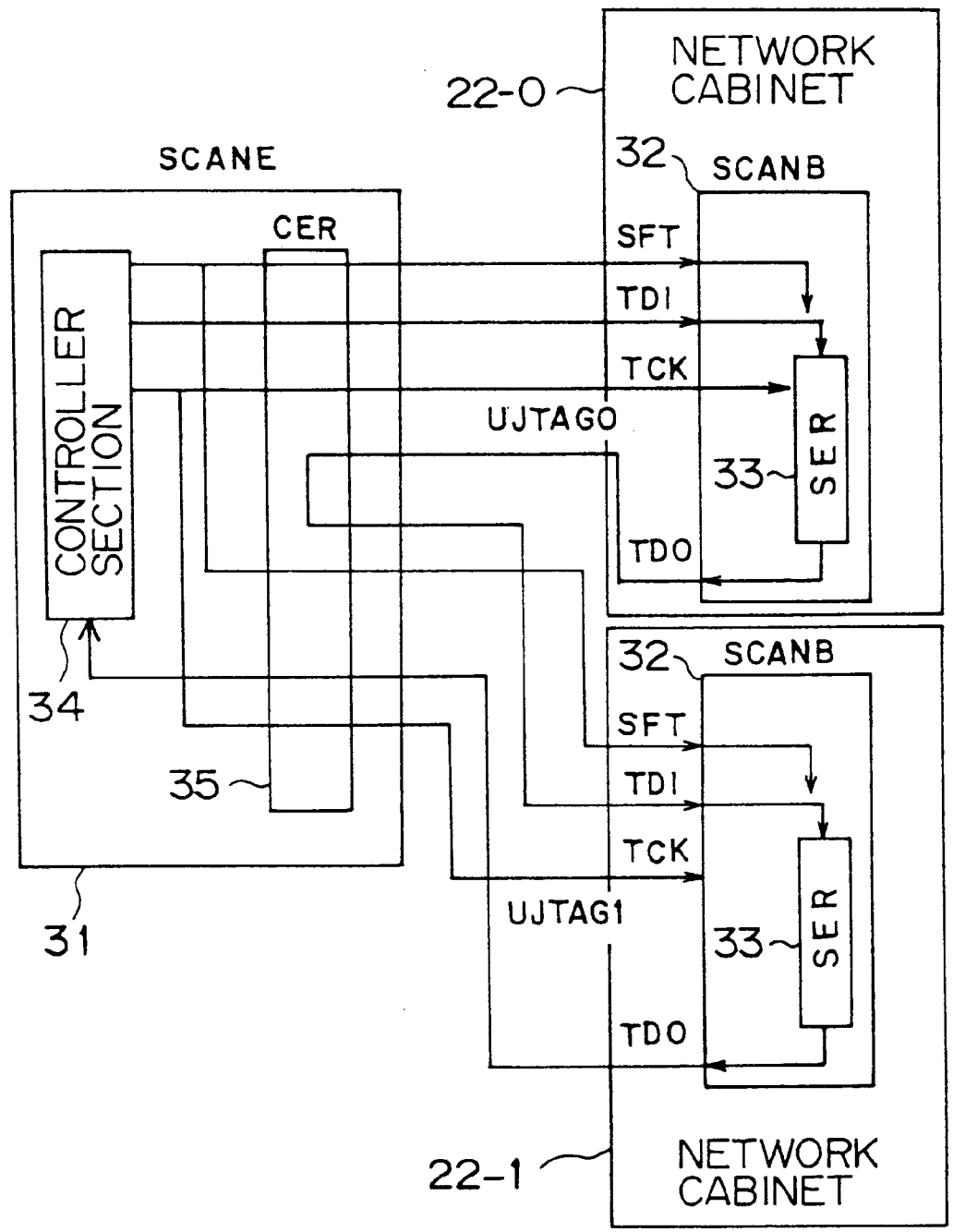
FIG. 7 shows a block diagram of a connection method of a cabinet chain.

A cabinet chain enable register (cabinet chain enable register CER) 35 within the SCANE 31, as shown in FIG. 7, connects a scan chain between the SCANE 31 and the SCANBs 32.

In FIG. 7, network cabinets 22-0 and 22-1, are included in a scan loop, and each network cabinet 22-0 and 22-1 contains one SCANB 32. For this reason, a scan chain between the SCANE 31 and the SCANB 32 is called a cabinet chain. UJTAG0 and UJTAG1 represent the JTAG I/F for network cabinets 22-0 and 22-1, respectively.

Like the SCANB 32, the SCANE 31 has a switching matrix, and connects a plurality of cabinet chains of JTAG I/Fs that are output from the SCANE 31 by controlling the switching matrix using control data stored in the CER 35.

The connection can be made by entering an output signal TDO of a certain SCANB 32 to an input signal TDI of another SCANB 32 via the switching matrix. At this time, the signals TCK, TRST and TMS are supplied commonly to all SCANBs 32 via a buffer.

Once a cabinet chain is connected, control data is scanned in the SER 33 in accordance with the control from a controller section 34 within the SCANE 31. When the controller section 34 performs a JTAG scan by setting a value of the SFT to "1", a TAP controller unit in the SCANB 32 makes a state transition.

Then, when the TAP controller becomes in the data shift state (SHIFT DR state), each SCANB 32 shifts by reading shift data in the SER 33. Thus, data in the SER 33 is read out, followed by inputting new data to the SER 33.

Figure 8:
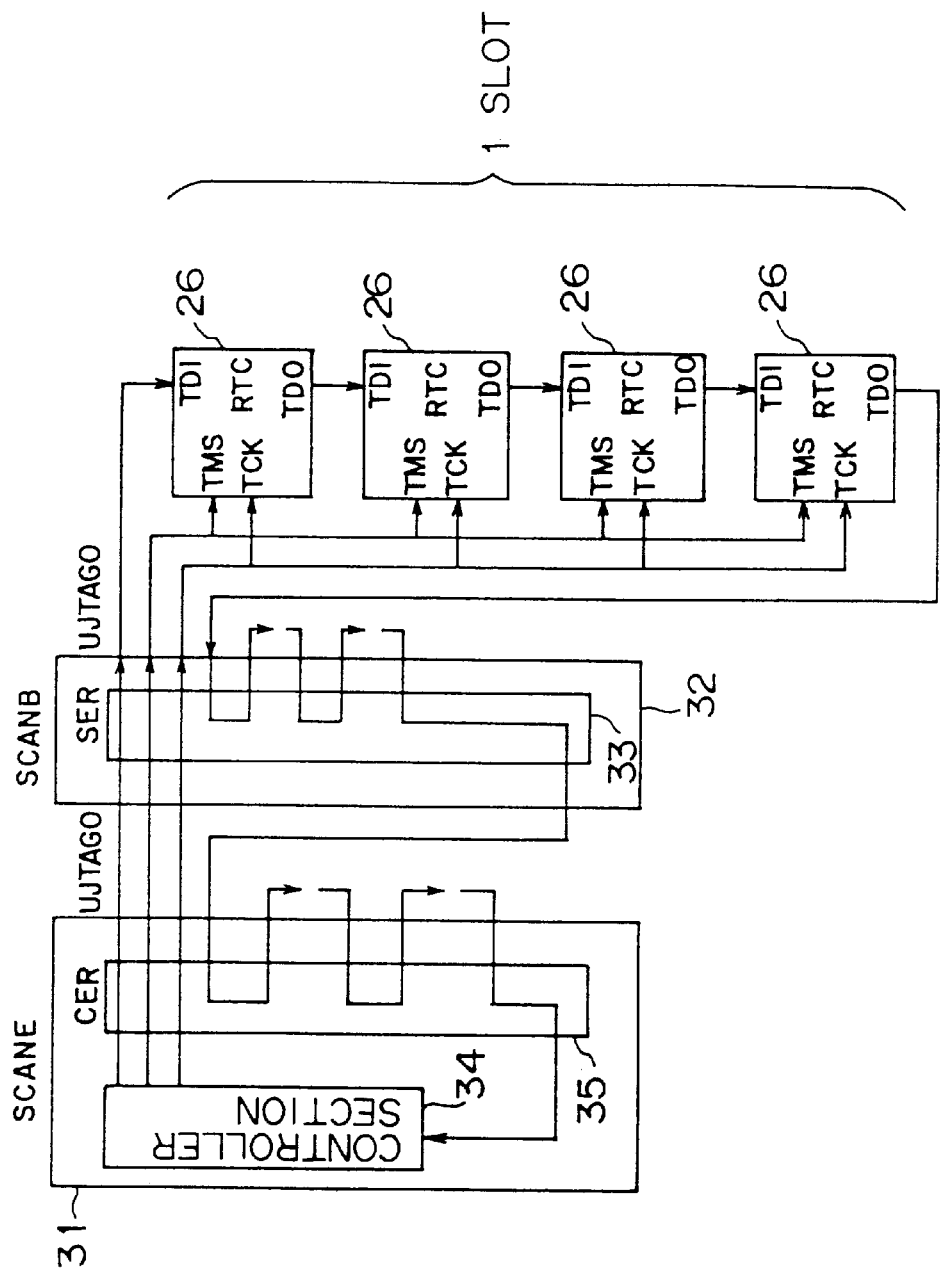
FIG. 8 shows a block diagram of a connection method of a slot chain.

The SER 33 within the SCANB 32 connects a scan chain between the SCANB 32 and the RTC 26 as shown in FIG. 8. In FIG. 8, an RTC 26 is incorporated on an RTC board mounted in a slot of the network cabinet 22-0, and thus a scan chain between the SCANB 32 and the RTC 26 is called a slot chain.

When a value of the signal SFT is "0", the TAP controller of the SCANB 32 does not change, and the TAP controller within the RTC 26 makes a state transition. For this reason, the JTAG scan for the RTC 26 only is controlled by the controller section 34.

Next, a configuration of each network cabinet 22-i will be explained in detail with reference to FIGS. 9 through 27.

Figure 9:
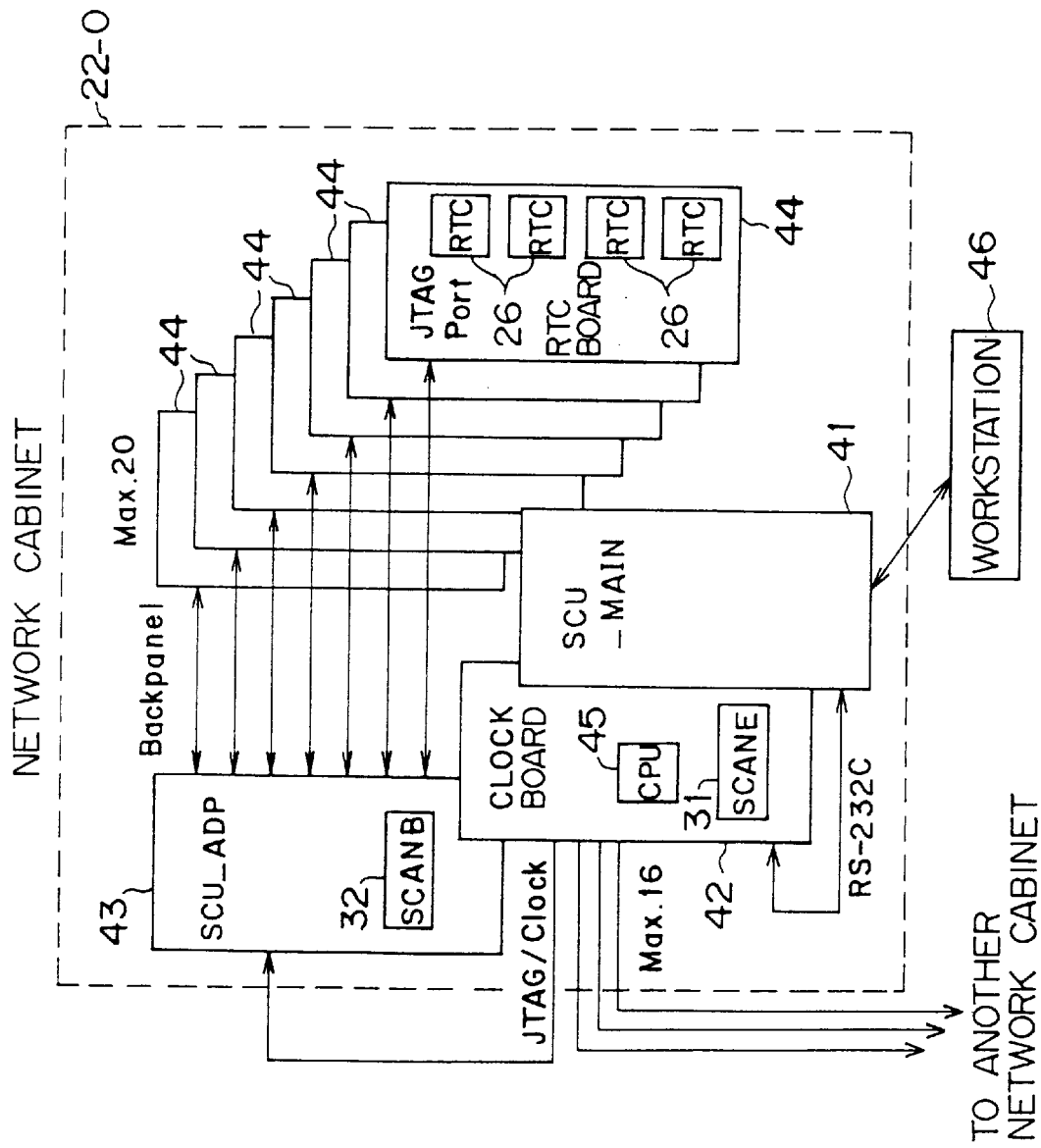
FIG. 9 is a block diagram of a network cabinet.

FIG. 9 shows a configuration of a network cabinet 22-0 shown in FIG. 2B. The network cabinet 22-0 shown in FIG. 9 is equipped with an SCU_MAIN board 41, a CLOCK board 42, an SCU_ADP board 43, and RTC boards 44. Each of the other network cabinets 22-1 - 22-CN is equipped with an SCU_ADP board 43, and RTC boards 44 only, and is not equipped with an SCU_MAIN board 41 and a CLOCK board 42.

The SCU_MAIN board 41, of which only one is provided in a parallel computer system, connects an external control workstation 46 and a CLOCK board 42 using RS-232C (Recommended Standard). The workstation 46 is used for inputting commands for scan testing control, and outputting testing results, etc..

Also only one CLOCK board 42 is provided within a parallel computer system, which generates the system clock. The CPU 45 for performing scan-control and the SCANE 31 are incorporated in the CLOCK board 42.

Only one SCU_ADP board 43 is present in each network cabinet 22-i, and is connected to the CLOCK board 42 through the clock signal and the JTAG I/F signal. This SCU_ADP board 43 has SCANB 32 incorporated therein. It buffers the system clock and JTAG signals, and distributes/collects the JTAG signals.

The RTC boards 44 equipped with, for example, four RTCs 26, connect to the SCU_ADP board 43 through JTAG I/Fs (JTAG ports) via rear connectors on a back panel. One network cabinet 22-i can have a maximum of RTC boards 44 mounted therein.

The clock signal and JTAG signal from the CLOCK board 42 are distributed to other network cabinets 22-1 - 22-CN. The maximum number of the network cabinets 22-i here is 16. For example, when 16 RTC boards 44 are mounted in each of the 16 network cabinets 22-i, the total number of RTCs 26 connected to the network 27 is 1,024.

Figure 10:
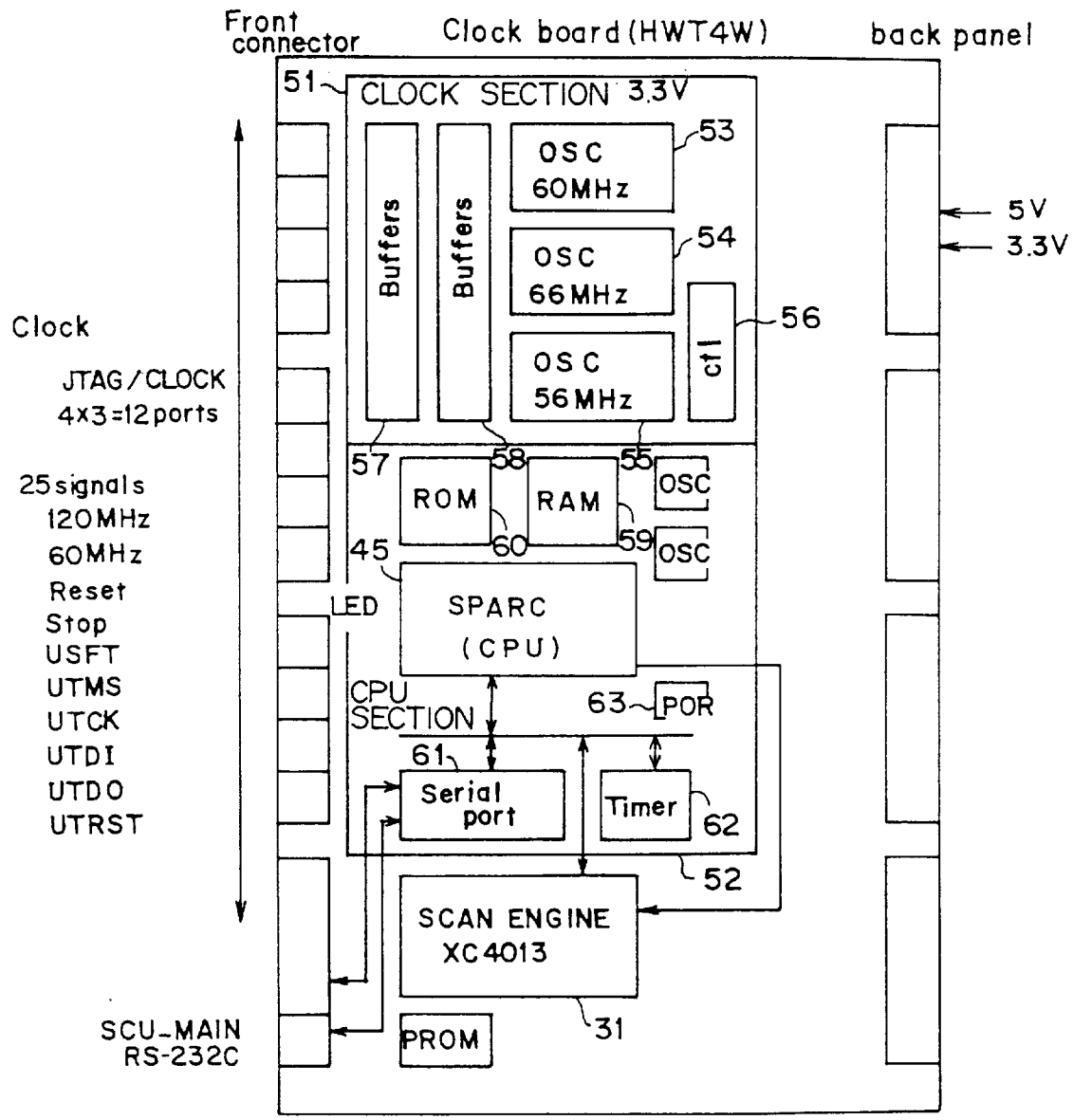
FIG. 10 is a block diagram of a clock board.

FIG. 10 shows a configuration of the CLOCK board 42. The CLOCK board 42 includes a clock section 51, a CPU section 52, and a SCANE 31. The clock section 51 selects a clock signal from among clock generators 53, 54 and 55 having oscillation frequencies of 60 MHz, 66 MHz, and 56 MHz respectively, in accordance with margin control by the controller 56. The selected clock signal is distributed from the front connector via buffers 57, and 58 to the number of the network cabinets 22-i. The clock section 51 operates from a 3.3V power supply.

The I/F signal between the clock section 51 and SCANE 31 is shown in FIG. 11. In FIG. 11, the character "O" represents that the signal is an output signal issued from the clock section 51, and a maximum of eight clock signals can be selected by using the three selection signals, Se10, Se11, and Se12. The RTC 26 operates according to the selected clock signal.

A CPU section 52 includes a CPU (SPARC) 45, a RAM (Random Access Memory) 59, a ROM (Read Only Memory) 60, a serial port 61, a timer 62, and a POR (Power On Reset) circuit 63. The CPU section 52 controls the SCANE 31 by transmitting or receiving signals to or from the SCU_MAIN board 41 through the RS-232C interface.

The SCANE 31 performs JTAG scanning by accessing through the CPU 45. The SCANE 31 is implemented by using, for example, an XC4013 device.

The front connector supplies a JTAG signal and a clock signal to the SCU_ADP board 43. The front connector is provided with sixteen sets of output connectors for supplying a maximum of sixteen network cabinets 22-i. The details of the JTAG signals and the clock signals are as shown in FIG. 12.

In FIG. 12, the character "O" represents that the signal is an output signal supplied to SCU_ADP board 43, and the character "I" represents that the signal is an input signal supplied from the SCU_ADP board 43. The front connector also includes a connector for RS-232C that connects to the SCU_MAIN board 41.

Figure 13:
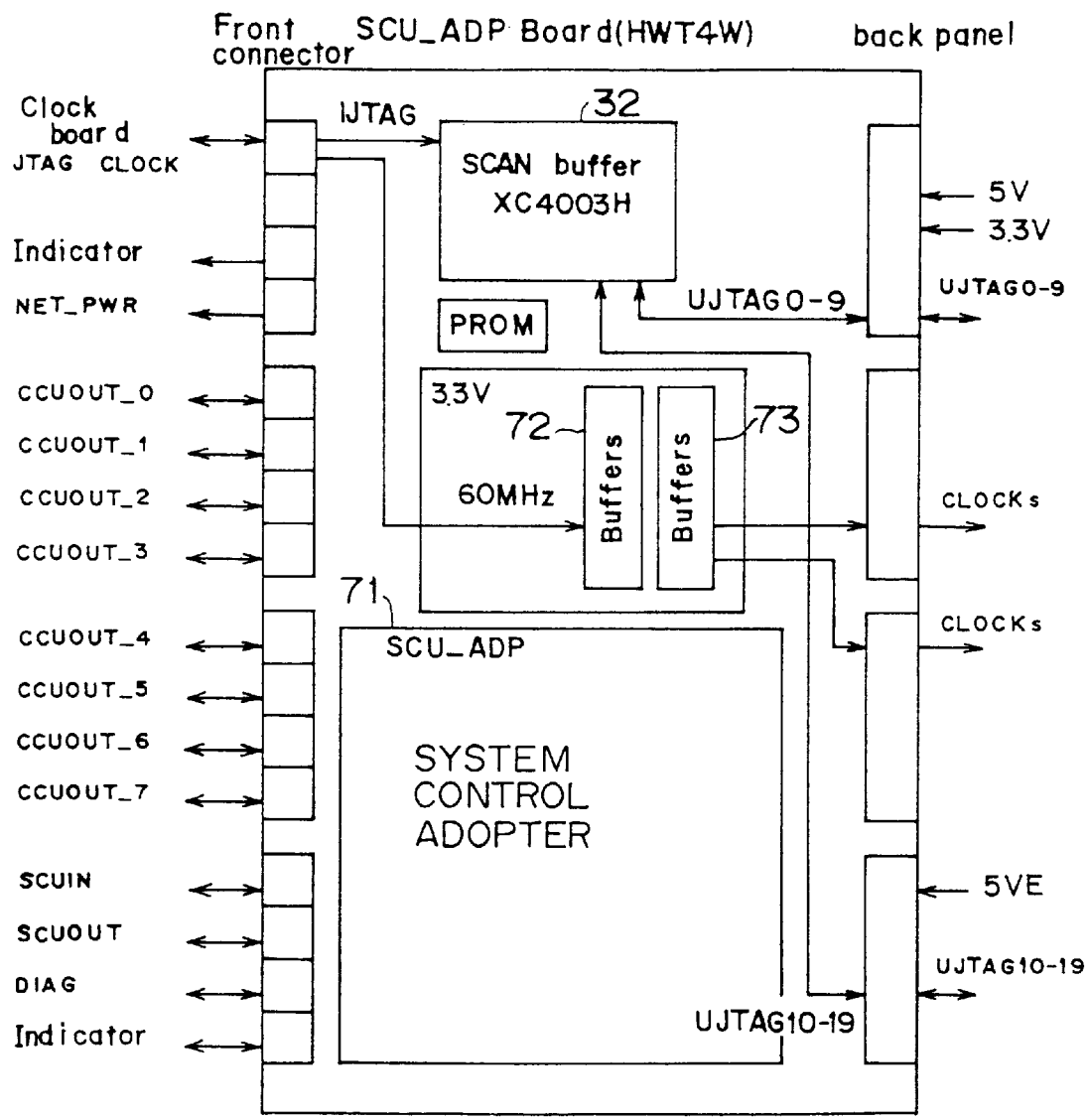
FIG. 13 is a block diagram of an SCU_ADP board.

The rear connector has power supply inputs of voltages of 3.3V and 5V. FIG. 13 is a block diagram of the SCU_ADP board 43. The SCU_ADP board 43 includes a system control adaptor (SCU_ADP) 71, clock buffers 72 and 73, and the SCANB 32.

The system control adaptor 71 buffers a signal (CCUOUT) that connects to a buffer, not shown, for the RS-232C data, mounted in PE cabinet 21-i shown in FIG. 2B, and controls outputs of the RS-232C signals of the 12 ports, fans, and the network power supply of the RTCs 26. The system control adaptor 71 operates from 5VE (Direct Current) source.

The clock buffers 72 and 73 operate at 3.3V and buffer a clock signal distributed from the CLOCK board 42 to then distribute it to the RTC boards 44.

The SCANB 32 reconects the JTAG signals to the RTC boards 44 using a JTAG signal supplied from the SCANE 31 in the CLOCK board 42. The SCANB 32 is realized by using, for example, XC4003H, and operates from 5V power supply voltage.

The front connector outputs twelve RS-232C signals supplied from the system control adaptor 71, control signals of 5V and 3.3V (NET_PWR), and a signal for monitoring fan rotation.

The rear connectors on a back panel output a clock signal to the RTC boards 44, and input/output JTAG signals. In addition, the rear connector is provided with power supply voltages of 5V, 3.3V, and 5VE.

Figure 14:
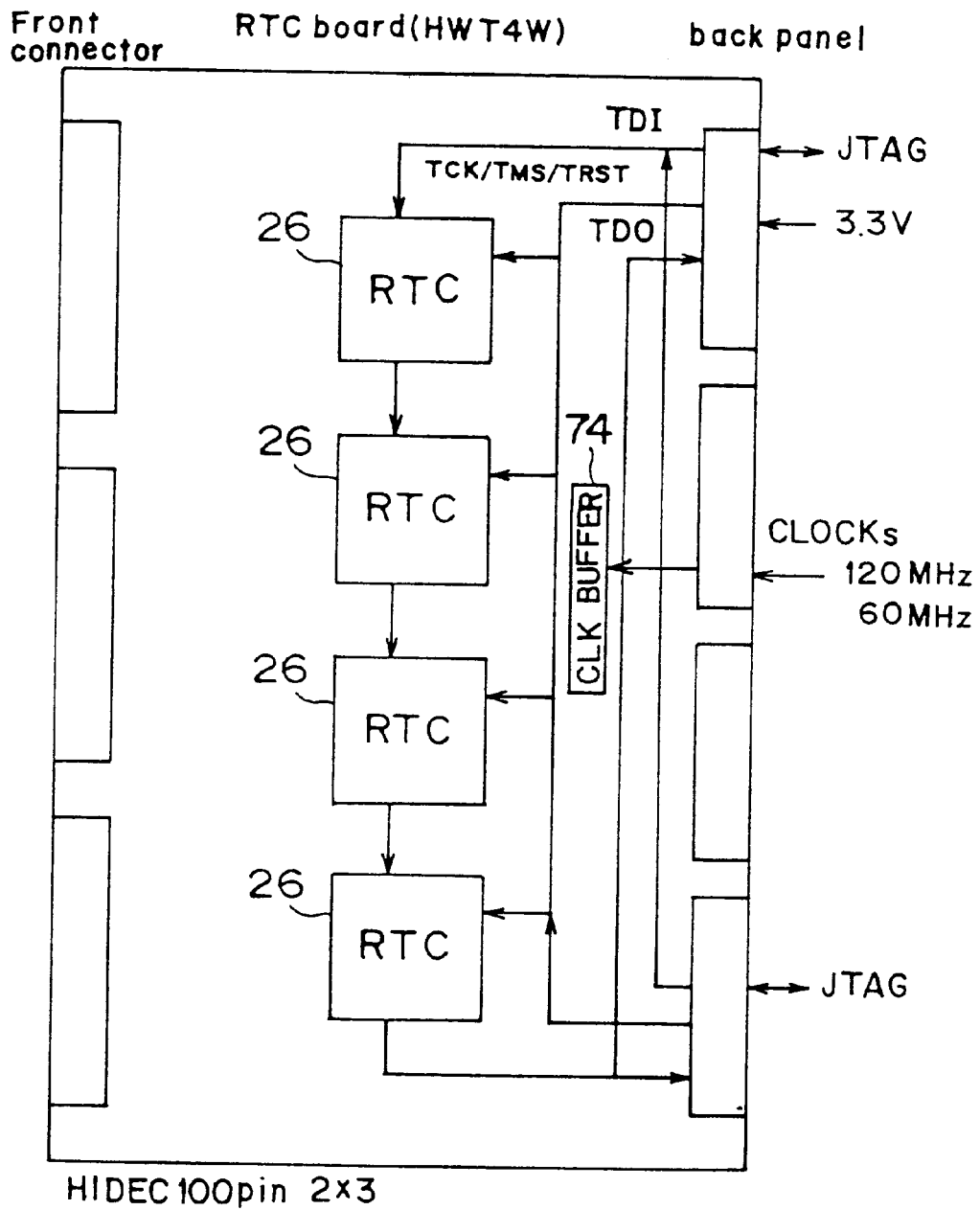
FIG. 14 is a block diagram of an RTC board.

FIG. 14 is a block diagram of an RTC board 44. The RTC board 44 includes clock buffer 74, and four RTCs 26.

The clock buffer 74 operates from a single power supply voltage of 3.3V, and buffers a clock signal issued from the CLOCK board 42 to thereby supply it to each RTC 26. Each RTC 26, which operates from 3.3V of power supply voltage, receives a JTAG signal in LVTTL (Low Voltage Transistor-Transistor Logic), and converts it to a standard TTL signal of 3.3V.

The network cables which connect between RTCs 26 are taken out from the front connector. The front connector includes, for example, two stages of three pieces of HIDEC100PIN.

The back panel is used for inputting clock signals, for inputting/outputting JTAG signals, and inputting power supply voltages.

Next, configurations of the SCAN31 shown in FIG. 10, and the SCANB 32 shown in FIG. 13 will be explained with reference to FIGS. 15 to 29.

Figure 15:
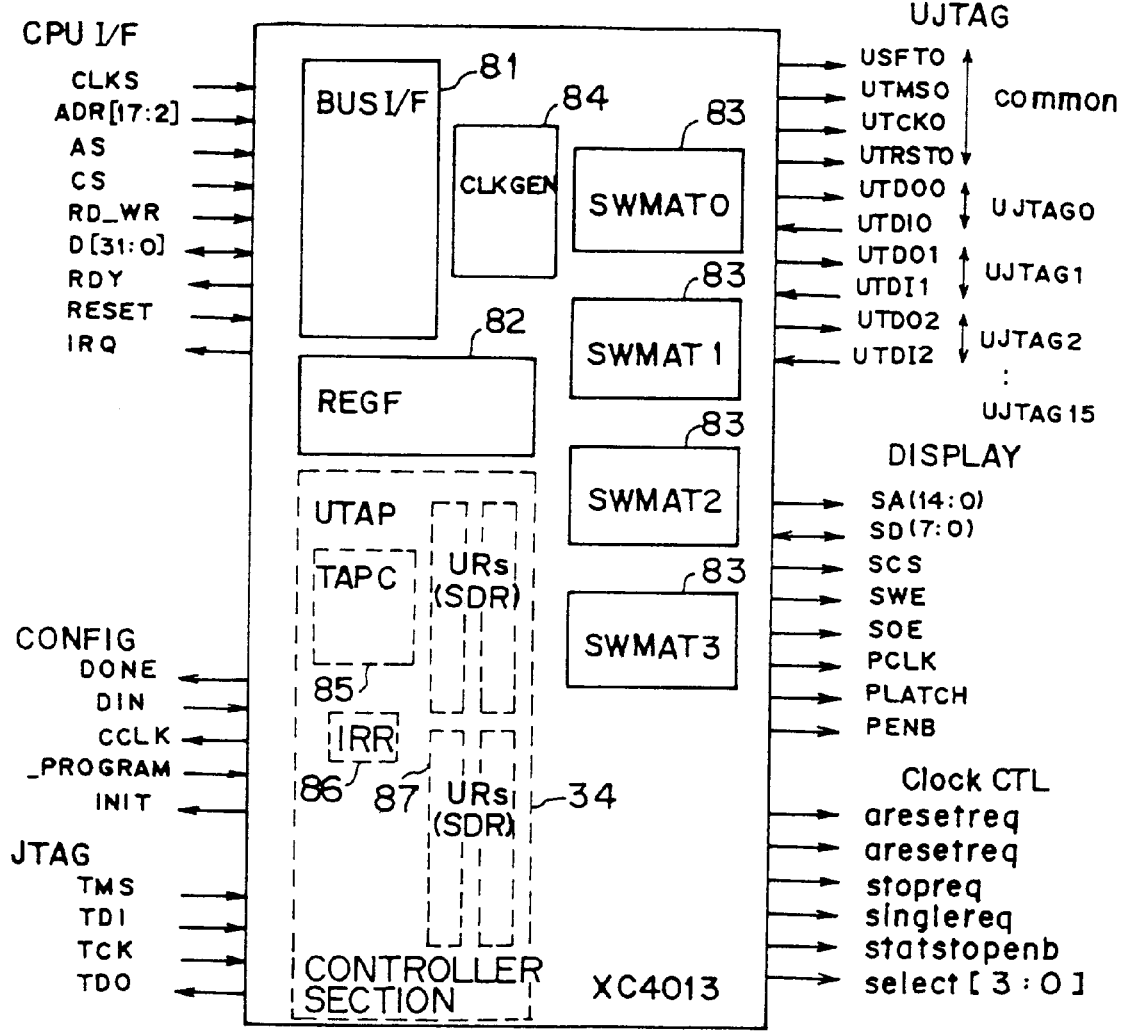
FIG. 15 is a block diagram of a scan engine.

FIG. 15 is a block diagram of the SCANE 31. The SCANE 31 includes an interface section (BUS I/F) 81, a register file section (REGF) 82, a controller section (UTAP) 34 shown in FIG. 7, switching matrixes (SWMAT) 83, and a scan clock generator (CLKGEN) 84. The SCANE 31 is realized by, for example, XC4013, and operates on a maximum of 20 MHz clock signal.

The controller section 34 includes a TAP controller (TAPC) 85, an instruction register (IRR) 86, and user registers (URs) 87. The TAP controller 85 is a finite state machine, which makes a state transition in accordance with signals TMS and TCK, controls SCANE 31 using control data from the register section 82 and IRR 86. The IRR 86 and URs 87 will be described later.

Each switching matrix 83 includes four switches, and the four switching matrixes 83 connect/disconnect a maximum of sixteen SCANBs 32. The operation of the switching matrix 83 is controlled by the data of the CER 35 contained in the register file section 82.

In FIG. 15, UJTAG represents signal lines which connect a SCANE 31 to a SCANB 32. Among these signal lines, USFTO, UTMSO, UTCKO, and UTRSTO represent signals SFT, TMS, TCK, and TRST respectively, and are common to all SCANBs 32.

In addition, UTDOi and UTDIi (i=0, . . . , 15) represent signals TDO and TDI connected to the i-th SCANB 32, and are connected/disconnected by the switching matrix 83. The UJTAGi (i=0, . . . , 15) represents a combination of UTDOi and UTDIi.

DISPLAY represents a signal line used to display an internal state, etc. of each RTC 26 using, for example, an LED (light emitting diode), not shown, provided on the network cabinet 22-i.

FIG. 16 shows registers provided within the register file section 82, IRR 86, and register address map of the URs 87. Provided inside the register section 82 are a clock control register (CLKR), a command/status register (CMDR), the CER shown in FIG. 7, a target register (TGETR), a loop register (LOOPR), a MISC register (miscellaneous register MISCR), and a display control register (DISPR). The scan data register (SDR) corresponds to URs 87 shown in FIG. 15.

An address stored in each register shown in FIG. 16 represents an offset, and thus it is required to add a device address of the SCANE 31 to each address as its base when an address is actually allocated. "R/W" represents that the register is one for which write and read operations are performed, and "RO" represents that a register having the description of "RO" is exclusively for reading therefrom. The data structure of these registers are as shown in FIGS. 17 through 26. The description "res" in FIGS. 17 through 26 represents a reserved bit.

In CLKR shown in FIG. 17, CDIV represents a division number of a frequency for a clock signal TCK, and SSEN, ARES, SRES, STOP, and SGL each represent control data. In addition, CSEL represents data for specifiying a frequency of a clock signal, and corresponds to SEL0, SE11, and SE12 in FIG. 11.

In CMDR shown in FIG. 18, Cmp represents a termination, and Err represents an error-state, Paus represents a pause-state, and Bsy represents an operating state. Once "1" is written in Cmp, the SCANE 31 begins a scan operation.

Additionally, Version represents a version of the SCANE 31, TMS, TRST, TCK, TDO, TDI represent control data for signals TMS, TRST, TCK, TDO, and TDI, respectively. INTE represents interrupt control data, SFT represents a value of the signal ISFT shown in FIG. 4, and CMD represents a control command for the SCANE 31 supplied by the CPU 45. The CMD basically includes the code of one of the six types of command, as shown in FIG. 19.

In FIG. 19, NOP is a command for representing no operation, SETIR is a command for setting IRR 86 data to a register present within a RTC 26. SETDR is a command for setting data of SDR to a particular register within the RTC 26, and BRDDR is a command for setting data of SDR to registers within all RTCs 26. SNSDR is a command for reading data stored in the registers within the RTC 26, and for storing it in the SDR, and MANU is a command for setting the SCANE 31 into a manual mode.

Figure 21:
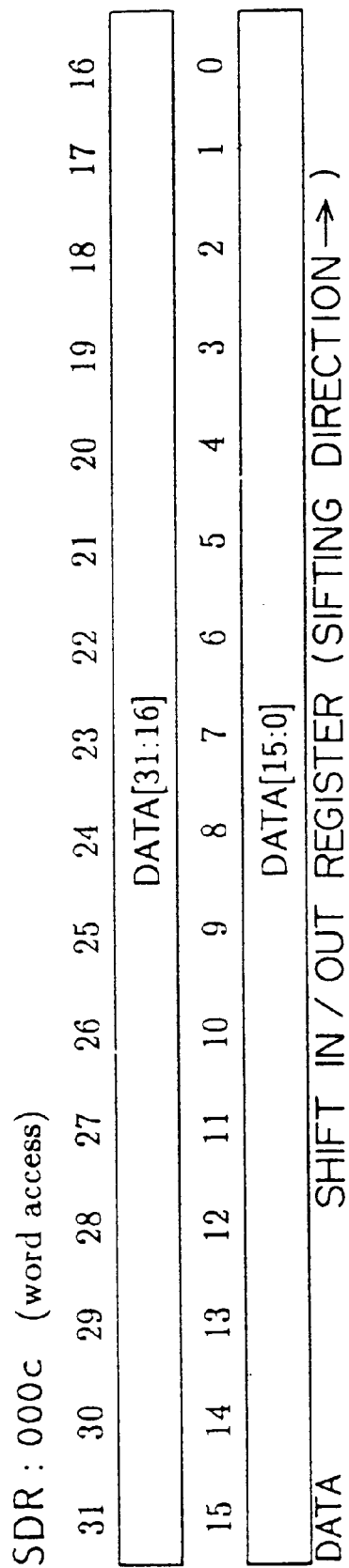
FIG. 21 shows as above a scan data register.

In CER 35 shown in FIG. 20, MASK is control data for connecting cabinet chains. In Fig. 21, DATA in SDR represents data to be shifted. In IRR 86 shown in FIG. 22, IRT represents an instruction (IR command) for a target RTC 26 (designated chip) to be scan-tested, and IRO represents an instruction for the other RTCs 26.

In TGETR shown in FIG. 23, WCHN represents the number of RTCs 26 (RTC chips) connected in a scan loop, and TCHN represents a location of RTC 26 to be scan-tested. In LOOPR shown in FIG. 24, SLOOP represents designation of separation, and LOOP represents the number of bits to be shifted (length of a loop) in a scan loop. In some cases, a value of LOOP is calculated on the basis of a WCHN value.

In MISCR shown in FIG. 25, CSLOOP represents data derived from SLOOP, and TAPST represents a status of the TAP controller 85. The DISPR shown in FIG. 26 is used for indicating a state of the RTC 26 in a network cabinet 22-i using an LED, RUN represents a copy operation using LED display data, ENB represents a display operation using an LED indicator, and PAGE represents a source page of the LED display data.

Figure 27:
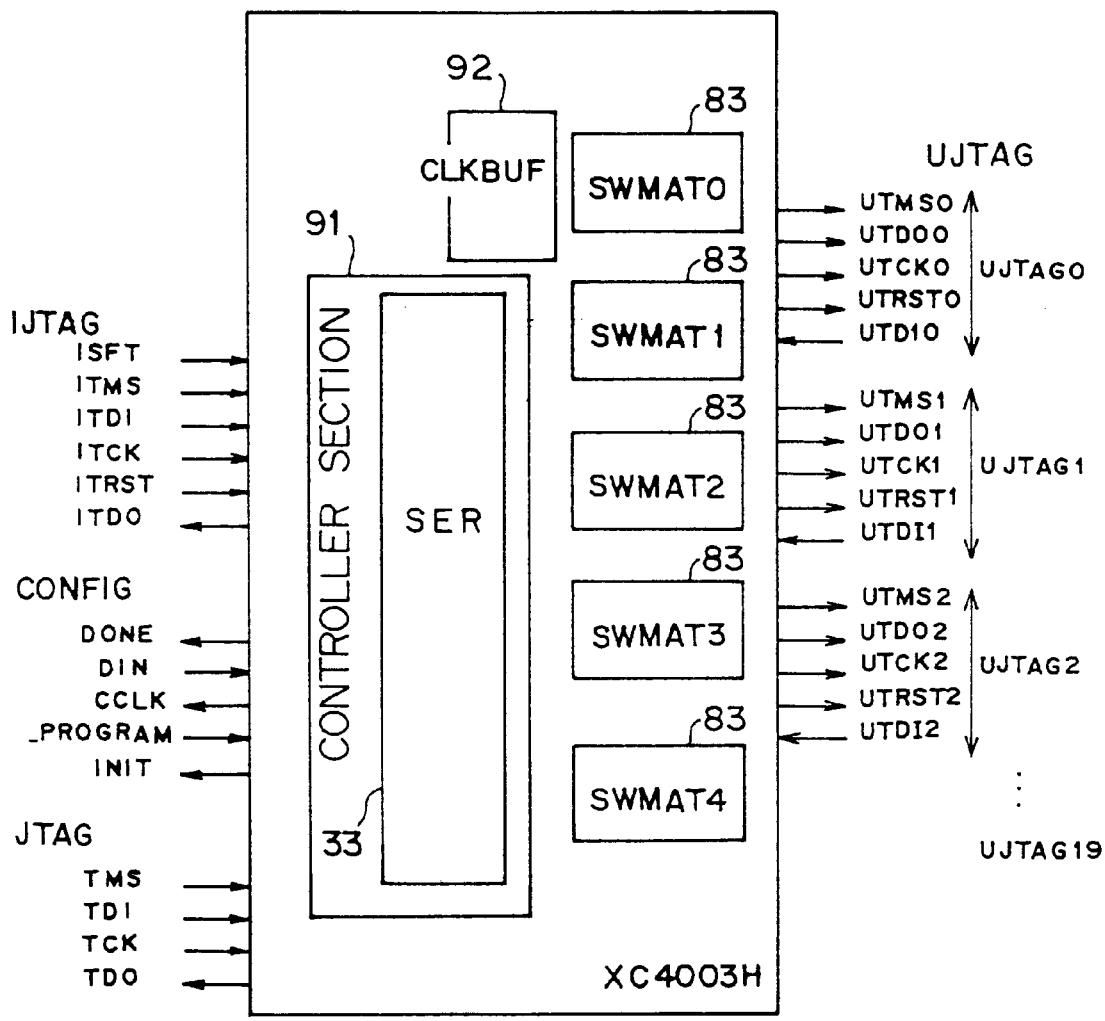
FIG. 27 is a block diagram of a scan buffer.

FIG. 27 is a block diagram of the SCANB 32. The SCANB 32 includes switching matrixes (SWMATs) 83, a controller section 91, and a buffer (CLKBUF) 92 for clock signals for performing scanning. The SCANB 32 is realized by using, for example, XC4003H, and operates according to a scan clock TCK supplied from the SCANE 31.

The controller section 91 includes a SER 33 shown in FIG. 5, and functions as the TAP controller. Five switching matrixes 83 connect/disconnect a maximum of twenty RTC boards 44. The operation of the switching matrixes 83 is controlled by using data loaded into the SER 33.

In FIG. 27, IJTAG represents signal lines connecting between the SCANE 31 and the SCANB 32. Among them, ISFT, ITMS, ITCK, and ITRST each represents signals entered from the SCANE 31, respectively. Additionally, ITDI and ITDO represent signals TDO and TDI connected to the SCANE 31, which are connected to the RTC boards 44 via the switching matrixes 83.

UJTAG represents signal lines connecting between the SCANB 32 and the RTC boards 44. Among them, UTMSi, UTCKi, and UTRSTi (i=0, . . . ,19) represent signals lines TMS, TCK, and TRST, each connected to the i-th RTC board 44.

Further, UTDOi and UTDIi (i=0, . . . , 19) represent signals connected to the i-th RTC board 44, and which are connected/disconnected by the switching matrixes 83. UJATGi represents a combination of UTMSi, UTDOi, UTCKi, UTRSTi, and UTDIi.

FIG. 28 shows the data structure of the SER 33. In FIG. 28, Version represents a version of the SCANB 32, and MASK represents control data for connecting slot chains. The bits 0–19 of MASK are used to connect/disconnect slot chains that corresponds to the 0th–19th RTC board 44.

Figure 29:
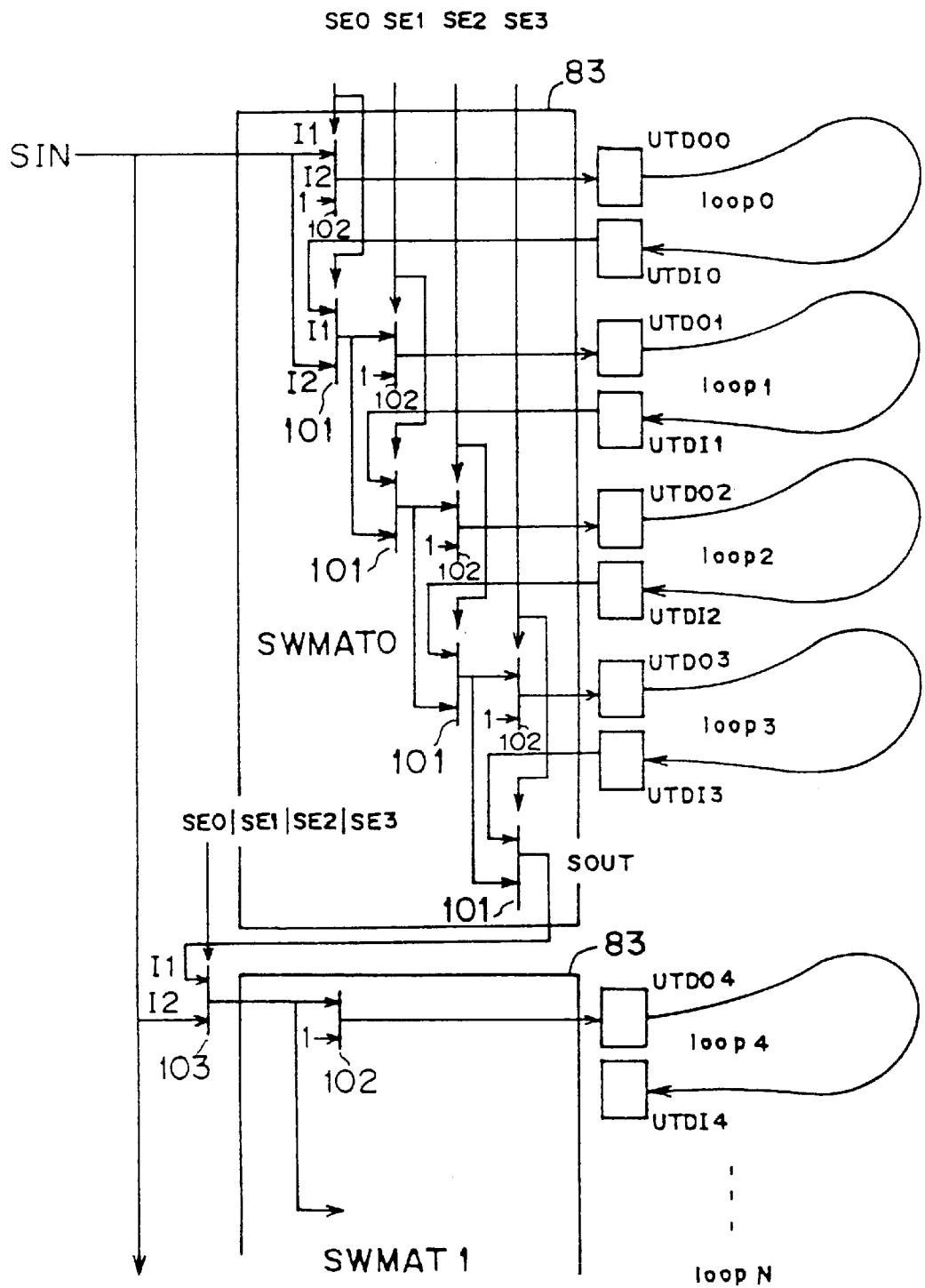
FIG. 29 is a block diagram of a switching matrix.

FIG. 29 is a block diagram of a switching matrix 83 shown in FIGS. 15 and 27. In FIG. 29, SE0, SE1, SE2, and SE3, entered to 0-th switching matrix 83 (SWMAT0), are control signals that correspond to the values of bits 0, 1, 2, and 3 of the CER 35 of the SCANE 31, or the SER 33 of the SCANB 32.

For the other switching matrixes 83 (SWMAT 1, etc.), control signals SE4, SE5, SE6, . . . , not shown, correspond to the values of bits 4, 5, 6, . . . of the CER35 or SER 33. Additionally, SIN and SOUT represent a scan input and a scan output for the switching matrixes 83.

loop0, loop1, . . . , loopN are local loops included in or disconnected from a scan-loop by each control signal SE0, SE1, . . . , SEN, respectively. loopi (i=0, . . . ,N) is generated between output terminal UTDOi and an input terminal UTDIi shown in FIGS. 15 and 27.

In the switching matrixes 83 shown in FIG. 15, these loops correspond to cabinet chains which comprise the SCANB 32 and the RTC board 44, and N=CN holds. Further, in the switching matrix 83 shown in FIG. 27, these loops correspond to slot chains of the RTC boards 44, and N equals the number of the RTC boards 44 within the network cabinet 22-i.

Additionally, selectors 101, 102, and 103 selects and output an input I1, when a control signal is "1", and select and output an input I2 when the control signal is "0". Especially, the selector 102, when the control signal SEi (i=0, ..., N) is "1", outputs an input signal, while it outputs "1" regardless of an input signal, when the control signal SEi is "0".

Outputting a fixed value of "1" by the selector 102 prevents misinput to the LSI connected by the output within loopi. Accordingly, the selector 102, when the control signal SEi is "0", is serving as a protection circuit for preventing an erroneous control to be made to an LSI corresponding thereto.

For example, it is assumed that SE0="1", SE1="0", SE2="0", and SE3="0", and the signal SIN is connected to an input UTDO0 of loop0 via the selector 102. At this time, the output UTDIO of the loop0 is outputted from the selector 101, but is not propagated to loop1, loop2, and loop3, and is outputted as a signal SOUT as it is. Consequently, loop, loop2, and loop3 are removed from the scan-loop.

In addition, provided that SE0="0", SE1="1", SE2="0", and SE3="0", and signal SIN is directly connected to the input UTDI of the loop1, the output UTDI1 of the loop1 is outputted as a signal SOUT. Consequently, loop0, loop2, and loop3 are removed from the scan-loop.

A logical sum of SE0, SE1, SE2, and SE3 is entered to the selector 103 provided on the input side of the next switch matrix 83 (SWMAT1) as a control signal. Consequently, the selector 103 selects SOUT entered from the preceding switching matrix 83 (SWMAT0), when any of SE0, SE1, SE2, and SE3 is "1", while it selects the other input SIN when all control signals are "O". The same operation applies to the other switching matrixes 83 (SWMAT2, etc.).

In other words, the switching matrixes 83 having one or more local loops to be included are incorporated in a scan loop, and a switching matrix 83 having no local loop to be included is removed from the scan loop.

As described above, the loopi that corresponds to SEi=1 is included in a scan loop, and the loopi that does not correspond to SEi=0 is removed from the scan loop. The value of the control signal SEi is controlled by rewriting data MASK of the CER 35 or the SER 33, thereby enabling an arbitrary local loop to be connected to or disconnected from a scan-loop.

Next, operations of the SCANE 31 and the SCANB 32 will be explained with reference to FIGS. 30 through 35.

FIG. 30 shows an example of operations of the SCANE 31 using each of the control commands shown in FIG. 19. In FIG. 30, SETIR sets the instructions IRT and IRO of the IRR 86 shown in FIG. 22 to a register within RTC 26. For example, in the TGETR data shown in FIG. 23, when TCHN=1 and WCHN=4, among four RTCs 26, the instruction IRT is set to a particular RTC 26 at the location corresponding to TCHN=1, and the instruction IRO is set to the other three RTCs 26.

Further, SNSDR reads out data loaded in a register provided within a particular RTC 26, and stores it in SDR shown in FIG. 21. For example, when TCHEN=2, and WCHN=4, data SR is read out from the RTC 26 located at the location that corresponds to TCHN=2 among four RTCs 26, and the other three RTCs 26 are bypassed. In addition, when TCHN=4, and WCHN=4, the scan-operation is repeated four times, data SR0, SR1, SR2, and SR3 of the four RTCs 26 are sequentially read out. At this time, TCHN=4 signifies that all RTCs 26 connected to the scan-loop are to be read out.

Additionally, SNSDR sets data of the SDR to a register provided within a particular RTC 26. For example, when TCHN=2, and WCHN=4, data of the SDR is only set to an RTC 26 located in a location corresponding to TCHN=2, and the other three RTCs 26 are bypassed. When TCHN=4, and WCHN=4, the scan-operation is repeated four times, and data SR0, SR1, SR2, and SR3 of four RTCs 26 are sequentially set.

In addition, BRDDR simultaneously sets data of the SDR to registers provided within all RTCs 26. For example, when TCHN=4, and WCHN=4, data of the SDR is set to four RTCs 26 at the same time as SR.

A scan testing is realized by combining commands shown in FIG. 30 in the following manner. In the description made hereinafter, a parameter subsequent to a command is described in brackets immediately following each command.

(1) Initial Setting : particular registers within all RTCs 26 are initialized using identical data. This operation is realized by the following two commands.
1. SETIR (IRT=SETREG, IRO=SETREG, TCHN=WCHN)
2. BRDDR (SDR=INITDATA, TCHN=WCHN)
  where SETREG is an IR command for setting a particular register within an RTC 26, and INIDATA is random initial data. TCHN=WCHN represents that all RTCs 26 connected to a scan loop are to be initialized.

(2) RTC ID Setting : particular registers within all RTCs 26 are initialized using individual data. This operation is realized by the following two commands.
1. SETIR (IRT=SETREG, IRO=SETREG, TCHN=WCHN)
2. SETDR (SDR=INIDATA×WCHN, TCHN=WCHN)

(3) Release of Errors : A register within a particular RTC 26 is initialized. This initializing operation is realized by the following two commands.
1. SETIR (IRT=SETREG, IRO=BYPASS, TCHEN=RTCNO)
2. SETDR (SDR=INITDATA, TCHN=RTCNO)
  where BYPASS is an IR command for instructing bypassing of a register within the RTC 26, and RTCNO is data for specifying the location of an RTC 26 within a scan loop.

(4) Status Sense : Data are read from particular registers within all RTCs 26. This reading operation is realized by the following two commands.
1. SETIR (IRT=SNSREG, IRO=SNSREG, TCHN=WCHN)
2. SNSDR (TCHN=WCHN), SDR×WCHN
  where SNSREG is an IR command for instructing reading from a particular register within RTC 26.

(5) Debug : Data is read out from a register within a particular RTC 26. This reading operation is realized by the following two commands.
1. SETIR (IRT=SETREG, IRO=BYPASS, TCHN=RTCNO)
2. SNSDR (TCHN=RTCHO), SDR JTAG testing for a parallel computer system as shown in FIG. 2B includes detection of a network size, and connection testing therefor. The size of the network 27 indicates the number of RTCs 26 connected to the network 27. This type of testing is explained below.

FIG. 31 shows an operating flowchart of the SCANE 31 and the CPU 45 in detecting the size of a network 27. In FIG. 31, the CPU 45 first sets a control variable c to "0" (step S1), the SCANE 31 sets the bit c of the CER 35 corresponding to the c-th network cabinet 22-c to "1" (step S2). Whereby, the SCANB 32 connected to UJTAG0 shown in FIG. 15 is included in a scan-loop.

Next, the CPU 45 sets control variable s to 0 (step S3), and the SCANE 31 sets the bit of the SER 33 corresponding to the s-th slot to "1"in the SCANB 32 provided within a network cabinet 22-c (step S4). This setting is made by writing "1" in SFT of CMDR shown in FIG. 18, and by shifting "1" to the bit s of the SER 33 by the SCANE 31. This causes an RTC board 44 connected to the UJTAG0 shown in FIG. 27 to be included in a scan loop.

Next, the SCANE 31, after performing a scan operation, reads out version data of four RTCs 26 from the RTC board 44 at the s-th slot of the network cabinet 22-c (step S5). The version data is stored in a register provided within the RTC 26. This data can be read out and stored in the SDR shown in FIG. 21 by issuing a corresponding IR command to the RTC 26.

Subsequently, the CPU 45 determines whether or not the version data was able to be obtained by referring to the contents of the SDR (step S6). When it is obtained, the CPU determines that the corresponding RTC board exists, and increments the counter of the RTC 26 by four (step S7). The counter is originally set to "0" in the initial stage of the operation. When the version data is not obtained, the CPU 45 determines that the corresponding RTC board 44 does not exist, and the counter is not incremented.

Next, the CPU 45 determines whether or not the variable s reaches the final slot number SN (step S8). When s does not reach SN, s=s+1 is set (step S9), and the operations in step S4 and after are repeated. This detemines whether or not an RTC board 44 exists for each slot of all the network cabinets 22-c.

When the variable s reaches SN, the CPU 45 next determines whether or not the variable c reaches the number CN of the final network cabinet 22-CN (step S10). When c does not reach CN, c=c+1 is set (step S11), and the operations in step S2 and after are repeated until c equals CN. Whereby it is determined whether or not an RTC board 44 exists for each slot in all the network cabinets 22-i, and the total number of the RTC 26 is obtained.

When the variable c equals CN, the SCANE 31 next sets each corresponding bit of the SER35 and the SER 33 to "1" for all network cabinets and slots having an RTC board 44, and sets the other bits to "0", terminating the operation. This allows all RTC boards 44 incorporated in a parallel computer to be included in a scan loop.

Figure 32:
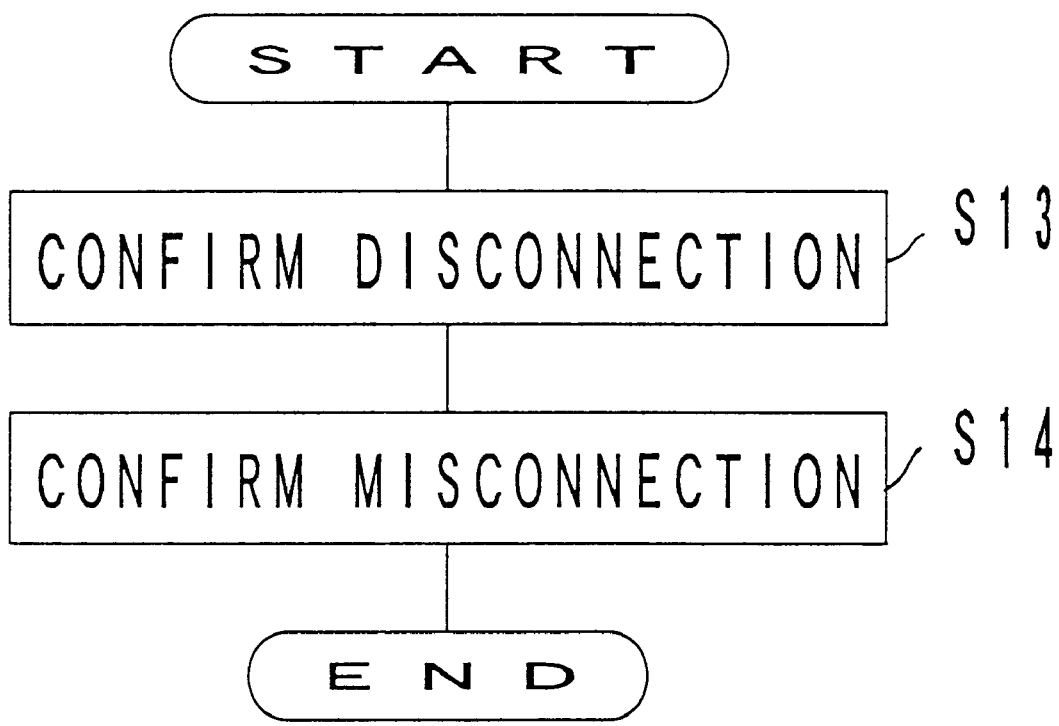
FIG. 32 is a flowchart of an operation of a connection test.

FIG. 32 shows a flowchart of the operations of the SCANE 31 and the CPU 45 in connection test after the formation of a scan loop. An output port of a certain RTC 26 is connected to an input port of its own or another RTC 26. The connection test checks connections between the output port and the input port.

This connection testing is made based on the network connection relation table determined by the network size, while manipulating input/output ports of an RTC 26. This type of testing method is called Boundary-Scan, and a set of input/output ports to be tested is called a Boundary-Scan Flip-Flop (BSFF).

In FIG. 32, the SCANE 31 and the CPU 45 confirm whether or not there are any disconnected RTC 26 (step S13), confirm whether or not there is a misconnection between RTCs 26 (step S14), and terminates the operation. The flowchart of the confirmation operation in step S13 is as shown in FIG. 33, and a flowchart of the confirmation operation in step S14 is as shown in FIG. 34.

Figure 33:
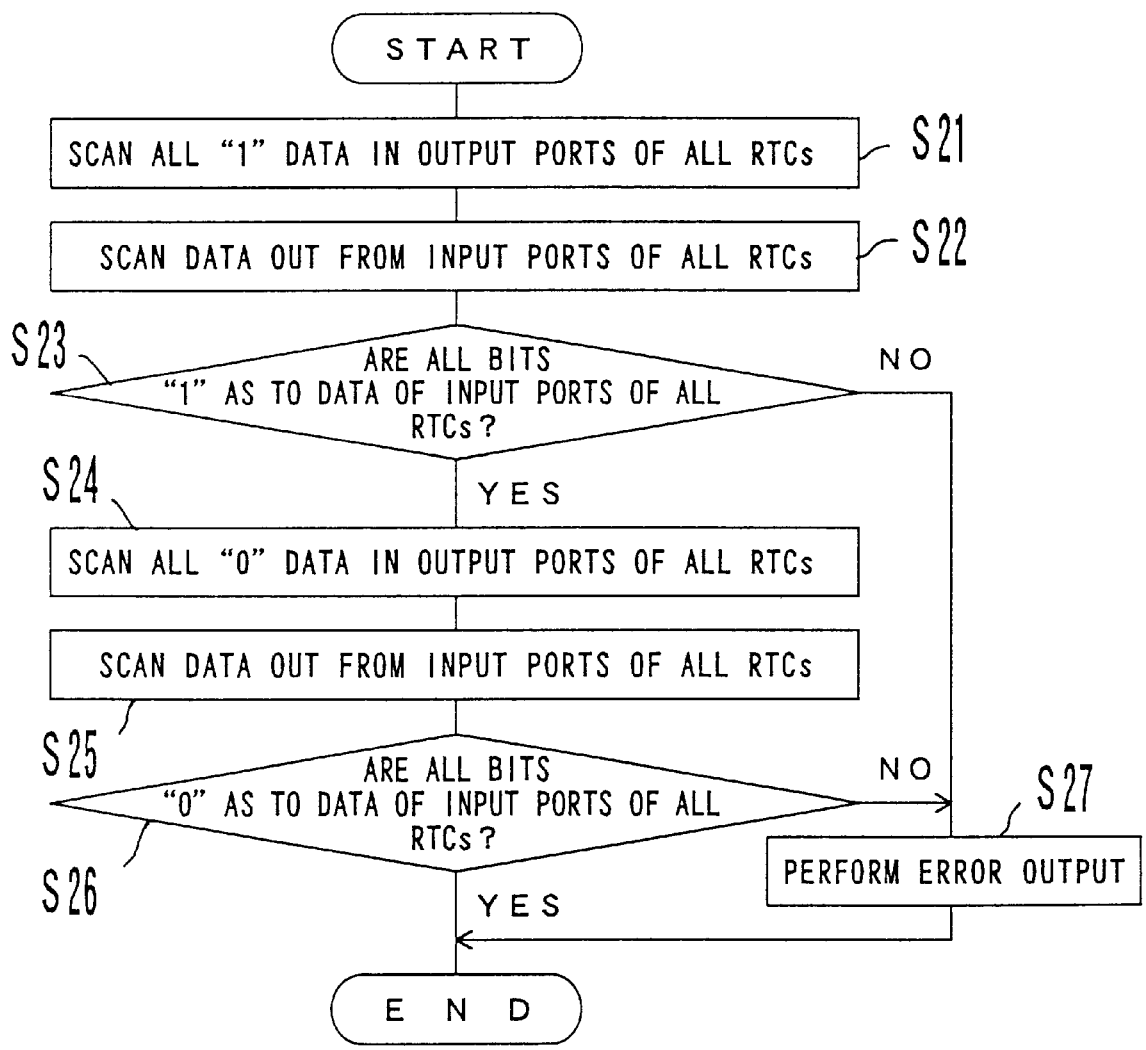
FIG. 33 is a flowchart of an operation of confirmation of disconnection.
Figure 34:
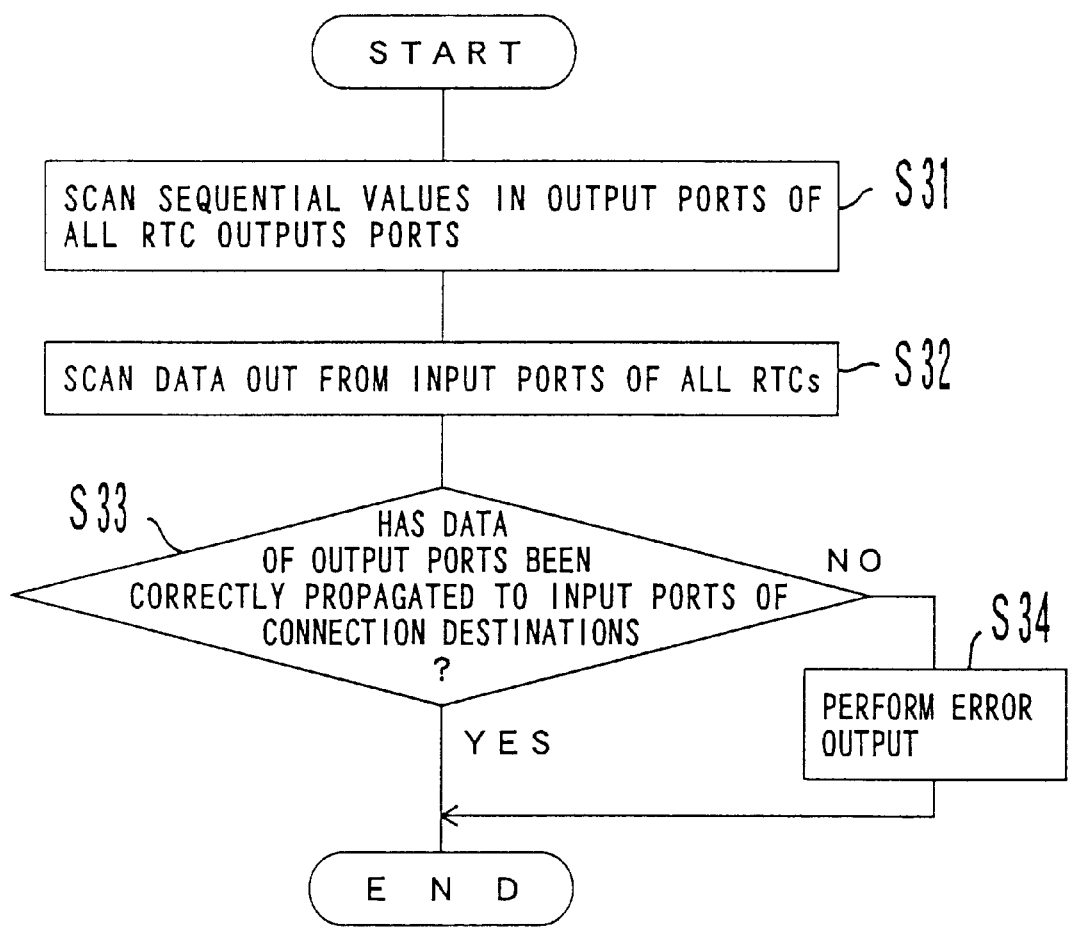
FIG. 34 is a flowchart of an operation of confirmation of unconnected RTCs.

In FIG. 33, the SCANE 31 scans data all bits of which are "0" into buffers at output ports of all RTCs 26 (step S21), and scans out data from the buffers connected to the input ports of all RTCs 26 (step S22). All of the resultant scanned out data is stored in the SDR.

Next, the CPU 45 determines whether or not all bits of data scanned out from the input ports are "1" for all RTCs 26 by referencing the contents of the SDR (step S23). When any one of the bits is "0", it outputs error information by determining that a disconnected RTC 26 exists (step S27), followed by terminating the operation.

When all bits are "1", SCANE 31 scans data all bits of which are "0" into the buffers at the output ports of all RTCs 26 (step S24), and scans out data from the buffers at the input ports of all RTCs 26 (step S25).

Next, the CPU 45 determines whether or not all bits of data scanned out from the input ports of all RTCs 26 are "0" (step S26). And, if any of all bits is "1", the CPU 45 outputs an error signal (step S27) by determining that a disconnected RTC 26 exists, followed by terminating the operation.

When all bits are "0", the CPU determines that no disconnected RTC 26 exists, and then terminates the disconnection confirmation operation, subsequently starting a misconnection confirmation operation as shown in FIG. 34.

In FIG. 34, the SCANE 31 inputs data which sequentially changes in the order of 0, 1, 2, 3, . . . to the buffers of the output ports of all RTCs 26 (step S31). A SAMPLE/PRELOAD instruction is used for inputting this data.

Next, the SCANE 31 reads out data from the buffers of the input ports of all RTCs 26 by performing a scanning operation (step S32). An EXTEST instruction is used for reading out the data.

Next, the CPU 45 checks whether or not data of output ports of all RTCs 26 has correctly been propagated to each corresponding connection destination by referring to the network connection relation table (step S33). The network connection relation table is stored in, for example, a RAM 59 shown in FIG. 10, and all connection relations between output ports and input ports are stored.

If data in a certain output port does not accord with data in a input port, the CPU 45 determines that a misconnection exists between the ports, an then issues an error signal (step S34), followed by terminating the operation. And, if data accord with each other for all corresponding ports, the CPU 45 determines that connection is correctly made, followed by terminating the program.

Use of the SCANE 31 and the SCANB 32 also allows setting or monitoring the operations of an RTC 26 to be performed, in addition to the network size detection and the connection testing described above. Now, the setting or monitoring of an operation of an RTC 26 will be explained.

Setting of the operations of an RTC 26 is made by setting instruction registers provided within the RTC 26 using the command STIR described above. As arguments of STIR, IRT, IRO, WCHN, TCHN and LOOP described above are used. The operations of the CPU 45 and the SCANE 31 are as follows.

(a) The CPU 45 waits until the execution of the previous command is terminated.

(b) The CPU 45 sets the IRT and the IRO in the IRR 86 of the SCANE 31.

(c) The CPU 45 sets WCHN and TCHN in TGETR of the SCANE 31.

(d) The CPU 45 sets LOOP in LOOPR of the SCANE 31.

(e) The CPU 45 sets a code "0001" for SETIR in the lower four bits of CMDR.

(f) The CPU 45 sets "1" in Cmp of bit 31 of the CMDR to start and reset scanning. Whereby the SCANE 31 shifts IRT/IRO by the number of bits specified by the LOOP within a scan loop, an sets "0" in Cmp of the CMDR after completing the shift.

(g) The CPU 45 waits until Cmp of the CMDR reaches "0"

(h) The CPU 45 makes an error check.

Thus, the command SETIR is executed by the SCANE 31 to thereby set an instruction IRT in the instruction register of the RTC 26 specified by TCHN, and set an instruction IRO in the instruction register of another RTC 26. Each RTC 26 then executes an instruction specified. Further, the use of SETDR also enables setting of data in a data register of the RTC 26.

In addition, the operation monitor of an RTC 26 signifies the monitoring of a status of a parallel computer system by periodically reading out data from a register within the RTC 26. For example, when a register RTCLED which represents a communication state of an RTC 26 is monitored, the CPU 45 and the SCANE 31 operate as follows.

(a) The CPU 45 issues an command SETIR by setting IRT=IR_LED, IRO=BYPASS, WCHN=TCHN=the total number of RTCs, and LOOP=8 * WCHN in the same manner as for the setting of the operation. IR_LED is a command for instructing reading out of the contents of a register RTCLED within RTC 26. Execution of this SETIR sets IR_LED in the instruction registers of all RTCs 26, and data loaded in RTCLED is placed in a state in which it can be read out.

(b) The CPU 45 waits for the termination of SETIR.

(c) The CPU 45 sets data INITDATA TO SDR of the SCANE 31. Existence of the same data in the SDR on completing the scanning operation indicates confirmation of a normal termination of the scan operation.

(d) The CPU 45 sets WCHN=TCHN=the total number of RTCs 26 to TGETR in SCANE 31.

(e) The CPU 45 sets LOOP=* (WCHN+1) to LOOPR of the SCANE 31.

(f) The CPU 45 sets the code "0111" for SNSDR to the lower four bits of the CMDR in the SCANE 31.

(g) The CPU 45 sets "1" to Cmp of the CMDR to thereby reset and start a scan operation.

(h) The SCANE 31 flags "1" on Paus bit 29 of the CMDR to be in a pause state, whenever reading out RTCLED data from one RTC 26.

(i) The SCANE 31 reads out the contents of the SDR to display on an LED provided on the network cabinet 22-i.

(j) The operations described in (h), and (i) are repeated until Cmp of CMDR becomes 0.

(k) The CPU 45 makes an error check by confirming whether or not the contents of the SDR readout last are the same as the initial data originally set.

The parallel execution of monitoring a communication state as described above and a system control, enables continued datermination of the communication state of the RTC 26, even during the executing of a parallel computer system. In addition, the setting of another IR command to the IRT also enables reading not only data representing a communication state, but also data in a register indicating another arbitrary internal state. Each register to be monitored is allocated to a particular command to read out the data loaded therein.

The JTAG scan control method used for the setting and the monitoring of the operation as described above will be further described with reference to FIG. 35. FIG. 35 illustrates an example of a JTAG scan loop configured by the SCANE 31, the SCANB 32, and RTCs 26. Note that SCANB 32 is omitted from this figure.

In FIG. 35, each RTC 26 includes an instruction register (IR) 111 for storing an instruction, a data register for string data (DR) 112, a bypass register (Bypass) 113, and a TAP controller (TAPC) 114.

The SCANE 31 simultaneously controls the TAP controllers of all RTCs 26 present in a scan loop with a signal TMS.

The TAP controller 114 is a finite state machine which changes state thereof by using the TMS signal.

It is determined depending upon the state of the TAP controller 114 which of either a scan chain comprising instruction registers 111 or a scan chain comprising data registers 112 within the RTCs 26 is shifted. Since each RTC 26 is simultaneously controlled, all the RTCs 26 are placed in a state (shift-ir) where an instruction register is shifted, or in a state (shift-dr) where a data register is shifted.

The operations of the instruction register and the data register will be explained hereinafter.

(a) The SCANE 31 sets the TAP controller 114 to a state shift-ir by using a TMS signal.

(b) The SCANE 31 executes STIR to shift an instruction register 111 of each RTC 26. At this point, data of IRR 86 is selected and outputted from TDO in such a manner that IRT is set to the target RTC 26, and IRO is set to the other RTCs 26. This can set a particular value to an instruction register of the RTC 26 to be tested.

For example, when the RTC 26 to be tested is an RTC 26 positioned at location 1, which is the second RTC 26 from the right side, when shifted a second time, a value of IRT has to be outputted from the IRR 86. Thus, by setting WCHN=4, and TCHN=1, IRT is selected at the second shift, and IRO is selected at the other shifts.

Shifting instruction registers 111 allows IRT=SELECT-DR and IRO=BYPASS to be set to the target RTC 26 and the other RTCs 26, respectively. SELECT-DR is an IR command for designating a data register 112, and BYPASS is an IR command for designating a bypass register 113 comprising one bit. Once BYPASS is set, all bits in the instruction register 111 becomes "1".

(c) The SCANE 31 executes SETDR after setting SELECT-DR to the target RTC 26 in (b), and further setting BYPASS to the other RTCs 26. Whereby only a value of the data register 112 of the target RTC 26 is shifted, and its value is newly set. The value for the setting is outputted from the SDR in the SCANE 31.

Additionally, the operation in the case where a communication state stored in a register RTCLED, not shown, within each RTC 26, is monitored using a scan loop shown in FIG. 35 is explained next. The same applies to the case where an internal state is monitored.

(a) The CPU 45 sets IRO and IRT to the IRR 86 of the SCANE 31. IR_LED is set to IRT, and BYPASS is set to IRO. In addition, TCHN=WCHN=4 is set to TGETR of the SCANE 31.

(b) Next, the CPU 45 sets SETIR to the lower four bits of the CMDR to start scanning. At this point, the TAP controller 114 is set to the state shift-ir. Now, since TCHN=WCHN applies, only the IRT of the IRR 86 is used. Accordingly, IR_LED is written in the instruction registers 111 of all RTCs 26, regardless of the data of IRO.

(c) Once IR_LED is set to the instruction register 111, each RTC 26 reads out the communication state stored in RTCLED, not shown, in accordance with the command IR_LED, and writes it in the data register 112.

(d) The CPU 45 sets INITDATA to SDR of the SCANE 31 and sets SNSDR to the lower four bits of CMDR to thereby start scanning. Whereby the TAP controller 114 is set to a state shift_dv.

(e) Through the first scanning operation by the SCANE 31, data shifts by thirty-two bits in the direction shown by the arrows, thereby causing the contents of the data register 112 in the RTC 26 at location 0 in the right end to shift in the SDR.

At this point, simultaneously therewith, the contents of the SDR enter the data register 112 of the RTC 26 at the location 3, the contents of the data register 112 of the RTC 26 at a location 2 enter a data register 112 of the RTC 26 at a location 1, and the contents of the data register 112 of the RTC 26 at a location 1 enter a register 112 of the RTC 26 at a location 0.

(f) The SCANE 31 reads out the contents of the SDR and displays it on an LED provided in the network cabinet 22-i.

(g) The SCANE 31 further repeats the operations described in (e) and (f), and LED-displays the data whenever it shifts by thirty-two bits. Whereby data goes round all of the RTCs 26 in a scan loop at one time, and all communication states of an RTC 26 are sequentially displayed.

(h) The CPU 45 compares the contents of the SDR with INITDATA originally set. When the resultant comparison indicates equality, the CPU 45 determines that the resultant error check is acceptable, then terminating the operation.

As described above, the SCANE 31 embodying the present invention can be used, not only for inspection purpose with a scan engine, but also for monitoring the contents of registers within RTCs 26 actually in use. This enables obtaining performance information of an RTC 26 in use. In addition, by monitoring an RTC 26 in operation, the debugging thereof is facilitated.

In the present embodiment, reading out of data stored in registers is done by using the hierarchical structures of the SCANE 31 and the SCAB32. Thus, even when the number of RTCs 26 becomes large, the amount of wiring is not required to be increased so much. Accordingly, even reading out data from a large-scale configuration network like a super parallel computer system does not cost so much.

In addition, normally, the larger the scale of a network becomes, the longer the time required for reading out of data by the scan engine becomes. This leads to difficulties in collecting data while the system is in operation. However, according to the present invention, by dynamically and hierarchically changing connections, the range from which data is read out can be limited, and high-speed readout is enabled within this range.

Next, scan subcommands used on the workstation 46 shown in FIG. 9, and functions used therein will be explained with reference to FIGS. 36 through 57.

FIG. 36 shows an command interface of scan subcommands relating to the scan control. These scan subcommands are preprogrammed in the form of functions written in the C language.

In FIG. 36, set_ir is a subcommand for setting an instruction register 111 of an RTC 26, set_dr is a subcommand for individually setting data registers 112 of each RTC 26, and set_brddr is a subcommand for simultaneously setting all data registers 112.

In addition, sense_dr is a subcommand for reading out the contents of the data register 112, set_cm is a subcommand for setting the data MASK of the CER 35, and set_sm is a subcommand for setting the data MASK of the SER 33.

Further, get_rtc_version is a subcommand for reading out version data from an internal register of an RTC 26, and get_rtc_status is a subcommand for reading out status data from an internal register of an RTC 26.

Moreover, get_rtc_number is a subcommand for obtaining the number of RTCs 26 (network size) present in a network 27 (T-net), set_tnet_id is a subcommand for setting an ID of the network 27, and check_tnet_connection is a subcommand for making a connection test for the network 27.

Further, shift_dr, like set_dr, is a subcommand for setting a data register 112 used for shifting variable length data. By contrast, set_dr is used for shifting fixed length data.

Set_ir, set_dr, set_brddr, and sense_dr, each includes an instruction for setting SETIR, SETDR, BRDDR, and SNSDR to CMD of CMDR shown in FIG. 18. In addition, get_rtc_version, get_rtc_status, get_rtc_number, set_tnet_id, and check_tnet_connection, are all realized by combining a plurality of subcommands.

Additionally, among the parameters shown in FIG. 36, irt, iro, wchn, tchn, loop, and data represent the same data as IRT, IRO, WCHN, TCHN, LOOP, and DATA as described above. Furthermore, CMask and SMask represent data MASK for the CER 35 and the SER 33, respectively, and 1s represents an ID for a network 27.

Once these subcommands are entered from a workstation 46 to the clock board 42, the CPU 45 sets data of a register file section 82 within the SCANE 31 in accordance with the description made thereon. Then, the SCANE 31 performs an operation that corresponds to a command set to CMD of CMDR. Whereby, detection of a network size, a connection test for a network 27, and setting of an operation of the RTC 26, and control of monitoring, etc. can be realized.

The CPU 45 returns replies to each of these commands in the form of ["ok"+reply character string] or ["ng"+error code character string]. However, subcommands cannot be overlapped.

FIG. 37 shows an example of a set_ir program, FIG. 38 shows an example of a set_dr program, FIG. 39 shows an example of a set_brddr program, FIGS. 40 and 41 show an example of a sense_dr program, FIG. 42 shows an example of a set_cm program, and FIG. 43 shows an example of a set_sm program.

In addition, FIG. 44 shows an example of a get_rtc_version program, FIG. 45 shows an example of a get_rtc_status program, and FIG. 46 shows an example of a get_rtc_number program.

Further, FIG. 47 shows an example of a check_tnet_connection program, FIG. 48 shows an example of set_tnet_id program, and FIGS. 49 and 50 show an example of shift_dr program. These programs are described on the assumption that the concept of an operation can be understood by referencing them.

For example, in the set_ir program shown in FIG. 37, the range of /* */ represents a comments statement, and each parameter is defined on the line 4. Additionally, SE_CMDR on the line 8 represents the content of the CMDR of the SCANE 31, SE_CMDR_CMP represents data Cmp of CMDR, and SE_IO represents a write operation. Accordingly, the line 8 represents an instruction to wait as a whole, unless Cmp of CMDR is written therein.

Furthermore, SE_IO (SE_IRR) on the line 13 represents that each value of IRT and IRO of IRR 86 are set thereto. SE_CMDR_CMD_SETIR on line 20 represents that a command code of SETIR is set to CMD. On line 21, SETIR is executed, and IRT or IRO is scanned in an instruction register 111 of the RTC 26 by performing a scan operation.

In addition, lines 28–33 represent that an error message in the form of ["ng"+an error code character string] is outputted when Err of the CMDR is "1", and a reply in the form of ["ok"+a reply character string] is outputted when Err of the CMDR is "0".

Also with respect to the other programs shown in FIG. 38–50, the operation of the SCANE 31 is controlled in a similar manner by rewriting the register file section 82 of the SCANE 31. In the program of get_rtc_version shown in FIG. 44, for example, the line 18 includes set_ir, and the line 19 includes sense_dr. It is also recognized that some of subcommands are included in the programs shown in FIG. 45–48.

Next, functions used in this program excluding subcommands are explained.

First, for example, shift_right (char *org, char *new, int shift) is a function for shifting a character string "org" (hexadecimal code) in the direction from the msb (most significant bit) to the lsb (least significant bit) by the number of "shift" times, and then storing the results obtained by shifting in the character string "new".

Figure 51:
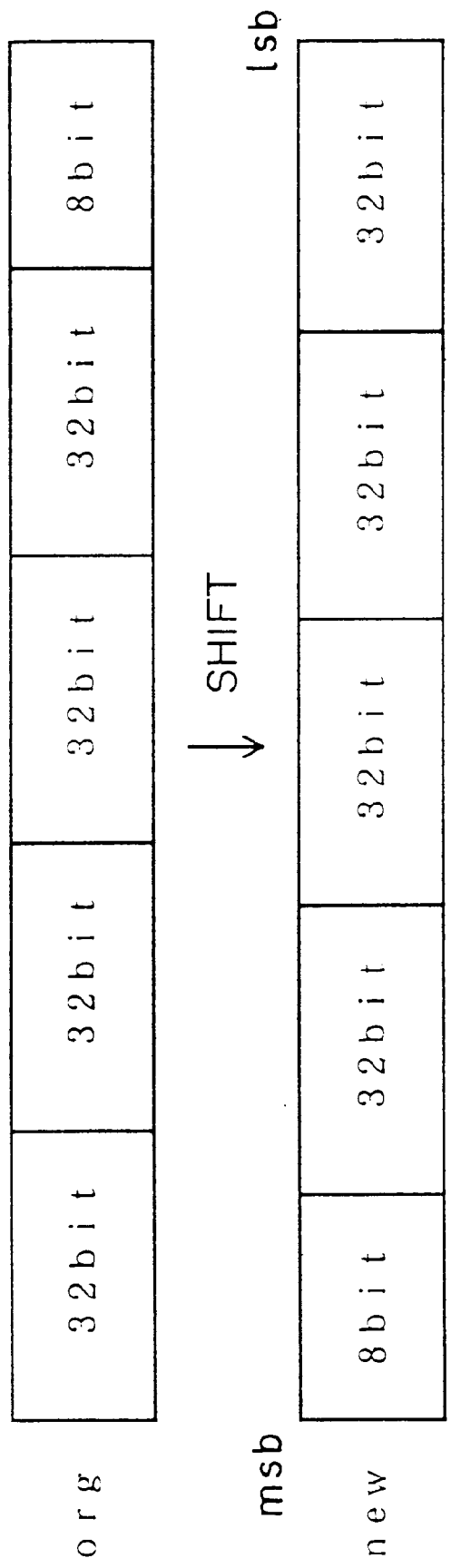
FIG. 51 shows a shift operation of a character string.

This function is an internal function of the function shift_dr to shift variable length data, and to shift data on a thirty-two bits unit basis from the lsb direction, data of character string "org" is right-justified as shown in FIG. 51. For example, it is used like shift_right ("0123", "0091", 1).

In addition, for example, htoi (char *data, int adjust, int val) used in the line 50 shown in FIG. 50 is a function to convert lower bits of the number of "adjust" in a character string data (hexadecimal code), and to mask upper bits with data of "val".

Figure 52:
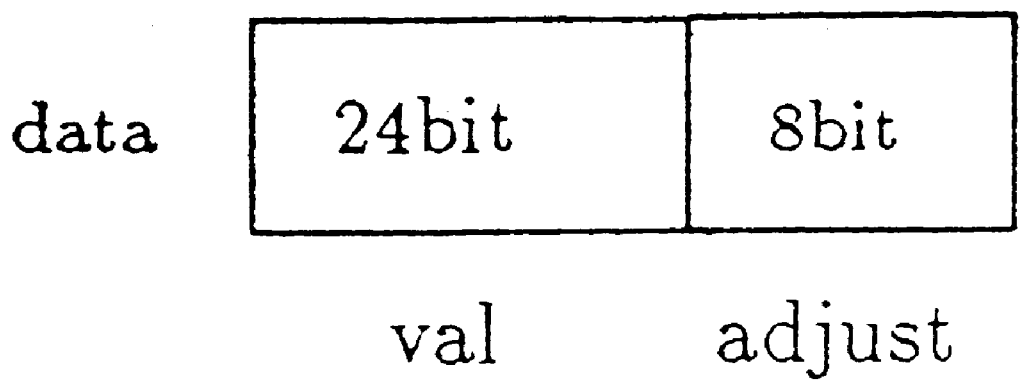
FIG. 52 shows a mask operation of data.

This function is also an internal function of shift_dr, and masks upper bits of a last data (left end) within the right-justified data by shift_right as shown in FIG. 52. For Example, it is used as htoi ("1234", 10, 0xf500)==0xf634.

Additionally, for example, with regard to a function toi (char *s) x=toi (s) used in the line 14 shown in FIG. 44, for a header character string which begins with the characters "0x", it is treated as a hexadecimal code, while for other cases, it is treated as a decimal code. This function can be written as follows: if (sscanf (s, "0x%x", &x)!=1) sscanf (s, "% d", &x).

In addition, for example, toa (int i) used on the line 18 shown in FIG. 44 is a function to convert an integer i to a character string.

Further, for example, set_allf (char *data, int size) is a function to assign data "1" to all ports in a T-net, and, for example, set_all0 (char *data, int size) used in the line 24 shown in FIG. 47 is a function to assign 0 to all ports of a T-net.

A port in a T-net is defined by a function rtc_bsf conceptionally shown in FIG. 53. In FIG. 53, wi, ni, ei, and si represent input ports of RTC 26, and wo, no, eo, and so represent output ports.

Moreover, for example, set_seq (char*data, int size) used in the line 29 shown in FIG. 47 is a function to assign a sequential number to ports in a T-net. For example, a sequential number is assigned to each port of wo, no, eo, and so.

Further, for example, check_connect (char *data1, char *data2) is a function to confirm whether or not a connection relation matches between ports by comparing data1 and data2 based on a database tnet_connect_list (network connection relation table) containing a connection relation of a T-net. "data1" represents data scanned-in output ports of the RTC 26, and "data2" represents data scanned-out from the input ports of the RTC 26. The connection relation is determined according to the number of RTCs 26 and a size of port configuration.

Figure 54:
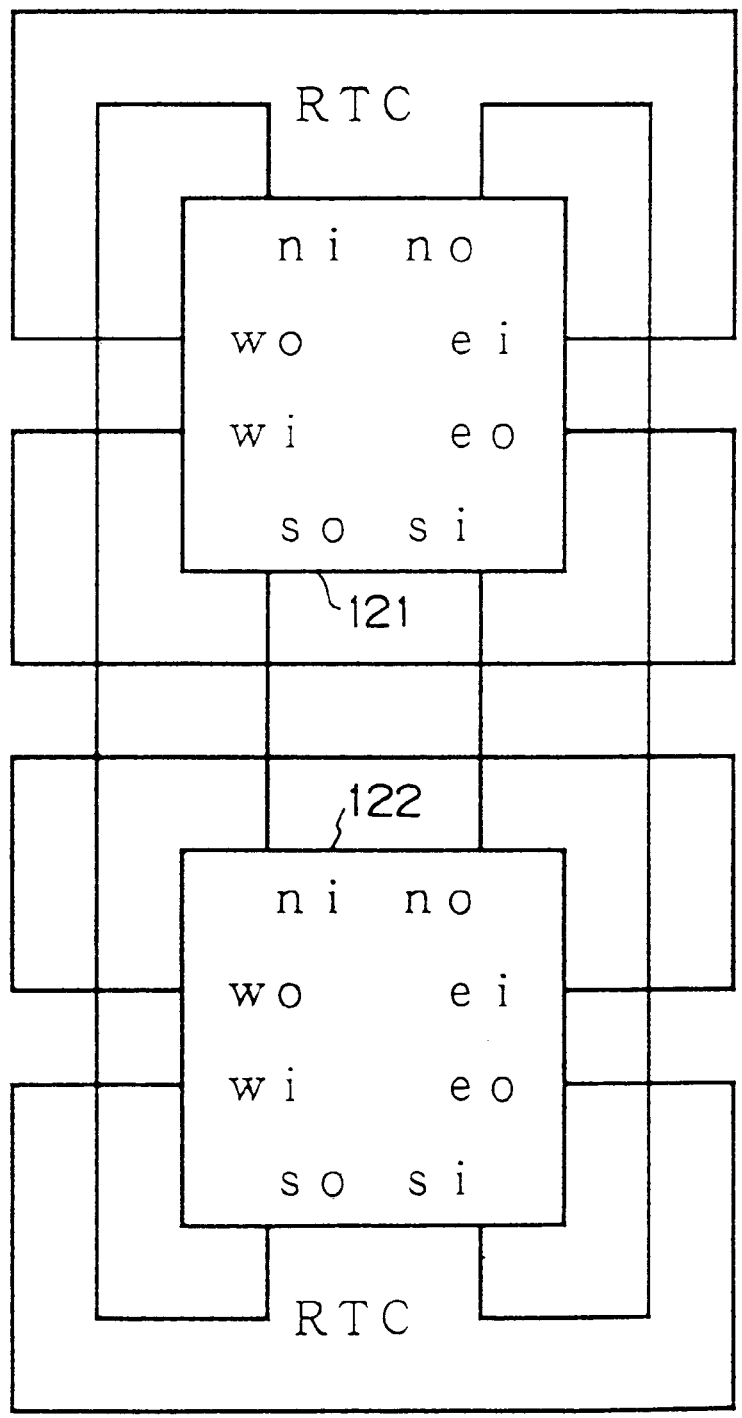
FIG. 54 exemplifies a connection of RTCs.

For simplicity, it is assumed that the port size is eight bits, and each port of RTC 121 and RTC 122, is connected as shown in FIG. 54, and the connection relation is stored in the tnet_connect_list.

At this point, as shown in FIG. 54, ports wo and ei of RTC 121 are connected to each other. Thus, shifting data 00 to the port wo causes the data 00 to be shifted out of the port ei. Likewise, since a port no of the RTC 121 is connected to a port si of the RTC 122, shifting data 01 to the port no of the RTC 121 causes the data 01 to be shifted out of the port si of the RTC 122.

By thus doing, when sequential data 00, 01, 02, 03, 04, 05, 06, and 07 are shifted to output ports of RTC 122 wo, no, eo, and so, the relation between "data1", and "data2" is as shown in FIG. 55. In FIG. 55, "xx" and "-" represent "don't care".

It will be apparent from FIG. 55 that data shifted to each port will appear at a input port connected thereto. When the correspondence between data of input and output ports does not coincide with the connection relation shown in FIG. 54, it is determined that a misconnection exists. The check_connect outputs "1" for a correct connection relation, and outputs "0" for an incorrect connection relation.

Furthermore, set_tnetid (char *data, int size) is a function to store an ID of the T-net in data in the form of a string. "size" represents a data size. The ID of the T-net is obtained from the database array tnet_id_table and the number rtc_count of RTCs 26. For example, an array tnet_id_table is defined as shown in FIG. 56, and a function set_tnetid is defined as shown in FIG. 57.

Next, a control method for the SCANB 32 using a signal SFT shown in FIG. 4 will be explained. The value of a signal TMS entered in the TAP controller of SCANB 32 is a logical product of signals TMS, and SFT from the SCANE 31, as defined in a program shown in FIG. 58.

Accordingly, when SFT=1, a TMS signal from the SCANE 31 is entered to the TAP controller of the SCANB 32 as it is, and the JTAG scan control is made for the SCANB 32. At this time, the signals TDI and TDO between the SCANB 32 and the SCANE 31 are connected to the SER 33, and data of the SER 33 is shifted.

On the other hand, the signal TMS supplied to the RTC 26 from the SCANB 32 always becomes "0", and the TAP controller 114 of the RTC 26 is masked by data 0, thus making no state transition. FIG. 59 shows a mask control program for a TAP controller 114 thus explained.

Furthermore, when SFT=0, the input to the TAP controller of the SCANB 32 always becomes "0", and the state thereof remains unchanged. On the other hands, the signal TMS to the RTC 26 remains "1", and thus the TAP controller 114 of the RTC 26 is masked by data "1", and the JTAG scan control is made for the RTC 26. At this point, signals TDI and TDO between the SCANE 31 and the SCANB 32 are connected to a switching matrix 83, followed by the data of the RTC 26 being shifted.

Next, a control method for the switching matrix 83 is explained again with reference to FIGS. 60–63.

Figure 61:
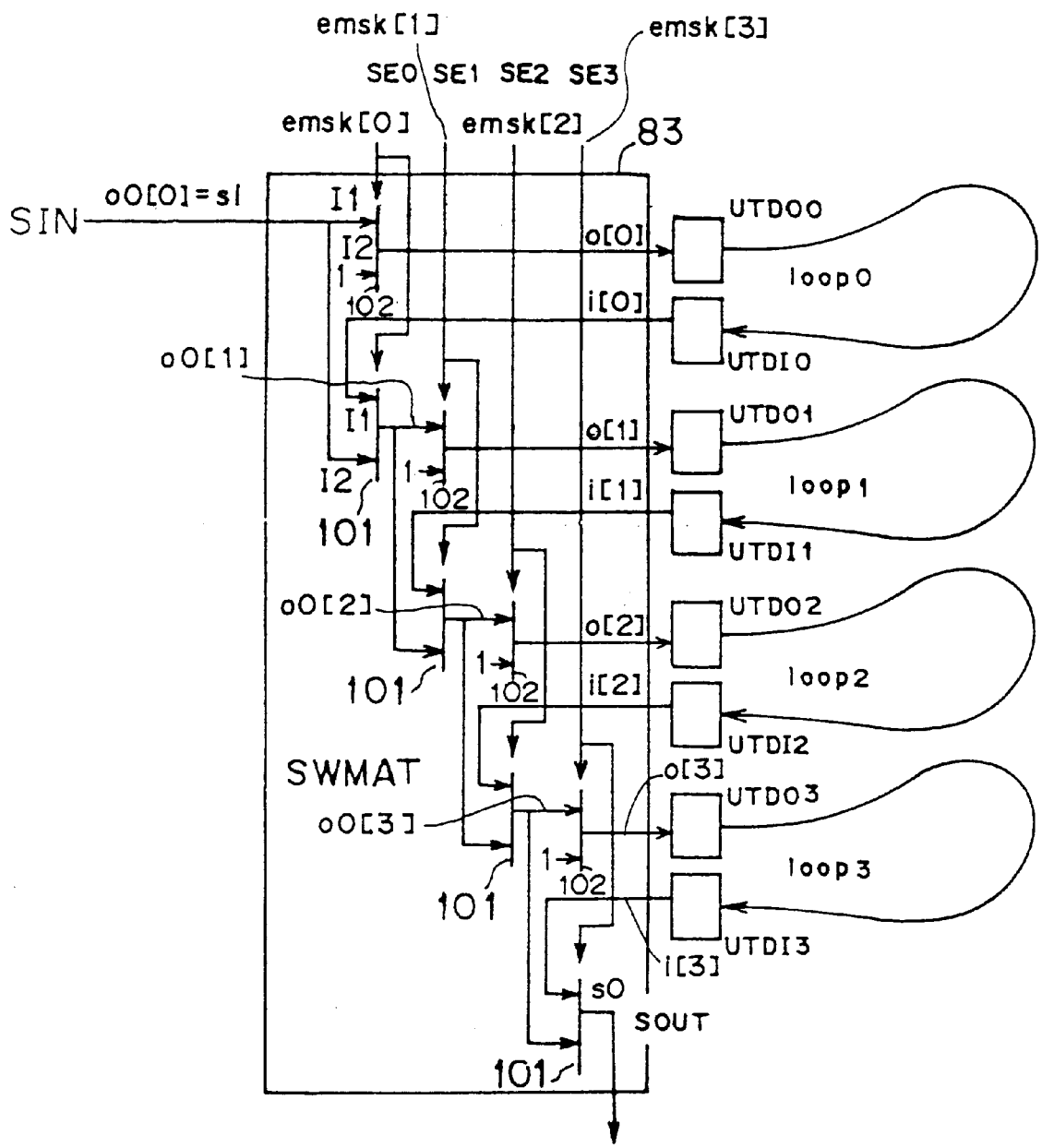
FIG. 61 shows signal designations of a switching matrix.

FIG. 60 shows an operation definition of the switching matrix 83 written in verilog, a hardware description language, and FIG. 61 shows the correspondence between a signal and connection wiring used in FIG. 60. Signal 0 [i], i [i], and emsk [i] (i=0, 1, 2, 3) correspond to signals UTDOi, UTDIi, and SEi, respectively. The signals o0 [i] (i=0, 1, 2, 3) represents an input to a selector 102.

The signal o0 [0] accords to an scan input si=SIN, and the other signals o0 [i] (i=1, 2, 3) become i [i−1] or o0 [i−1] in accordance with a value of emsk [i−1]. Signals o[L] become o0[i] or "1" in accordance with a value of emsk[i]. The signal so represents a scan output SOUT, and become i [3] or o0 [3] according to a value of emsk [3].

According to the present invention, entering data to SER 33 or CSE35 as emsk [i] controls selectors 101 and 102 of the switching matrix 83, and connects loopi. For example, the SCANB 32 shown in FIG. 27 is equipped with five switching matrixes 83, and its operation is defined as shown in FIG. 62.

Figure 63:
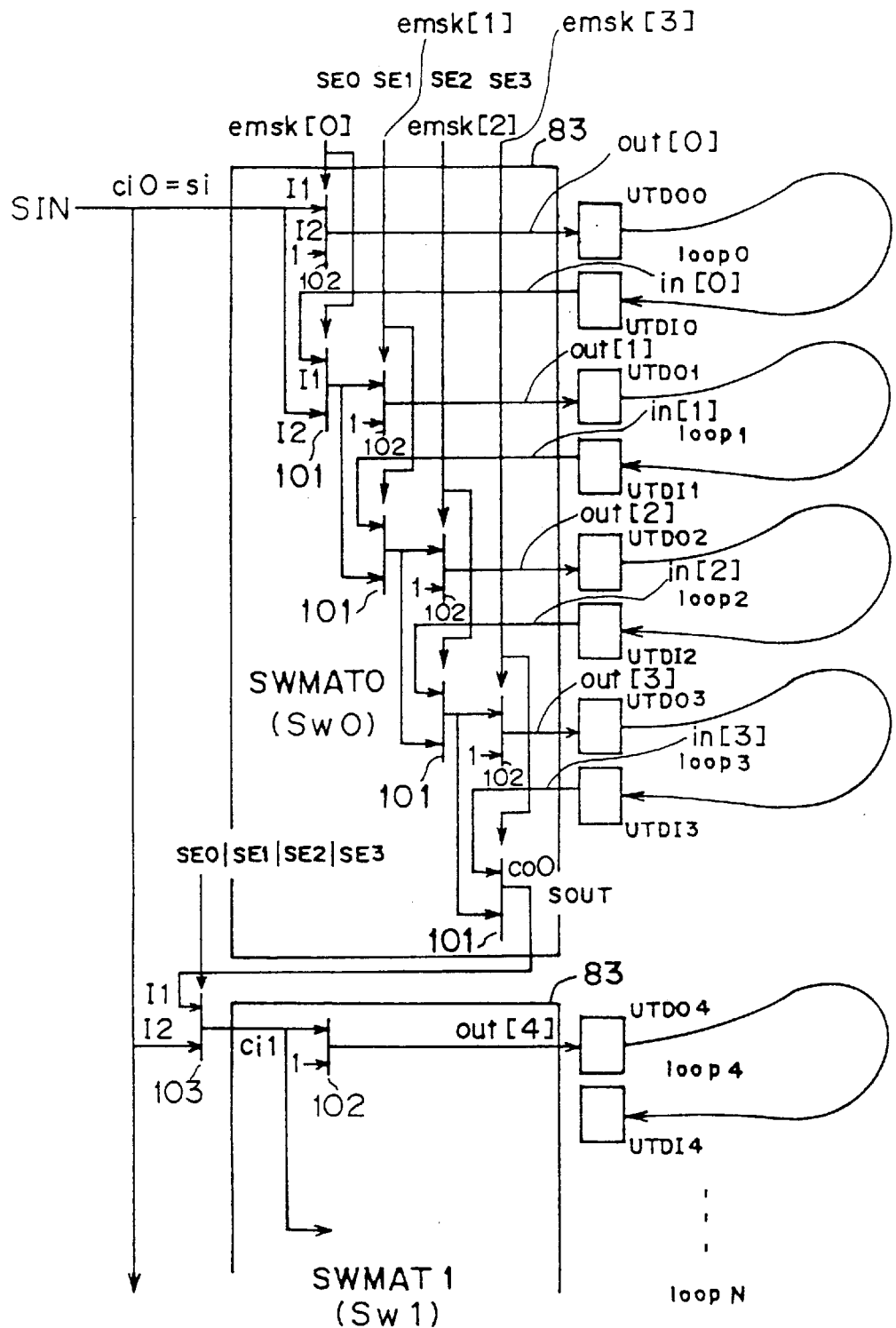
FIG. 63 shows signal designations of a plurality of switching matrixes.

In this case, sw0, sw2, sw3, and sw4 correspond to SWAT1, SWAT2, SWMAT3, and SWMAT4, respectively. In addition, as shown in FIG. 63, signals out [i], in [i], and emsk [i] (i=0, 1, 2, ... , 19) correspond to signals UTDOi, UTDIi, and SEi, respectively. As emsk [i], the data MASK [i] (i=0, 1, 2 ... , 19) shown in FIG. 28 is used.

Further, signals cii, and coi (i=0, 1, 2, 3, 4) represent an input signal to a switching matrix swi, and an output signal from a switching matrix swi. Each switching matrix swi operates based on the definition shown in FIG. 60 receives a signal cii, and outputs a signal coi.

The signal cio accords with a scan input si=SIN, and the other signals cii (i=1, 2, 3, 4) becomes co(i−1) or ci (i−1) in accordance with a value of a logical sum of the four control signals emsk [4i−1 : 4 (i−1)].

For example, the selector 103 outputs a signal co0 as a signal cil, when a logical sum emsk [3:0] of emsk [3], emsk [2], emsk [1], and emsk [0] is "1", while it outputs a signal ci0 when emsk [3:0] is "0".

Further, a signal so represents a scan output SOUT in the final stage, and becomes co4 or ci4, in accordance with a value of a logical sum of emsk [19:16]. Thus, use of data MASK [i] of the SER 33 enables controlling five switching matrixes, and enables reconnection of a maximum of 20 loopi.

Next, the time required for initialization of JTAG scan testing in a parallel computer system shown in FIG. 2B will be discussed hereinafter.

The time required for JTAG scanning $T_{jtag}$ can be represented by a function of a frequency f of the JTAG clock TCK, the number $n_c$ of setting commands, the number $b_{nc}$ of bits required by the command and the number $n_r$ of RTCs.

First, the upper limit value $f_{max}$ of the JTAG clock can be calculated by considering a delay value of a switching matrix 83 provided within the SCANE 31 and the SCANB 32, and a delay value resulting from the use of connecting cables.

Figure 64:
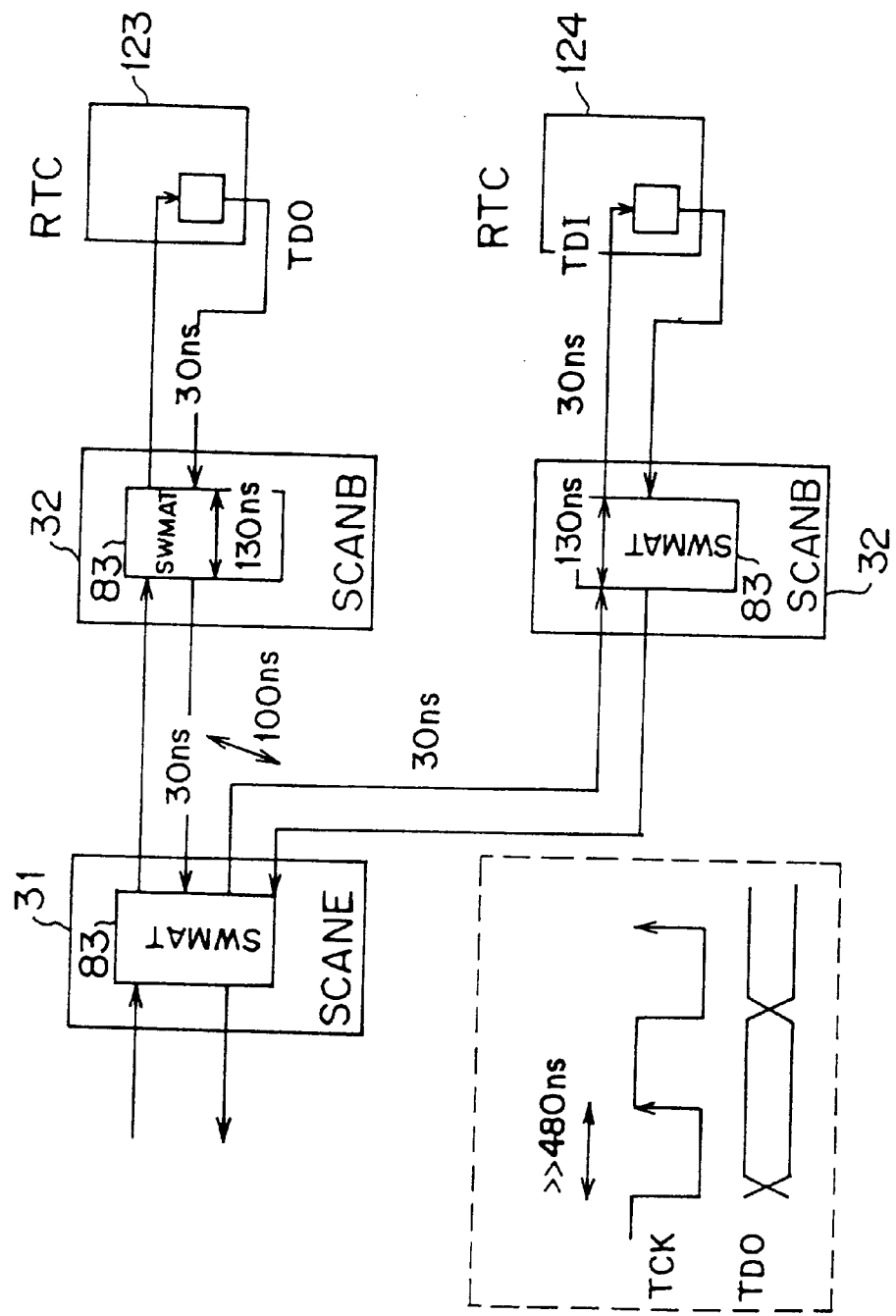
FIG. 64 shows a location of a delay affecting JTAG clock.

FIG. 64 shows a location where a delay affecting a JTAG clock exists, and its estimated value. In FIG. 64, it is required that a delay from TDO of RTC 123 to TDI of RTC 124 falls within a half of the length τ of a clock cycle. This delay is 30×4+130×2+100=480 (ns), and therefore τ is required to be equal to or more than at least 480×2=960 (ns). Consequently, the maximum frequency f≈1 (MHz).

Next, the time for executing a command of the SCANE 31 will be discussed. The SCANE 31 has the following commands, apart from the subcommands shown in FIG. 36; commands realizable by Read/Write (R/W) of the register file section 82 of the SCANE 31 such as set_clock (to be described as "REG"), commands realizable by Read/Write (R/W) of an RTC (to be described as "RTCREG") such as set_tnet_rtcflow, and commands for scanning the BSFF of an RTC (to be described as "RTCBSF") such as check_tnet_connection.

As primitives for realizing these commands, set_ir, ser_dr, and shift_dr in FIG. 36 are used. The necessary number of bits of each primitive $n_{ir}$, $n_{dr}$, and $n_{sft}$ are as shown in FIG. 65.

In addition, the number of bits required for commands REG, RTCREG, and RTCBSF, are as shown in FIG. 66. The number of appearances represents the frequency of use of each command in the initialization thereof. According to this calculation, the number of all bits required for the initialization becomes approximately 2300×$n_r$.

The frequency of the JTAG clock TCK is a maximum of around 1 MHz as described above, so that the time required for initialization is about $T_{jtag}$=2.3×$n_r$ (ms). Furthermore, even when a value of $T_{jtag}$ is made larger when a calculation time inside the CPU 45 is considered, the required time is estimated to be around four sec. for $n_r$=1,024 (units).

The operating frequency of the CPU 45 which drives the SCANE 31 has little affect on the time required for the initialization while f is relatively small. When the frequency of the CPU 45 is assumed to be 8 MHz, 256 clock pulses are required for a 32 bits shift, and the overhead for polling can be neglected.

When a JTAG scan system is considered, an overhead in a workstation 46, or an SCU_ADP board 43 must be considered. As an overhead, a handling overhead in serial communication or an overhead affected by data transfer rate are considered, however it is difficult to estimate the handling overhead.

Now, when the data transfer rate is assumed to be 19,200 bps, a time of 4 ms is required for transmitting one command packet of ten bytes (80 bits). Consequently, the overhead affected by the data transfer rate is considered to become 4×2×2≈20 (ms) or so, taking into consideration the two times of store-and-forward operation.

For example, in a command get_rtc_status, reply status data is 32×$n_r$ bits, and the required time is 1.7 ms per one transfer. Therefore, the time required for executing a command becomes $T(n_r)$=4×2+(4+1.7×$n_r$)×2 (ms). For $n_r$=1, 024, T (1024)≈3.5 (s). To further shorten this time, a change of format can be also considered.

Additionally, for the communication between the clock board 42 and the SCU_ADP board 43, and that between the SCU_ADP board 43 and an RTC, the number of bytes in a command is so small that only the overhead of the handling software becomes a problem. If the overhead of the handling software per a command is assumed to be $t_{so}$, the required time is $T_{all}$=$T_{jtag}$+$t_{so \times nc}$.

In the scan system shown in FIG. 3, although a scan path is formed using paths in two layers, a multiple layer of scan paths can be configured by connecting a plurality of SCANBs in a hiearachical structure.

Figure 67:
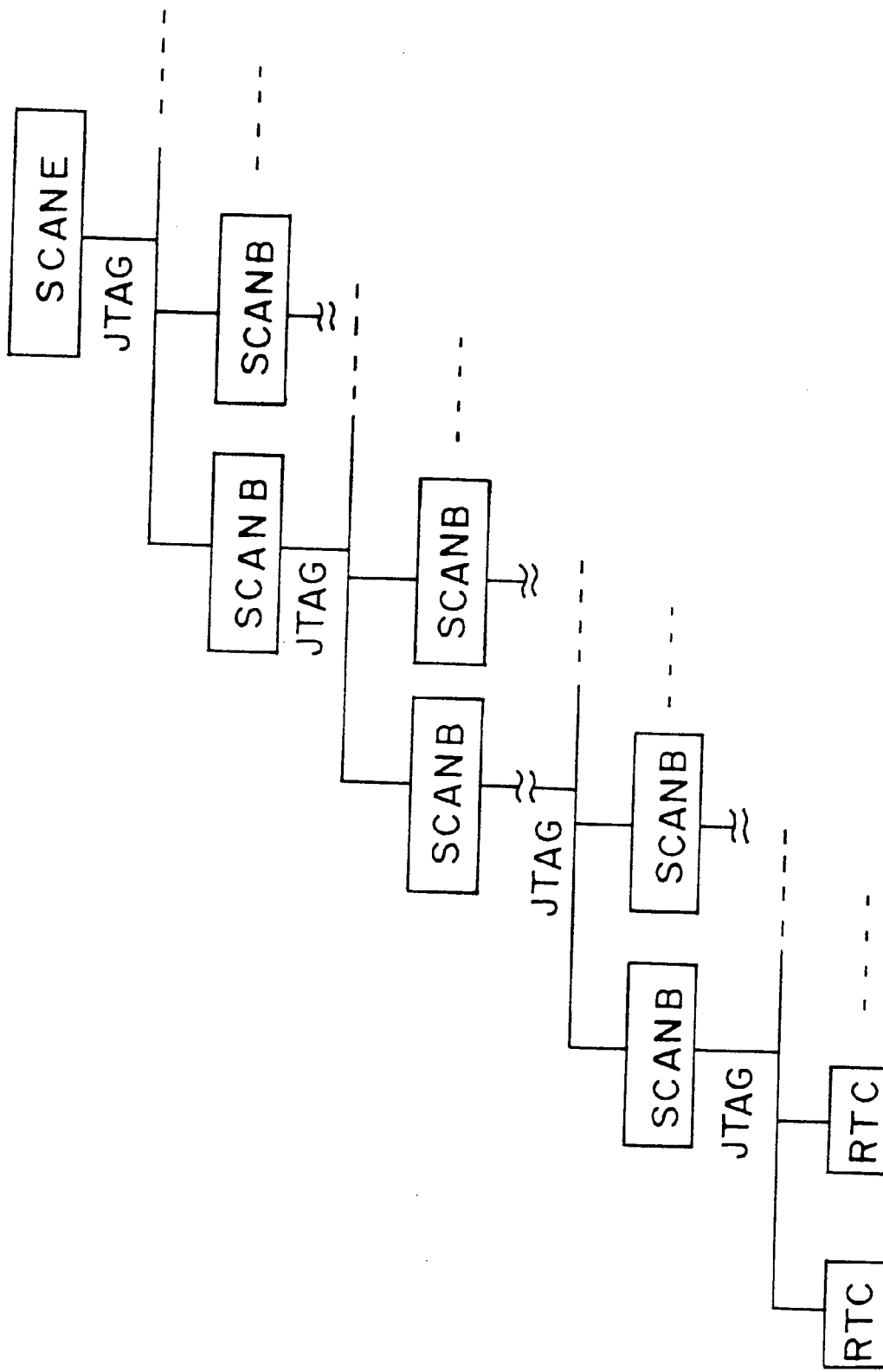
FIG. 67 shows scan buffers in a multiple layer.

FIG. 67 shows a multiple layer of SCANBs constituting a multiple layer of a scan path of this type. In FIG. 67, SCANBs in three layers are connected downward through a JTAG signal line below the SCANE 31, and RTCs are connected to SCANBs in the lowest layer. The SCANE and the SCANBs switch switches in a switching matrix 83 to connect/disconnect paths positioned thereafter.

As described above, configuring SCANBs in a multiple layer enables handling of a larger number of RTCs. In the future, a parallel computer system having 100 thousands or more PEs is considered to be realized.

In the embodiments thus explained, although JTAG scanning of RTCs of a parallel computer system was described, the scan testing according to the present invention is applicable to an arbitrary network constituted by LSI chips having a complicated connection relationship. In this case also, the formation of a scan path having a hierarchical structure using the SCANE 31 and the SCANB 32 enables detection of a network size, connection testing, and setting, monitoring, etc. of operations of an LSI to be effectively made.

Furthermore, all LSIs connected to a network are not always identical, but various kinds of LSIs can be mixed. In this case, for each type of LSI, a SCANB is prepared having a configuration suitable therefor, so that one SCANB can be connected to LSIs of a same type, thereby facilitating the control thereof.

Now, differences between a scan testing by the normal scan control, and that according to the present invention will be summarized next. First, for the testing by using the normal scan control, all LSIs are included in a scan loop, thereby taking a long time to perform the test. For example, in order to set thirty-two bits of data to a data register for an LSI, according to the method of shifting one bit by selecting a bypass register in another LSI, the overhead to neglect an LSI becomes approximately 3% per LSI.

Consequently, when thirty LSIs are bypassed, about twice the time required for shifting thirty-two bits is needed. In addition, when an instruction code comprising eight bits is set to the instruction register of an LSI by JTAG scanning, when the number of all LSIs is assumed to N, 8N bits must be shifted. The larger N becomes, the greater the time required becomes.

On the other hand, according to the present invention which can configure a scan path in a layered structure, an entire scan path can be shortened by cutting off unnecessary scan chain portions. This can shorten the time required for JTAG scanning.

Further, for the normal scan control test, a scan loop is determined in the design stage, and thus cannot be changed. For this reason, there is no flexibility in the system configuration. For the JTAG scanning, to increase the flexibility, the signal TDO is shared between a plurality of LSIs by being connected in a bus configuration. However, it is required to independently control each signal TMS to do so. Independent control of TMS signals cannot change the overhead of the hardware compared with the use of the SCANB 32, according to the present invention. In addition, for the connection to a bus, the number of signal lines simultaneously connectable is limited.

By contrast, according to the present invention, connections between LSIs can be freely changed, thereby enabling identical scan testing for cases where configurations change as for a network in a parallel computer system.

According to the present invention, in a large system such as a parallel computer system, etc., a scan path having high flexibility can be configured, thereby enabling an effective and inexpensive scan testing to be made by limiting the scan test to only some of the LSIS.

In addition, the setting or monitoring of the operations of the LSIs is effectively enabled using a scan path, as described above.

What is claimed is:

1. A scanning device for forming a scan path for a network formed by interconnecting a plurality of integrated circuits having signal lines, comprising:

scan path forming means for forming the scan path including one or more integrated circuits by connecting scan chains each corresponding to each signal line of said plurality of integrated circuits in a hierarchical structure, including
 a plurality of integrated circuit switching means, each connected to the signal lines of at least two integrated circuits, for switching the signal lines of each integrated circuit, and
 control means, connected to the signal lines of said plurality of integrated circuit switching means, for controlling switching operations of said plurality of integrated switching means, said control means scanning first switch data for instructions for a switching operation in at least one of said plurality of integrated circuit switching means, said at least one of integrated circuit switching means switching a signal line of a corresponding integrated circuit in accordance with said first switch data; and shifting means for shifting information stored in said one or more integrated circuits using said scan path.

2. A scanning device as set forth in claim 1,
wherein said control means includes control switch means for switching signal lines of said plurality of integrated circuits, and said scan path forming means forms said scan path including signal lines of said integrated circuit switching means and signal lines of said integrated circuits.

3. A scanning device as set forth in claim 2,
wherein said integrated circuit switching means includes first storing means for storing said first switch data and first switching matrix means controlled by said first switch data, said control means includes second storing means for storing second switch data for instructing switching of signal lines of said integrated circuit switching means and second switching matrix means controlled by said second switch data.

4. A scanning device as set forth in claim 3,
wherein said control means outputs a control signal to said at least one of integrated circuit switching means, and said at least one of integrated circuit switching means connects a corresponding signal line to said first storing means to store said first switch data in said first storing means when said control signal has a particular value.

5. A scanning device as set forth in claim 3,
wherein said scan path forming means forms said scan path for said integrated circuit corresponding to a routing controller in a parallel computer.

6. A scanning device for forming a scan path for a network formed by interconnecting a plurality of integrated circuits, comprising:

scan path forming means for forming the scan path including one or more integrated circuits by connecting scan chains each corresponding to each signal line of the plurality of integrated circuits in a hierarchical structure;

shifting means for shifting information stored in said one or more integrated circuits using the scan path; and processing means for reading out information that said shifting means shifts, said processing means confirming presence of said one or more integrated circuits based on the information thus read out, and obtaining a number of integrated circuits existing on said network.

7. A scanning device for forming a scan path for a network formed by interconnecting a plurality of integrated circuits, comprising:

scan path forming means for forming the scan path including one or more integrated circuits by connecting scan chains each corresponding to each signal line of the plurality of integrated circuits in a hierarchical structure;

shifting means for shifting information, including test data, stored in said one or more integrated circuits using the scan path; and processing means for reading out information that said shifting means shifts, for providing the test data stored in said one or more integrated circuits, and for comparing data shifted out from said one or more integrated circuits with the test data to make a test for a connection relation including said one or more integrated circuits in said network.

8. A scanning device as set forth in claim 1,
wherein said shifting means sets an instruction for instructing a particular operation to a register provided within said one or more integrated circuits.

9. A scanning device as set forth in claim 1,
wherein said shifting means reads out data indicating an operating state from a register provided within said one or more integrated circuits.

10. A scanning device as set forth in claim 7, further comprising displaying means for displaying data indicating said operating state.

11. A scanning device for making a scan test for a network formed by interconnecting a plurality of integrated circuits having signal lines, comprising:

a variety of scan paths created by connecting in a hierarchical structure scan chains of one or more integrated circuits to be tested; and a scan path forming circuit for selectively forming one scan path from said variety of scan paths, including a plurality of integrated circuit switching means, each connected to the signal lines of at least two integrated circuits to be tested, for switching the signal lines of the at least two integrated circuits, and control means for controlling switching operations of said plurality of integrated circuit switching means, said control means scanning switch data for instructions for a switching operation in at least one of said plurality of integrated circuit switching means, said at least one of said integrated circuit switching means switching a signal line of a corresponding integrated circuit in accordance with the switch data.

12. A scanning device for making a scan test for a network formed by interconnecting a plurality of integrated circuits having signal lines, comprising:

a switch circuit for forming one or more scan chains of one or more integrated circuits to be tested by switching the signal lines of said plurality of integrated circuits in accordance with switch data; and a control circuit for scanning the switch data that instructs switching said signal lines in said switch circuit.

13. A scanning device as set forth in claim 12, wherein said switch circuit includes a protection circuit for preventing an erroneous signal to be outputted to other integrated circuits except said one or more integrated circuits to be tested, and excludes an erroneous control for said other integrated circuits.

14. A scanning device for making a scan test for a network formed by interconnecting a plurality of semiconductor devices having signal lines connected thereto, said scanning device comprising:

scan path forming means for forming a scan path including one or more semiconductor devices by connecting scan chains each corresponding to one of the signal lines of said plurality of semiconductor devices in a hierarchical structure, including a plurality of switching means, each connected to the signal lines of at least two semiconductor devices, for switching the signal lines of the at least two semiconductor devices, and control means for controlling switching operations of said plurality of switching means, said control means scanning switch data for instructions for a switching operation in at least one of said switching means, said at least one of said switching means switching a signal line of a corresponding semiconductor device in accordance with the switch data; and shifting means for shifting information included in said one or more semiconductor devices using said scan path.

15. A scanning method for making a scan test for a network formed by interconnecting a plurality of integrated circuits, comprising:

selectively forming a scan path from among a variety of scan paths created by connecting in a hierarchical structure scan chains of one or more integrated circuits to be tested, including scanning switch data for instructions for a switching operation in at least one of a plurality of switching circuits, each connected to signal lines of at least two integrated circuits to switch the signal lines of the at least two integrated circuits; and switching a signal line of a corresponding integrated circuit in accordance with the switch data in the at least one of the switching circuits.

16. A scanning method as set forth in claim 15, wherein said integrated circuit corresponds to a routing controller in a parallel computer.

17. A scanning method for making a scan test for a network formed by interconnecting a plurality of integrated circuits, comprising:

selectively forming a scan path from among a variety of scan paths created by connecting in a hierarchical structure scan chains of one or more integrated circuits to be tested;

reading out information from said one or more integrated circuits using said scan path; and obtaining a number of said one or more integrated circuits to be tested, based on said information.

18. A scanning method for making a scan test for a network formed by interconnecting a plurality of integrated circuits, comprising:

selectively forming a scan path from among a variety of scan paths created by connecting in a hierarchical structure scan chains of one or more integrated circuits to be tested;

reading out information from said one or more integrated circuits using said scan path; and checking a connection relation between said one or more integrated circuits based on said information.

19. A scanning method as set forth in claim 15, further comprising the step of setting an operation of said one or more integrated circuits using said scan path.

20. A scanning method as set forth in claim 15, further comprising the step of monitoring an operating state of said one or more integrated circuits using said scan path.

21. A scanning method for making a scan test for a network formed by interconnecting a plurality of integrated circuits, comprising:

scanning switch data that instructs a switching operation in a switching circuit connected to signal lines of said plurality of integrated circuits; and forming a scan chain of one or more integrated circuits to be tested by switching said signal lines by using said switch data.

22. A scanning method as set forth in claim 21, comprising the step of preventing an erroneous signal from entering integrated circuits other than said one or more integrated circuits, thereby excluding an erroneous control for said other intergrated circuits.

23. A scanning method for making a scan test for a network formed by interconnecting a plurality of semiconductor devices, comprising:

selectively forming a scan path from among a variety of scan paths created by connecting in a hierarchical structure scan chains of one or more semiconductor device to be tested, including scanning switch data for instructions for a switching operation in at least one of a plurality of switching circuits, each connected to signal lines of at least two semiconductor devices to switch the signal lines of the at least two semiconductor devices; and switching a signal line of a corresponding semiconductor device in accordance with the switch data in the at least one of the switching circuits.

* * * * *